(12) United States Patent
Yam et al.

(10) Patent No.: US 11,274,246 B2
(45) Date of Patent: Mar. 15, 2022

(54) LUMINESCENT GOLD(III) COMPOUNDS FOR ORGANIC LIGHT-EMITTING DEVICES

(71) Applicant: THE UNIVERSITY OF HONG KONG, Hong Kong (CN)

(72) Inventors: Vivian Wing-Wah Yam, Hong Kong (CN); Chin-Ho Lee, Hong Kong (CN); Man-Chung Tang, Hong Kong (CN); Mei-Yee Chan, Hong Kong (CN)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 149 days.

(21) Appl. No.: 16/646,611

(22) PCT Filed: Sep. 6, 2018

(86) PCT No.: PCT/CN2018/104306
§ 371 (c)(1),
(2) Date: Mar. 12, 2020

(87) PCT Pub. No.: WO2019/052392
PCT Pub. Date: Mar. 21, 2019

(65) Prior Publication Data
US 2020/0255726 A1 Aug. 13, 2020

Related U.S. Application Data

(60) Provisional application No. 62/558,605, filed on Sep. 14, 2017.

(51) Int. Cl.
*C09K 11/06* (2006.01)
*H01L 51/50* (2006.01)

(52) U.S. Cl.
CPC .......... *C09K 11/06* (2013.01); *H01L 51/5012* (2013.01); *C09K 2211/18* (2013.01); *H01L 51/5056* (2013.01); *H01L 51/5072* (2013.01)

(58) Field of Classification Search
CPC ................................................ C09K 2211/188
See application file for complete search history.

(56) References Cited

PUBLICATIONS

Jürgens et al. "Exploring the C∧N∧C theme: Synthesis and biological properties of tridentate cyclometalated gold(III) complexes" Bioorganic & Medicinal Chemistry, 2017, 25, 5452-5460 (Year: 2017).*

(Continued)

*Primary Examiner* — Peter F Godenschwager
(74) *Attorney, Agent, or Firm* — Leason Ellis LLP

(57) ABSTRACT

Described herein are gold (III) compounds according to formula (I) for use as emitters in organic light-emitting devices (OLEDs) and methods of making and using said compounds. The gold (III) compound includes a group 15 element containing tridentate ligand and one aryl auxiliary ligand that are both coordinated to the gold (III) metal center to form a series of thermally stable and highly luminescent gold (III) complexes. The gold (III) compounds disclosed herein can be used as light-emitting material for fabrication of OLEDs. The gold (III) compounds can be deposited as a layer or a component of a layer using a solution processing technique or a vacuum deposition process. The gold (III) compounds are robust and can provide electroluminescence with high efficiency and brightness.

(Continued)

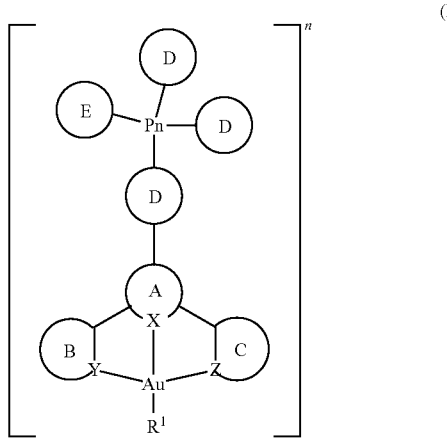

25 Claims, 12 Drawing Sheets

(56) References Cited

PUBLICATIONS

Figure 1:
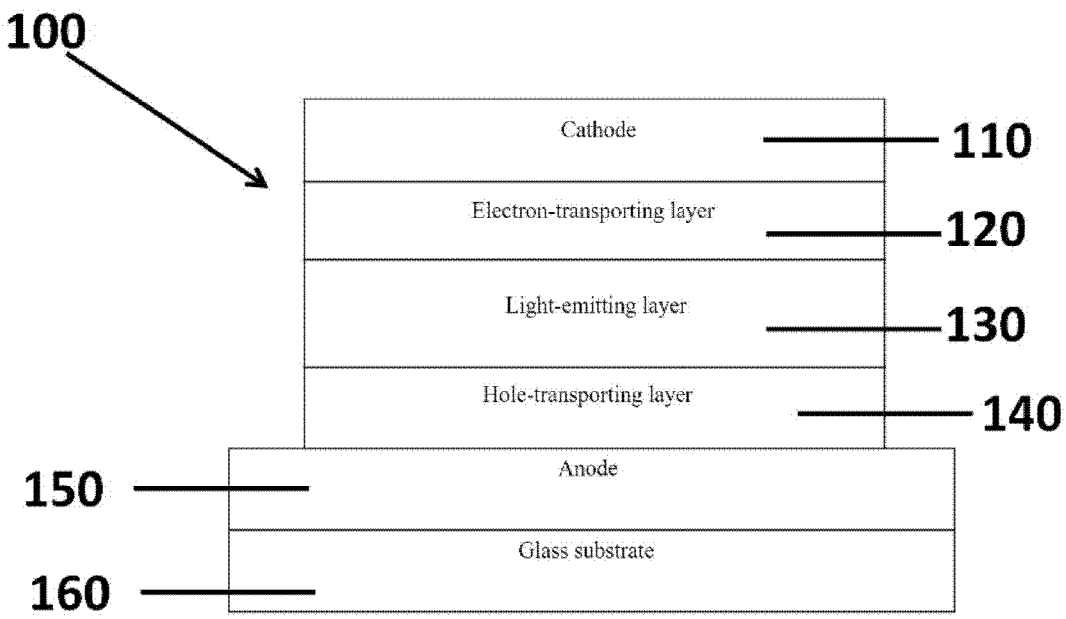

Au, Vonika Ka-Man, et al. "Functionalized bis-cyclometalated alkynylgold (III) complexes: synthesis, characterization, electrochemistry, photophysics, photochemistry, and electroluminescence studies." Inorganic chemistry 52.21 (2013): 12713-12725.
Cheng, Gang, et al. "Color Tunable Organic Light-Emitting Devices with External Quantum Efficiency over 20% Based on Strongly Luminescent Gold (III) Complexes having Long-Lived Emissive Excited States." Advanced Materials 26.16 (2014): 2540-2546.
Tang, Man-Chung, et al. "Dendritic Luminescent Gold (III) Complexes for Highly Efficient Solution-Processable Organic Light-Emitting Devices." Angewandte Chemie 125.1 (2013): 464-467.
Tang, Ching W., and Steven A. VanSlyke. "Organic electroluminescent diodes." Applied physics letters 51.12 (1987): 913-915.
Burroughes, Jeremy H., et al. "Light-emitting diodes based on conjugated polymers." nature 347.6293 (1990): 539-541.
Burrows, Paul E., Stephen R. Forrest, and Mark E. Thompson. "Prospects and applications for organic light-emitting devices." Current Opinion in Solid State and Materials Science 2.2 (1997): 236-243.
Murawski, Caroline, Karl Leo, and Malte C. Murawski, Caroline, Karl Leo, and Malte C. Gather. "Efficiency roll-off in organic light-emitting diodes." Advanced Materials 25.47 (2013): 6801-6827.
Tao, Youtian, Chuluo Yang, and Jingui Qin. "Organic host materials for phosphorescent organic light-emitting diodes." Chemical Society Reviews 40.5 (2011): 2943-2970.
Burrows, Paul E., et al. "Ultraviolet electroluminescence and blue-green phosphorescence using an organic diphosphine oxide charge transporting layer." Applied physics letters 88.18 (2006): 183503.
Zhou, Guijiang, et al. "Manipulating charge-transfer character with electron-withdrawing main-group moieties for the color tuning of iridium electrophosphors." Advanced functional materials 18.3 (2008): 499-511.
Yam, Vivian Wing-Wah, et al. and Sam Wing-KináChoi. "Syntheses, crystal structures and photophysics of organogold (III) diimine complexes." Journal of the Chemical Society, Dalton Transactions 6 (1993): 1001-1002.
Yam, Vivian Wing-Wah, et al. "Luminescent gold (III) alkynyl complexes: Synthesis, structural characterization, and luminescence properties." Angewandte Chemie 117.20 (2005): 3167-3170.
Wong, Keith Man-Chung, et al. "A Class of Luminescent Cyclometalated Alkynylgold (III) Complexes: Synthesis, Characterization, and Electrochemical, Photophysical, and Computational Studies of [Au (C/\ N/\ C)(C ⋮ CR)](C/\ N/\ C= κ3C, N, C Bis-cyclometalated 2, 6-Diphenylpyridyl)." Journal of the American Chemical Society 129.14 (2007): 4350-4365.
Wong, Keith Man-Chung, et al. "A novel class of phosphorescent gold (III) alkynyl-based organic light-emitting devices with tunable colour." Chemical communications 23 (2005): 2906-2908.
Au, Vonika Ka-Man, et al. "High-efficiency green organic light-emitting devices utilizing phosphorescent bis-cyclometalated alkynylgold (III) complexes." Journal of the American Chemical Society 132.40 (2010): 14273-14278.
Tang, Man-Chung, et al. "Saturated Red-Light-Emitting Gold (III) Triphenylamine Dendrimers for Solution-Processable Organic Light-Emitting Devices." Chemistry—A European Journal 20.46 (2014): 15233-15241.
Tang, Man-Chung, et al. "Bipolar gold (III) complexes for solution-processable organic light-emitting devices with a small efficiency roll-off." Journal of the American Chemical Society 136.51 (2014): 17861-17868.
Wong, Ben Yiu-Wing, et al. "Versatile Synthesis of Luminescent Tetradentate Cyclometalated Alkynylgold (III) Complexes and Their Application in Solution-Processable Organic Light-Emitting Devices." Angewandte Chemie 129.1 (2017): 308-311.

* cited by examiner

LUMINESCENT GOLD(III) COMPOUNDS FOR ORGANIC LIGHT-EMITTING DEVICES

CROSS-REFERENCE TO RELATED PATENT APPLICATIONS

This application is a U.S. National Stage Application under 35 U.S.C. § 371 of International Patent Application No. PCT/CN2018/104306, filed Sep. 6, 2018, which claims the benefit of priority under 35 U.S.C. § 119 of U.S. Patent Application No. 62/558,605 filed Sep. 14, 2017, both of which are incorporated by reference in their entireties. The International Application was published on Mar. 21, 2019, as International Publication No. WO 2019/052392 A8.

1. FIELD OF THE INVENTION

Described herein are gold compounds for use as emitters in organic light-emitting devices (OLEDs). Also disclosed herein are devices that comprise the gold compounds and methods of making and using the compounds themselves.

2. BACKGROUND

By virtue of being low cost, light weight, having a low power consumption, high brightness, excellent color tunability, a wide viewing angle of up to 180 degrees as well as their ease of fabrication onto flexible substrates, OLEDs are considered as remarkably attractive candidates for flat panel display technologies and solid-state lighting systems. Transition metal complexes having a heavy metal center are useful materials in making OLEDs, as they can effectively lead to a strong spin-orbit coupling and thus promote an efficient intersystem crossing to provide phosphorescence. In theory, a four-fold enhancement in the internal quantum efficiency of the OLEDs to 100% is possible due to the harvesting of both triplet and singlet excitons.

Typically, an OLED consists of several layers of semiconductors sandwiched between two electrodes. The cathode is composed of a low work function metal or metal alloy deposited by vacuum evaporation, whereas the anode is a transparent conductor such as indium tin oxide (ITO). Upon the application of a DC voltage, holes injected by the ITO anode and electrons injected by the metal cathode will recombine to form excitons. Subsequent relaxation of excitons will then result in the generation of electroluminescence (EL).

The breakthroughs that led to the exponential growth of this field and to its first commercialized products can be traced to two pioneering demonstrations. In 1987, Tang and VanSlyke [Tang, C. W.; VanSlyke, S. A. *Appl. Phys. Lett.* 51, 913 (1987)] proposed the use of a double-layer structure of vacuum deposited, small-molecular films, in which tris(8-hydroxyquinoline)aluminum ($Alq_3$) was utilized both as light-emitting layer and electron-transporting layer. Later, the first polymeric light-emitting device was pioneered by Burroughs et al. in 1990 [Burroughs, J. H.; Bradley, D. D. C.; Brown, A. R.; Marks, N.; Friend, R. H.; Burn, P. L.; Holmes, A. B. *Nature* 347, 539 (1990)], in which a yellow-green EL from poly(p-phenylenenvinylene) (PPV) was achieved. Since then, a number of new electroluminescent small molecular based and polymeric materials have been investigated with improved light emitting properties. The key advantage of using polymers as light-emitting materials is that they are highly soluble in most of the organic solvents, and OLEDs can be easily fabricated by using low-cost and efficient wet processing techniques, such as spin-coating, screen-printing, or ink-jet printing [Burrows, P. E.; Forrest, S. R.; Thompson, M. E. *Curr. Opin. Solid State Mat. Sci.* 2, 236 (1997)].

To further improve the OLED performance, charge-transporting layers, such as hole- and electron-transporting layers, are often included in the OLED stack to balance the hole and electron currents and thereby confining the process of exciton recombination within the emissive layer. Similar results could also be achieved by using bipolar materials with both hole- and electron-transporting moieties as the host material to reduce the problem of efficiency roll-off at high current density [Murawski, C.; Leo, K.; Gather, M. C. *Adv. Mater.* 25, 6801 (2013)]. Various hole-transporting moieties, such as triphenylamine, carbazole groups, and electron-transporting moieties, such as triazine, phosphine oxide groups, have been widely used as either hole- or electron-transporting materials or host materials [Tao, Y; Yang, C.; Qin, *J. Chem. Soc. Rev.* 40, 2943 (2011)]. Of particular interest is the phosphine oxide derivatives, owing to their excellent electron-transporting properties. Phosphine oxide derivatives are mostly electron-deficient due to the strong electron-withdrawing nature of the P=O moiety. Unlike other approaches including the introduction of electronegative atoms onto the aromatic ring to enhance the electron-transporting properties, the incorporation of phosphine oxide will not result in a lowering of triplet energy of the emissive materials that are not desirable for the design of blue-emitters. The tetrahedral geometry of the phosphorus center in the phosphine oxide compounds could serve to break the conjugation for maintaining the conjugation length of the molecule as well as the triplet energy of the host material, while at the same time introduce electron-transporting properties to the molecule. This distinct geometry of the phosphine oxide moiety also contributes to the amorphous morphology of the solid-state thin films because of the three dimensionality of the phosphine oxide and is reflected in its good film-forming ability, which is one of key factors to determine the device efficiency of solution-processing OLEDs. In addition, phosphine oxide moieties can enhance all the thermal, chemical as well as oxidative stabilities of the compounds, as reflected by the long lifetime of the OLEDs [Jeon, S. O.; Lee, J. Y. *J. Mater. Chem.* 22, 4233 (2012)].

In 2006, Thompson and co-workers first utilized 4,4'-bis (diphenylphosphine oxide) (PO1) as the host material for the commercially available iridium(III) bis(4,6-(difluorophenyl)-pyridinato-N,$C_2$')picolinate (FIrpic) to fabricate the blue-green-emitting phosphorescent OLED (PHOLED) [Burrows, P. E.; Badmaperuma, A. B.; Sapochak, L. S.; Djurovich, P.; Thompson, M. E. *Appl. Phys. Lett.* 88, 183503 (2006)]. Device with 20% FIrpic showed a high external quantum efficiency (EQE) of 7.8% at a current density of 0.09 mA $cm^{-2}$, corresponding to current efficiency of 15.8 cd $A^{-1}$. Although the EQE measured for a similar device with an inert host was comparable, the driving voltage was significantly reduced and became less dependent on FIrpic doping concentration. This is ascribed to the improvement of charge-transporting property of the host material owing to the presence of the phosphine oxide moiety.

While extensive works have been focused on the incorporation of the phosphine oxide moieties into host materials, direct functionalization of the phosphine oxide moiety onto the phosphor remains scarce. Direct functionalization could potentially simplify the device structure and hence reduce the manufacturing cost. Iridium(III) phosphors with functionalized phosphine oxide moiety was first reported by Wong, Ma, Marder and co-workers in 2008 [Zhou, G.; Ho, C. H.; Wong, W. Y.; Wang, Q.; Ma, D.; Wang, L.; Lin, Z.; Marder, T. B.; Beeby, A. *Adv. Funct. Mater.* 18, 499 (2008)]. In this study, the phosphine oxide moiety was incorporated onto the phenyl ring of the phenylpyridine ligand. The iridium(III) complex, [Ir(ppy-POPh$_2$)$_2$(acac)], was found to exhibit a more positive reduction potential of −2.24 eV compared to its closely related analogue, [Ir(ppy)$_3$] (−2.89 eV), suggesting an improvement of the electron-transporting property or a reduced electron-injection barrier at the organic/organic interface. In addition, the charge-transporting character of these iridium(III) complexes can be readily tuned from being electron-donating to electron-withdrawing, depending on the choice of the main-group moieties. A yellowish-green-emitting PHOLED was fabricated, and a maximum EQE of 9.7% was achieved for the optimized device doped with 6% [Ir—PO]. In addition, such device demonstrated a high current efficiency of 34.2 cd A$^1$ and a power efficiency of 23.6 1m W$^{-1}$, as well as a low turn-on voltage of 3.5 V [Zhou, G.; Wang, Q; Ho C.-L.; Wong, W.-Y; Ma, D.; Wang, L., Lin, Z. *Chem. Asian J.* 3, 1830 (2008)].

Even though the phosphorescent metal complexes have been extensively studied for over twenty years, most of the research works have been focused on the iridium(III), platinum(II) and ruthenium(II) systems, whereas the use of other metal centers are relatively less explored. In contrast to the isoelectronic platinum(II) compounds which are known to exhibit rich luminescence properties, very few examples of luminescent gold(III) complexes have been reported, due to the presence of low-energy d-d ligand field (LF) states and the electrophilicity of the gold(III) metal center. One way to enhance the luminescence of gold(III) complexes is through the introduction of strong a-donating ligands, which was first demonstrated by Yam et al. in which stable gold(III) aryl compounds were synthesized and found to display interesting photoluminescence properties even at room temperature [Yam, V. W.-W.; Choi, S. W.-K.; Lai, T.-F.; Lee, W.-K. *J. Chem. Soc., Dalton Trans.* 1001 (1993)]. Afterwards, Yam et al. synthesized a series of bis-cyclometalated alkynylgold (III) compounds using various strong a-donating alkynyl ligands, and all these compounds were found to exhibit rich luminescence behaviors at both room and low temperatures in various media [Yam, V W.-W.; Wong, K. M.-C.; Hung, L.-L.; Zhu, N. *Angew. Chem. Int. Ed.* 44, 3107 (2005); Wong, K. M.-C.; Hung, L.-L.; Lam, W. H.; Zhu, N.; Yam, V. W.-W. *J. Am. Chem. Soc.* 129, 4350 (2007); Wong, K. M.-C.; Zhu, X.; Hung, L.-L.; Zhu, N.; Yam, V. W.-W.; Kwok, H.-S. *Chem. Commun.* 2906 (2005)]. Recently, a new class of phosphorescent cyclometalated alkynylgold(III) complexes has been reported [Au, V. K.-M.; Wong, K. M.-C.; Tsang, D. P.-K.; Chan, M.-Y.; Yam, V. W.-W. *J. Am. Chem. Soc.* 132, 14273 (2010)]. The vacuum-deposited OLEDs reached high EQE of 11.5% and current efficiency of 37.4 cd Later on, dendritic gold(III) complexes have been designed and synthesized. The excellent solubilities of these complexes in most of the organic solvents enable the use of solution-processing technique for OLED fabrication [Tang, M.-C.; Tsang, D. P.-K.; Chan, M. M.-Y.; Wong, K. M.-C.; Yam, V W.-W. *Angew. Chem. Int. Ed.* 52, 446 (2013); Tang, M.-C.; Chan, C. K.-M.; Tsang, D. P.-K.; Wong, Y-C.; Yam, V W.-W. *Chem. Eur. J.* 20, 15233 (2014)]. Bipolar gold(III) complexes with N-phenylbenzimidazole as acceptor and triphenylamine as donor have also been developed [Tang, M.-C.; Tsang, D. P.-K.; Wong, Y-C.; Chan, M.-Y; Wong, K. M.-C.; Yam, V. W.-W. *J. Am. Chem. Soc.* 136, 17861 (2014)]. A high EQE of up to 10.0% based on the bipolar system has been achieved together with an extremely small efficiency roll-off value of less than 1% at the practical brightness level of 1000 cd In$^{-2}$. Very recently, the use of post-synthetic ligand modification approach was shown to generate a new class of tetradentate gold(III) complexes and extraordinarily high photoluminescence quantum yields of up to 78% have been realized [Wong, B. Y-W.; Wong, H.-L.; Wong, Y-C.; Chan, M.-Y; Yam, V W.-W. *Angew. Chem. Int. Ed.* 55, 1 (2016)]. Solution-processable OLEDs with high EQE of up to 11.1% have also been achieved. Taking the advantages of high charge-transporting properties and excellent solubility, it is anticipated that the incorporation of group 15 moiety (such as phosphine oxide) into gold(III) complexes can improve the electron-transporting properties or facilitate a better electron-injection, as demonstrated in the iridium(III)-based OLEDs.

To overcome the above drawbacks, the present invention offers a simple strategy for achieving bipolar phosphors, in which the charge-transporting character can be effectively tuned via the change of the substituents on the group 15 moiety. In particular, the design, synthesis and luminescence behavior of gold(III) complexes with group 15 element-containing tridentate ligand are provided. Furthermore, device fabrication using solution-processing techniques to produce high efficiency PHOLEDs using such compounds is provided. These compounds combine the advantages of good charge-transporting properties of group 15 moieties, the presence of at least one strong a-donating group to raise the d-d LF field excited state and a cyclometalating tridentate ligand for tuning the emission color. As most of the phosphorescent emitters have long-lived excitons and are hole-transporting in nature, such unipolar nature will lead to severe triplet-triplet annihilation, i.e., deterioration of device efficiencies by more than one order of magnitude at high brightness levels. Notably, by changing the sub stituents of the group 15 moiety, the charge-transporting character of the claimed gold(III) compounds can be readily tuned between hole-transporting and electron-transporting properties. More importantly, the 3-D geometry of the group 15 moiety can weaken the π-π stacking interactions between cyclometalating ligands, rendering the claimed gold(III) compounds highly soluble in a wide range of organic solvents. This opens up a possibility to fabricate the devices by solution-processing techniques such as spin-coating and ink-jet printing. The present luminescent gold(III) compounds also show strong room-temperature phosphorescence at both ambient and low temperatures. It is in regard to these issues and others that the present disclosure is provided.

3. SUMMARY

The present disclosure provides a luminescent gold(III) compound according to structure (I):

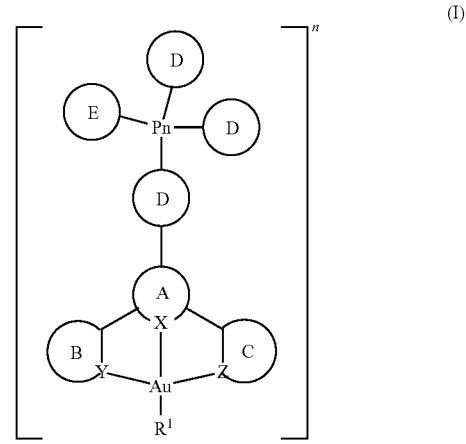

wherein:
(a) X is nitrogen or carbon;
(b) Y and Z are nitrogen or carbon;
(c) A is benzene, phenyl derivatives, heterocycle or heterocyclic derivatives;
(d) B and C are independently benzene, phenyl derivatives, heterocycle or heterocyclic derivatives;
(e) D is any alkyl, cyclic aliphatic or aromatic structures, in which each D group can be identical or non-identical;
(f) Pn is pnictogen selected from nitrogen, phosphorus, arsenic and bismuth;
(g) E can be any chalcogen selected from oxygen, sulphur, selenium, tellurium, being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn;
(h) $R^1$ is any carbon or heteroatom donor ligand, halide or pseudohalide, which could be either monoanionic or neutral. $R^1$ is selected from, but not limited to, alkyl, substituted alkyl, aryl, substituted aryl, heteroaryl, substituted heteroaryl, heterocyclic aryl, substituted heterocyclic aryl, alkynyl, substituted alkynyl, alkoxy, amide, thiolate, phosphide, chloride, bromide, iodide, cyanate, thiocyanate or cyanide;
(i) n is zero, a positive integer or a negative integer.

In certain embodiments, the compound is deposited as a thin layer of 10-100 nm thick on a substrate layer.

In certain embodiments, the gold(III) compound comprises a thin layer that is deposited by vacuum deposition, spin-coating, or inkjet printing.

In certain embodiments, the compound has photoluminescence properties within a range of 380 to 1050 nm.

In certain embodiments, the compound emits light in response to the passage of an electric current or to a strong electric field through the compound.

In certain embodiments, the compound is used to fabricate an OLED.

In certain embodiments, the gold(III) compound serves as the light-emitting layer of the OLED.

In certain embodiments, the gold(III) compound serves as a dopant in the light-emitting layer or emissive layer of the OLED.

In certain embodiments, the emission energy of the compound is dependent on the concentration of the gold(III) dopant and with donor groups on the auxiliary ligand, in which the donor group is selected from, but is not limited to, N, S, O, P.

In certain embodiments, the emission energy of the compound is independent of the concentration of the gold(III) compound without donor group on the auxiliary ligand, in which the donor group is selected from, but is not limited to, N, S, O, P.

In certain embodiments, the benzene, phenyl derivatives, heterocycle or heterocyclic derivatives comprises one or more alkyl, alkenyl, alkynyl, aryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or heterocyclic group, and wherein D is alkyl, heteroatom-containing alkyl, aryl, substituted aryl, heteroaryl, substituted heteroaryl, arylalkenyl and substituted arylalkenyl, E is chalcogen being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn, and R is independently alkyl, alkenyl, alkynyl, alkyaryl, aryl, or cycloalkyl. Provided in this disclosures are gold(III) compounds having the structure:

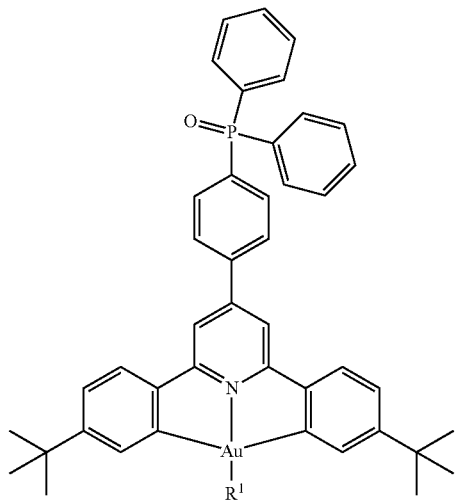

wherein $R^1$ is triphenylamine, 4-(tert-butyl)phenyl, or $R^1$ is any one of the following structures:

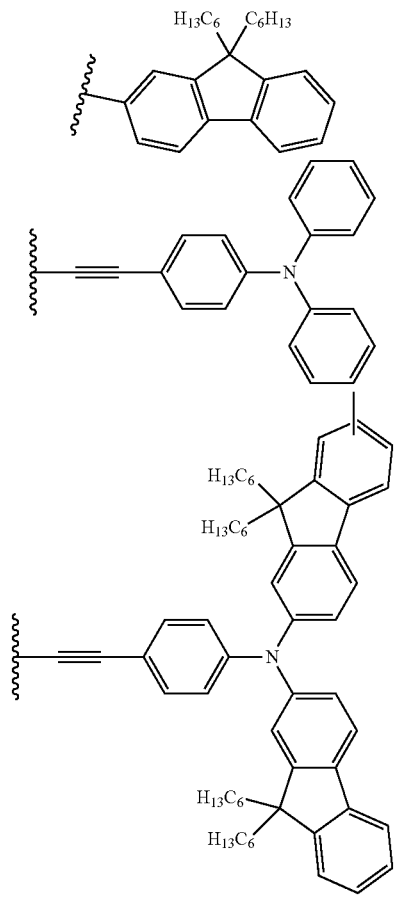

7
-continued
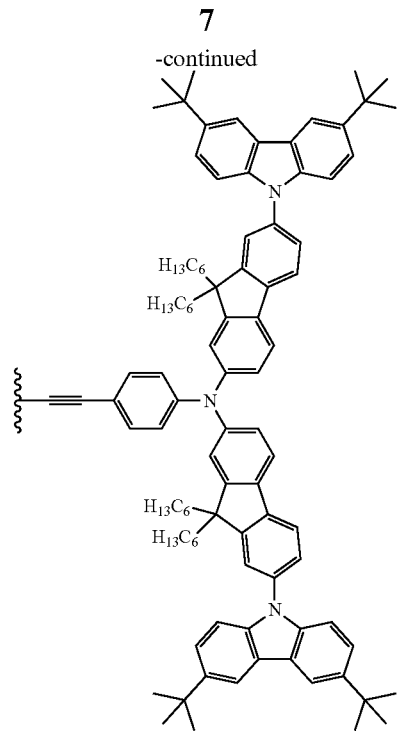
8
-continued
Compound 8
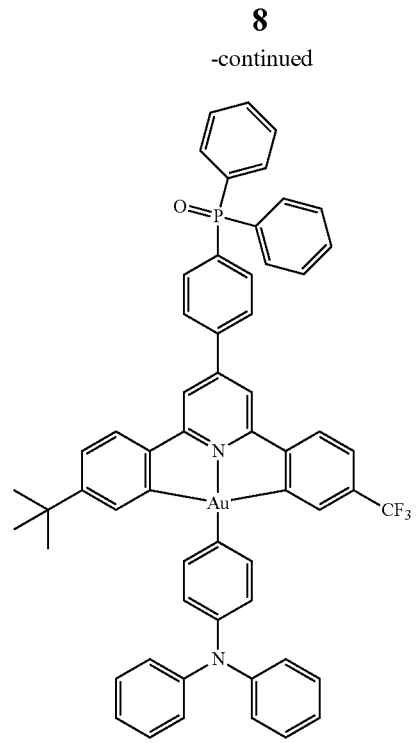
Provided in this disclosures are gold(III) compounds having one of the following structures:
Compound 7
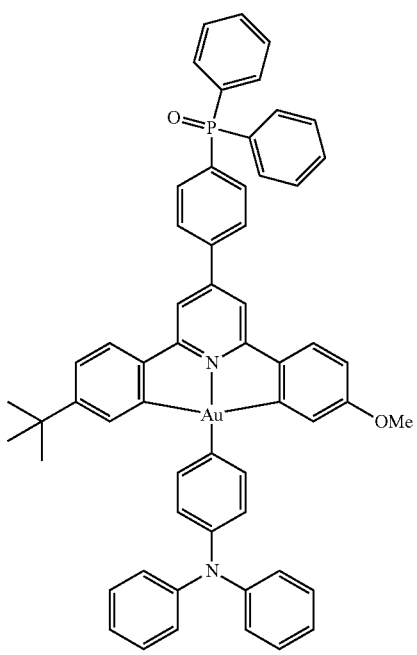
Compound 9
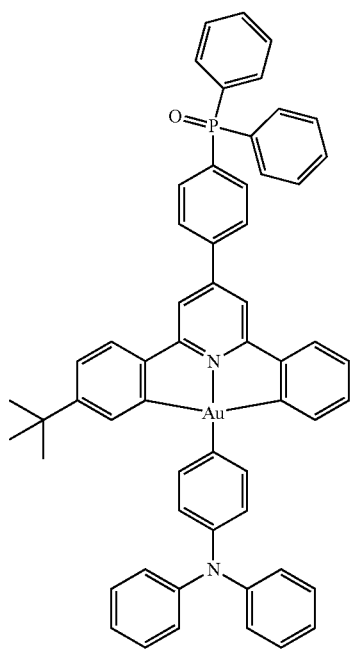

Compound 10
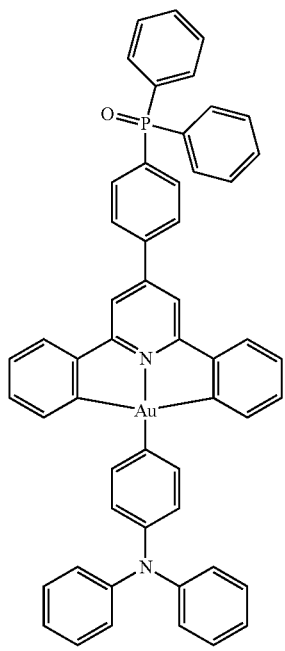
Compound 11
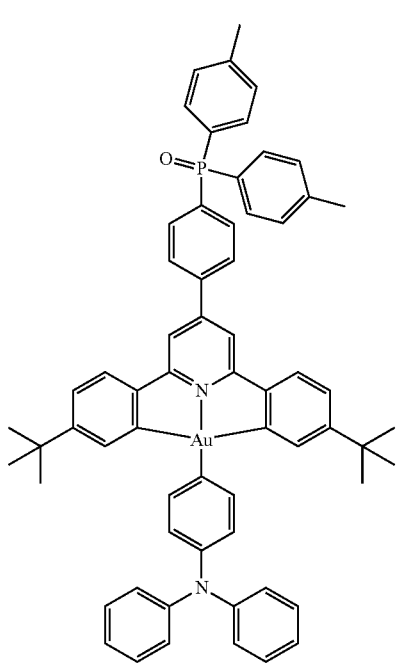
Compound 12
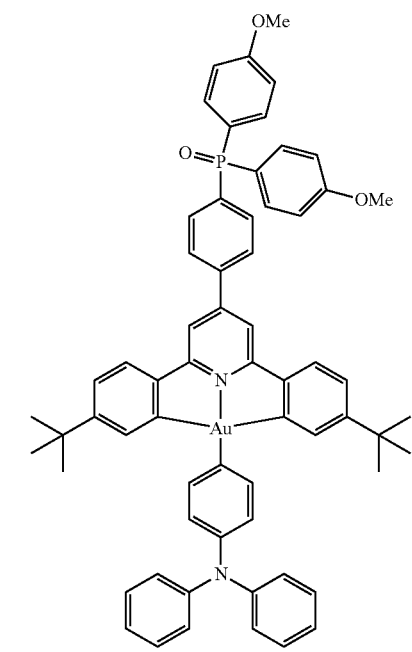
Compound 13
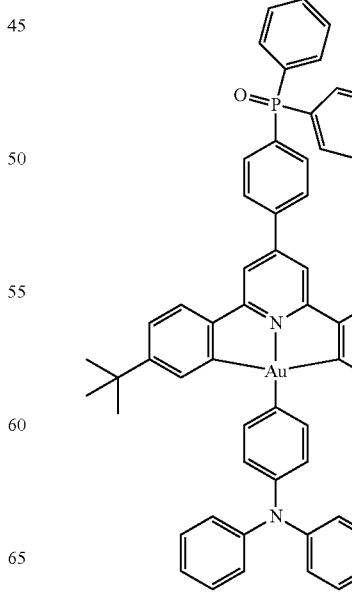

Compound 14
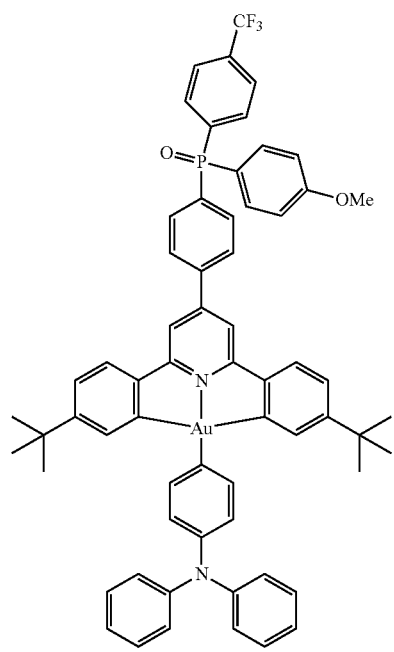
Compound 16
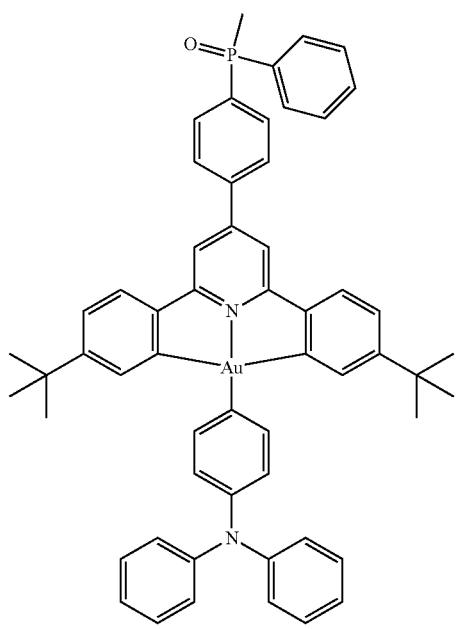
Compound 15
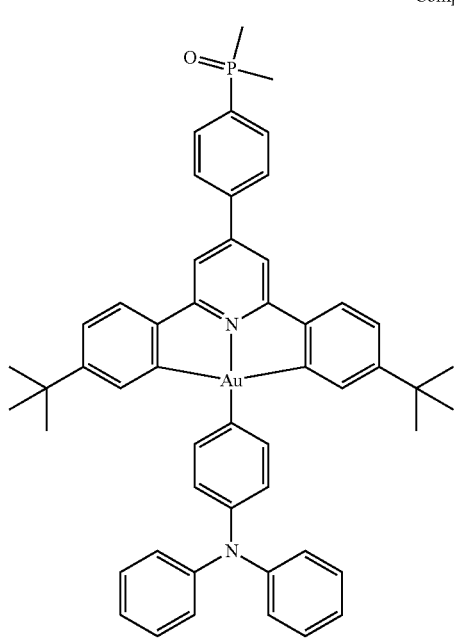
Compound 17
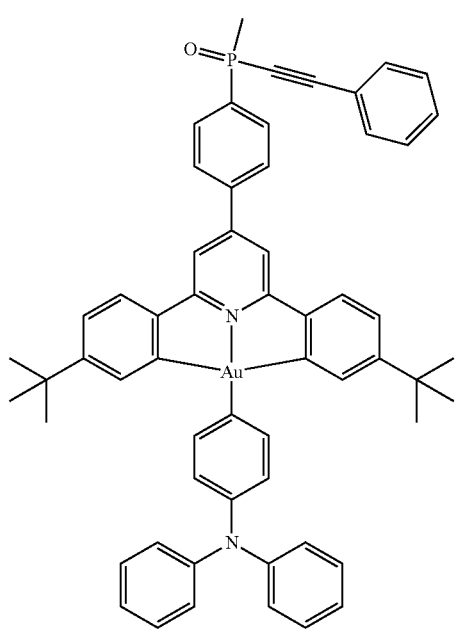

Compound 18
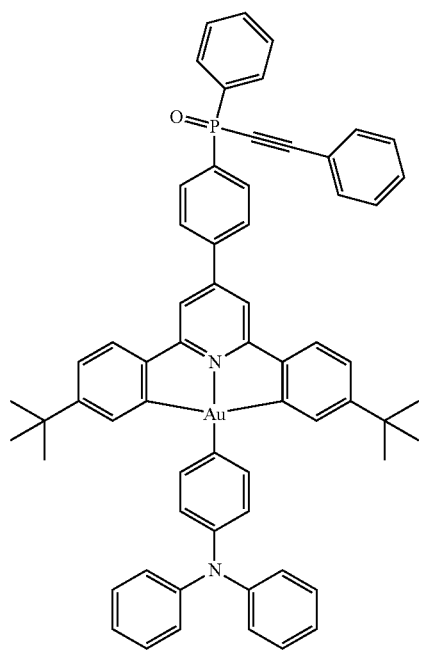
Compound 19
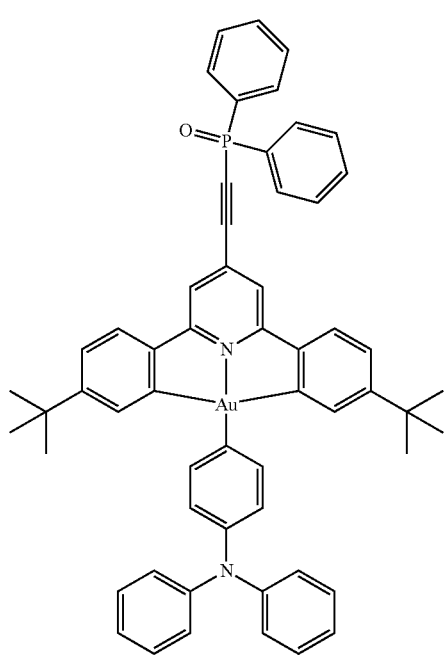
Compound 20
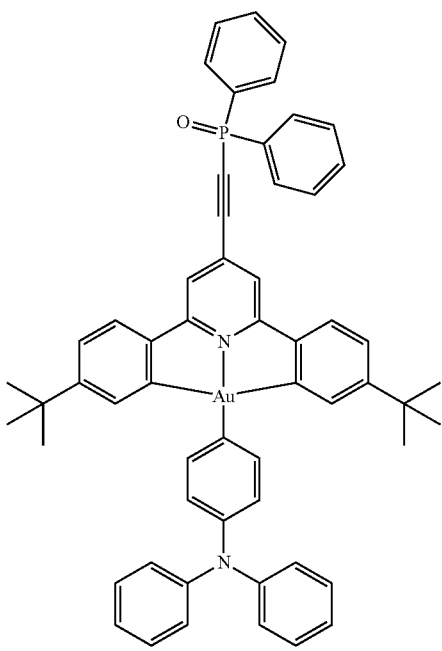
Compound 21
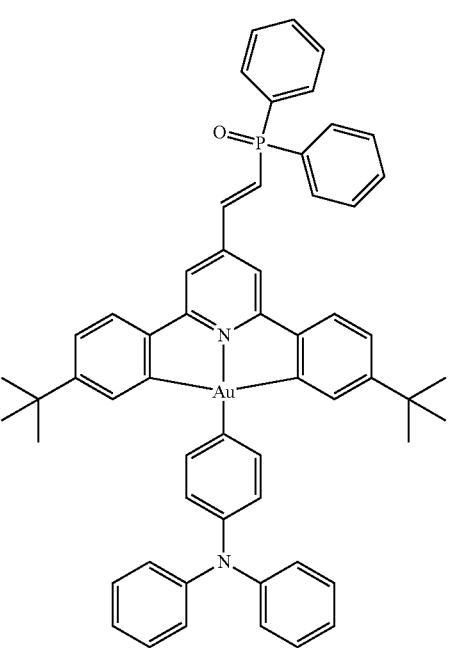

Compound 22
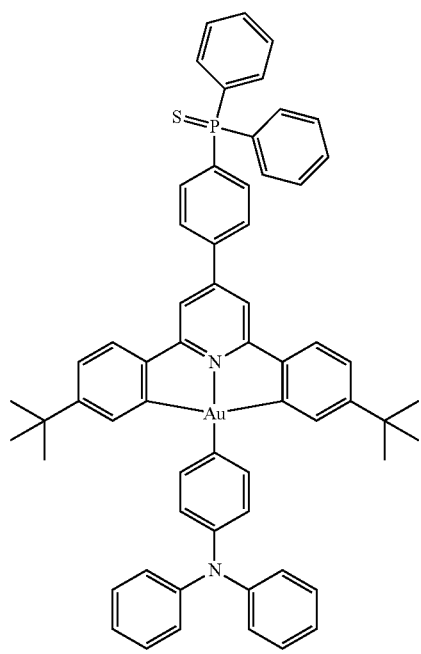
Compound 24
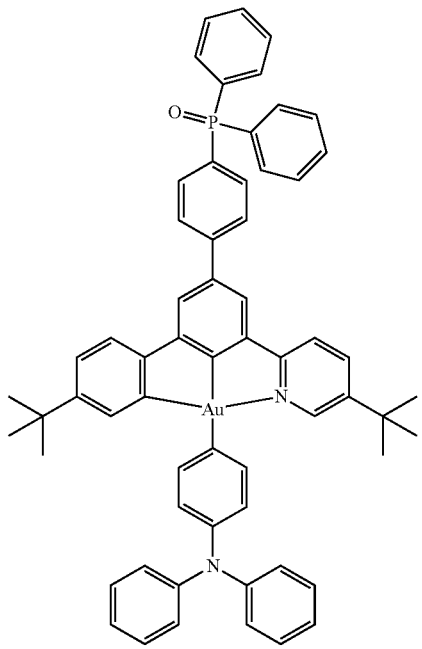
Compound 23
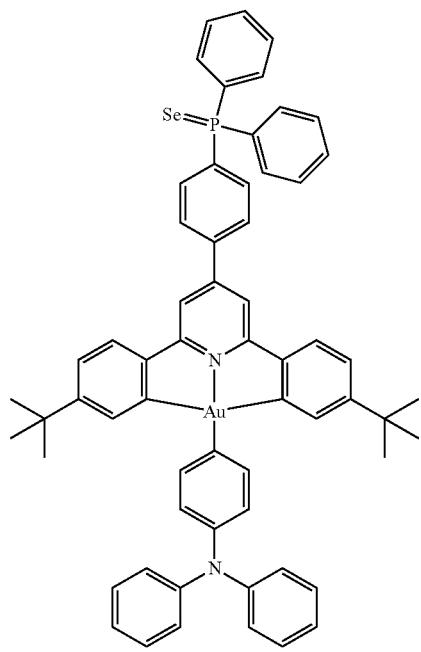
Compound 25
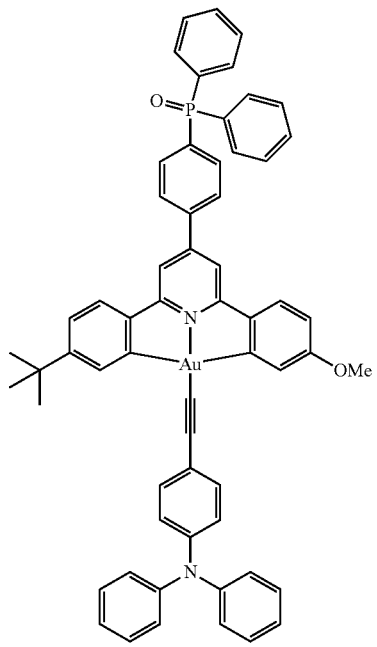

Compound 26
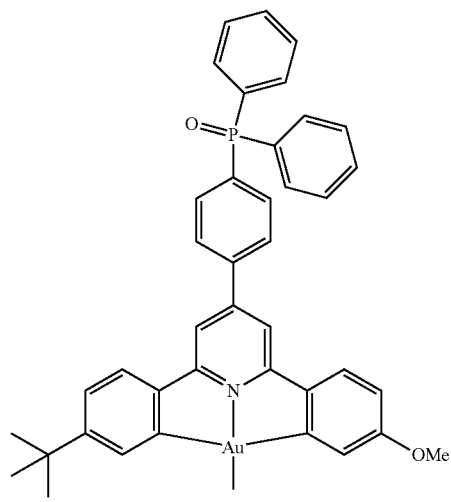
Compound 27
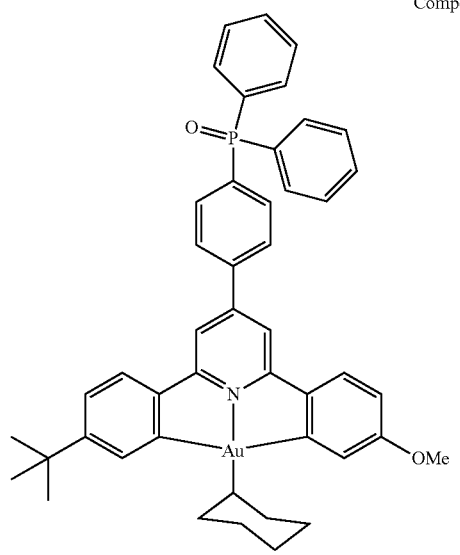
Compound 28
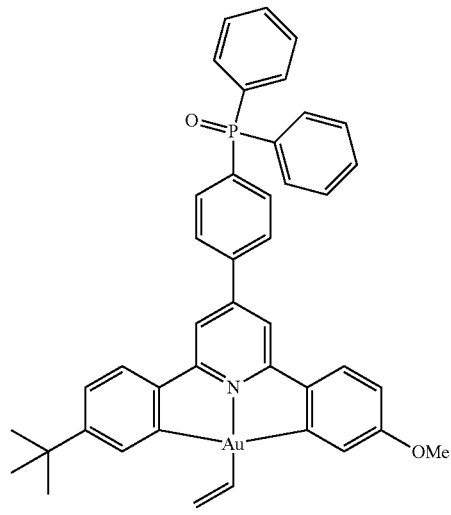
Compound 29
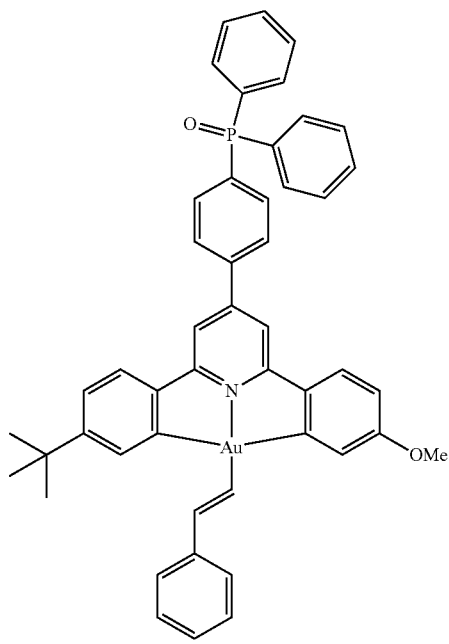
Compound 30
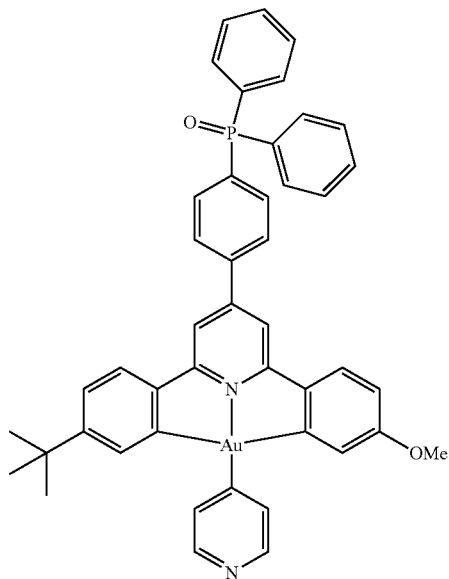

Compound 31
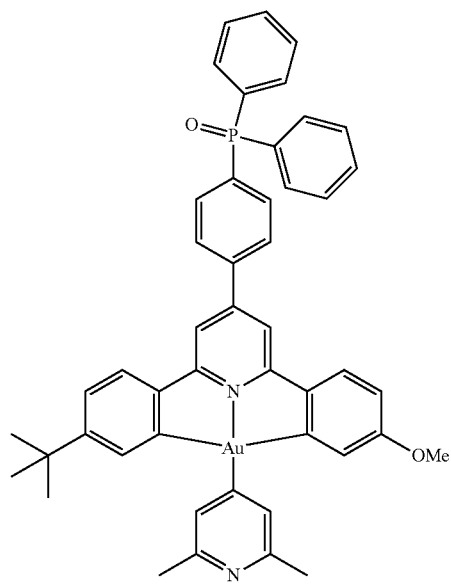
Compound 32
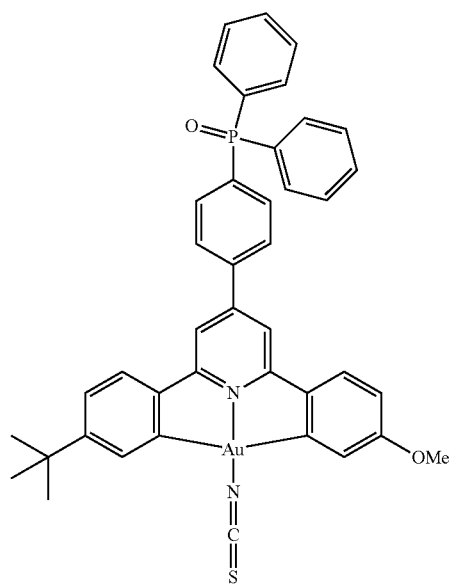
Compound 33
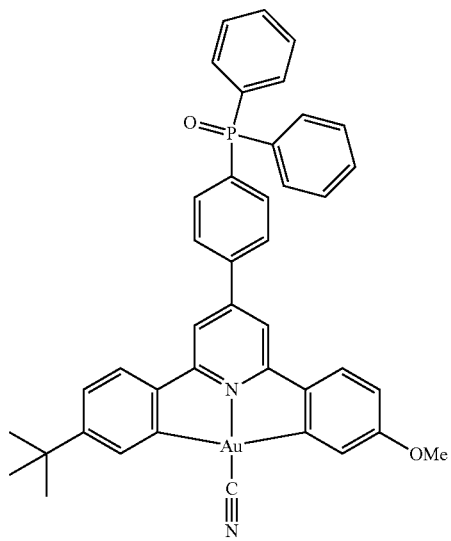
Compound 34
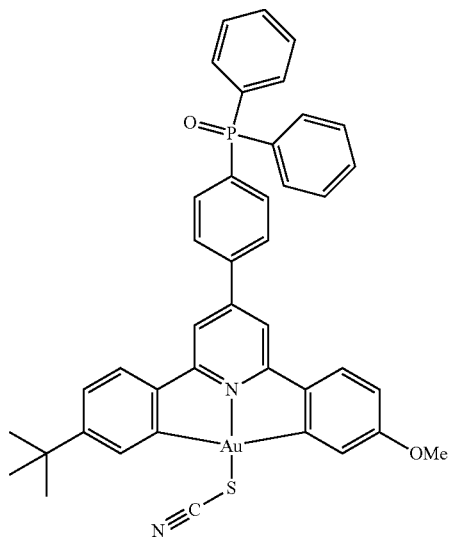

Compound 35
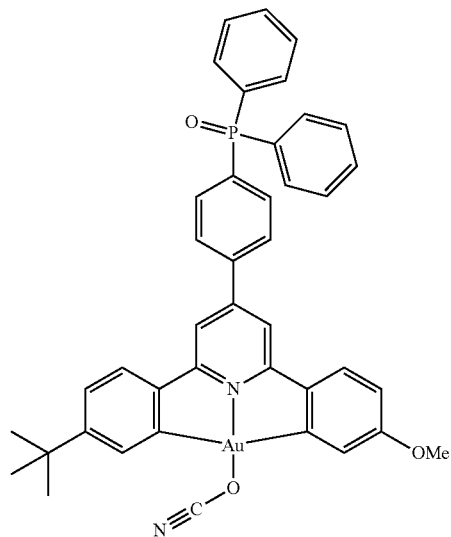
Compound 36
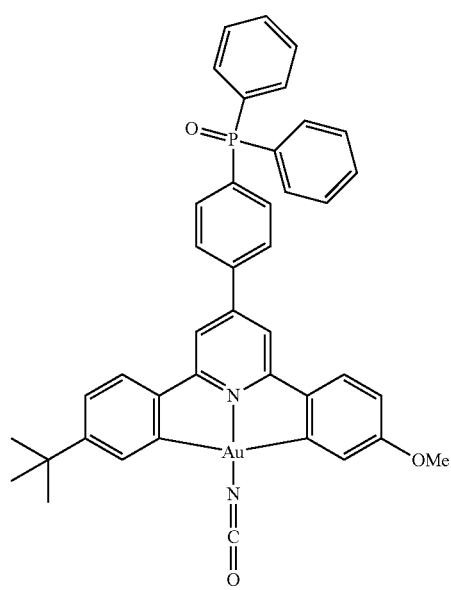
Compound 37
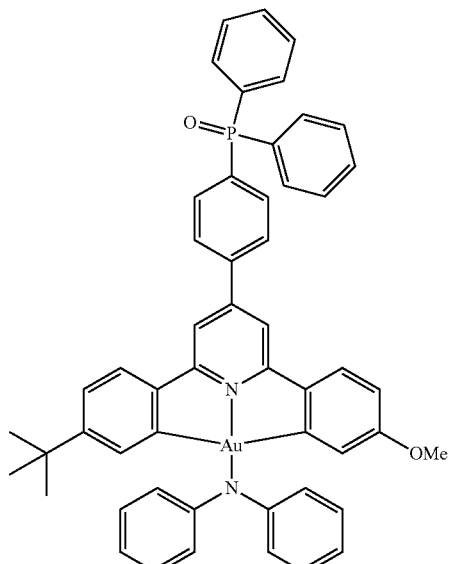
Compound 38
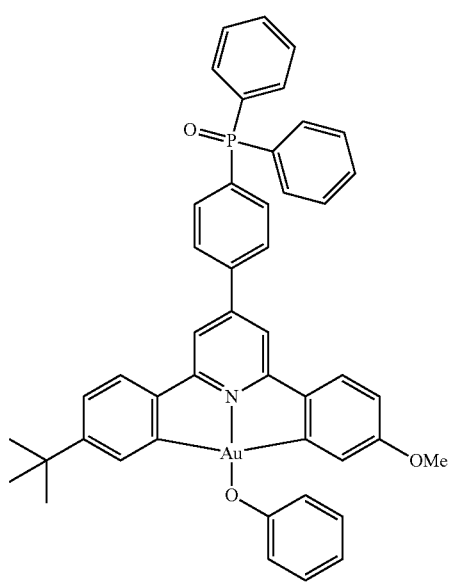

Compound 39
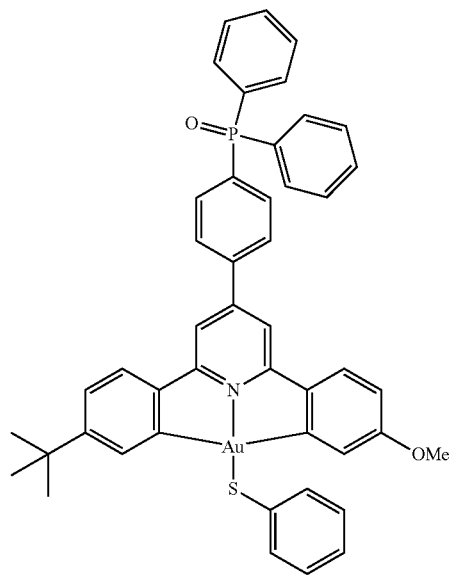
Compound 40
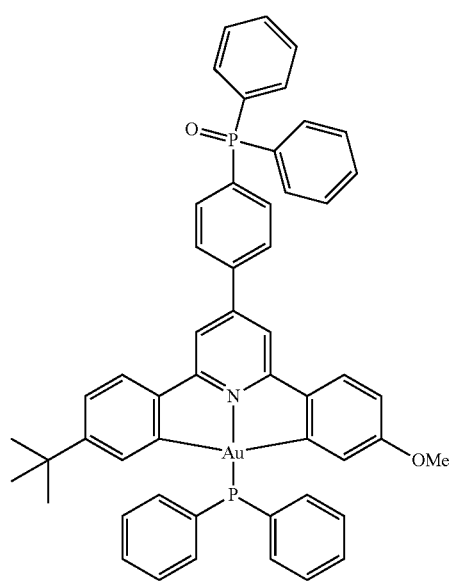
Compound 41
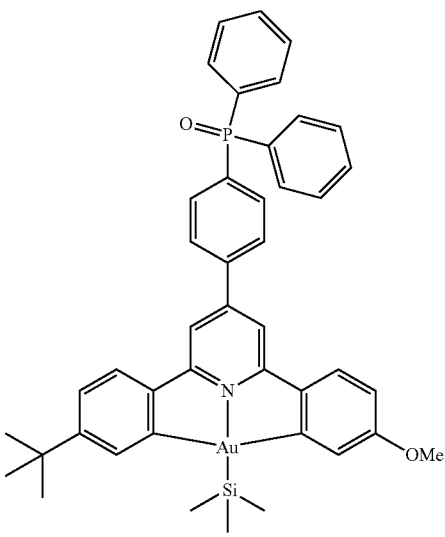
Compound 42
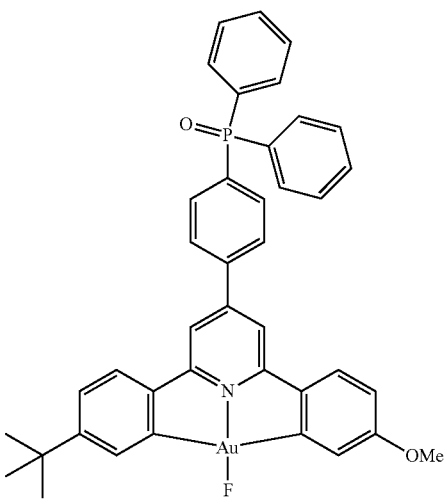
Compound 43
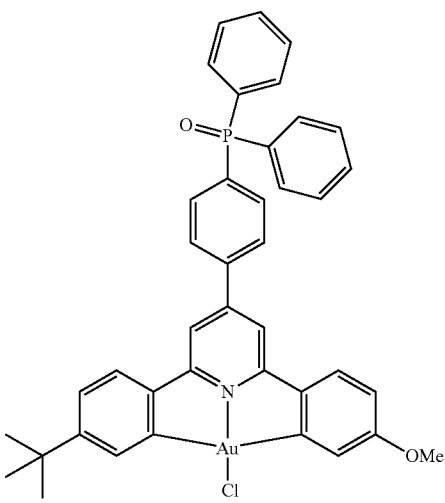

Compound 44
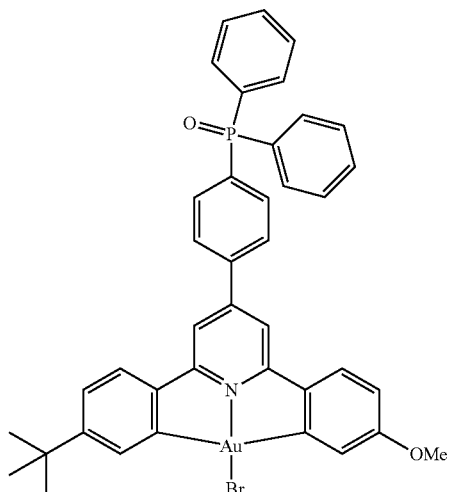
Compound 45
Compound 47
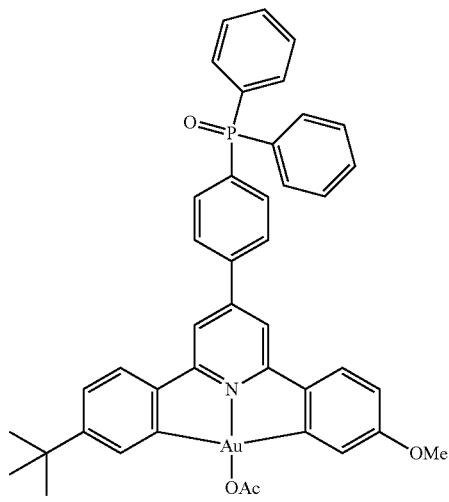
Compound 48
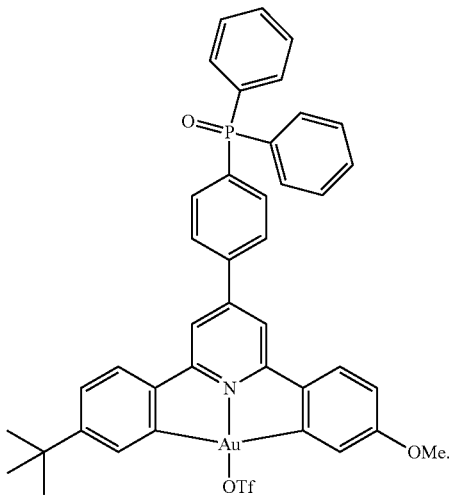
Compound 46
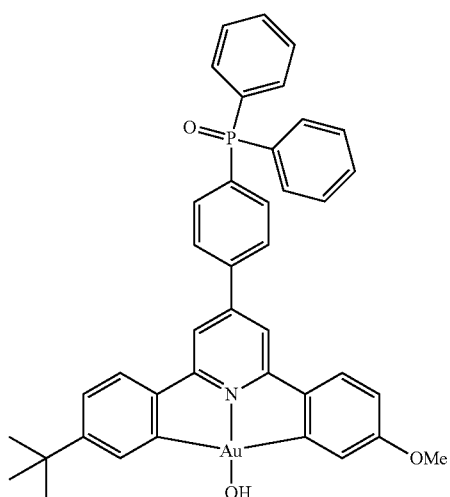
Disclosed herein is a method for preparing a luminescent compound with group 15 element-containing cyclometalating tridentate ligand and at least one aryl or alkynyl group, both coordinated to a gold(III) metal center, comprising the following reaction:
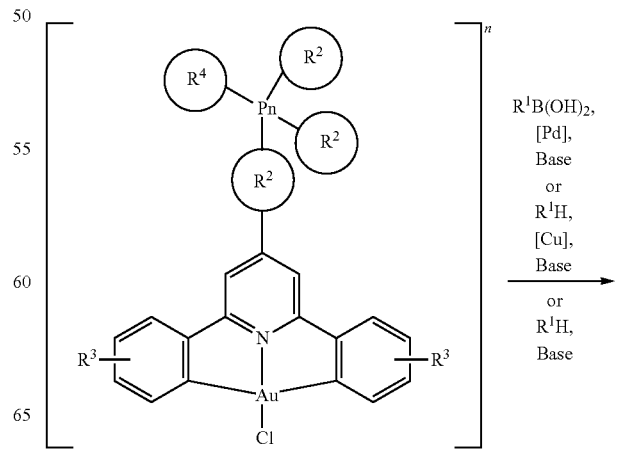

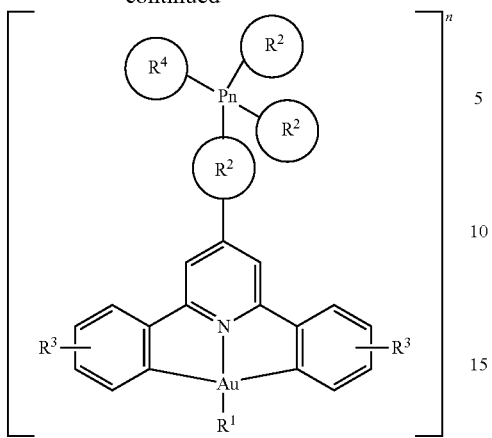

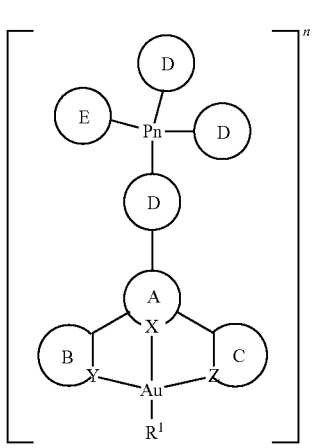

wherein:
- (a) $R^1$ is selected from, but is not limited to, alkyl, substituted alkyl, aryl, substituted aryl, heteroaryl, substituted heteroaryl, heterocyclic aryl, substituted heterocyclic aryl, alkynyl or substituted alkynyl. $R^1$ could also be group with heteroatom as the donor atom and is selected from, but not limited to, nitrogen, oxygen, sulphur or phosphorus;
- (b) $R^2$ and $R^3$ groups are each independently selected from, but are not limited to, alkyl, alkenyl, alkynyl, alkylaryl, aryl and cycloalkyl with one or more alkyl, alkenyl, alkynyl, alkylaryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or a heterocyclic group, wherein R is independently alkyl, alkynyl, alkylaryl, aryl or cycloalkyl;
- (c) $R^4$ can be any chalcogen selected from oxygen, sulphur, selenium, tellurium, being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn;
- (d) Pn is pnictogen selected from nitrogen, phosphorus, arsenic and bismuth;
- (e) n is zero, a positive integer or a negative integer.

In certain embodiments, a luminescent compound is prepared.

In certain embodiments, the gold(III) metal center comprises a light-emitting layer of a light-emitting device.

In certain embodiments, the gold(III) metal group comprises a layer of a light-emitting device.

In certain embodiments, the gold(III) metal compound is a dopant included in the light-emitting layer or emissive layer of the light-emitting device.

In certain embodiments, the gold(III) metal compound is a dopant included in a light-emitting device.

Provided in this disclosure is a light-emitting device with an ordered structure comprising an anode, a hole-transporting layer, a light-emitting layer, an electron-transporting layer and a cathode wherein the light-emitting layer comprises a gold(III) compound having a chemical structure represented by the following general formula (I), wherein:
- (a) X is nitrogen or carbon;
- (b) Y and Z are nitrogen or carbon;
- (c) A is benzene, phenyl derivatives, heterocycle or heterocyclic derivatives;
- (d) B and C are independently benzene, phenyl derivatives, heterocycle or heterocyclic derivatives;
- (e) D is any alkyl, cyclic aliphatic or aromatic structures, in which each D group can be identical or non-identical;
- (f) is pnictogen selected from nitrogen, phosphorus, arsenic and bismuth;
- (g) E can be any chalcogen selected from oxygen, sulphur, selenium, tellurium, being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn;
- (h) $R^1$ is any carbon or heteroatom donor ligand, halide or pseudohalide, which could be either monoanionic or neutral. $R^1$ is selected from, but not limited to, alkyl, substituted alkyl, aryl, substituted aryl, heteroaryl, substituted heteroaryl, heterocyclic aryl, substituted heterocyclic aryl, alkynyl, substituted alkynyl, alkoxy, amide, thiolate, phosphide, chloride, bromide, iodide, cyanate, thiocyanate or cyanide;
- (i) n is zero, a positive integer or a negative integer.

In certain embodiments, the benzene, phenyl derivatives, heterocycle or heterocyclic derivatives comprises one or more alkyl, alkenyl, alkynyl, aryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or heterocyclic group, and wherein D is alkyl, heteroatom-containing alkyl, aryl, substituted aryl, heteroaryl, substituted heteroaryl, arylalkenyl and substituted arylalkenyl, E is chalcogen being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn, and R is independently alkyl, alkynyl, alkylaryl, aryl or cycloalkyl.

In certain embodiments, the light-emitting layer or emissive layer is prepared using vacuum deposition or solution processing technique.

Also provided is a light-emitting device with an ordered structure comprising an anode, a hold-transporting layer, a light-emitting layer, an electron-transporting layer and a cathode wherein the light-emitting layer comprises a gold (III) compound having the structure:

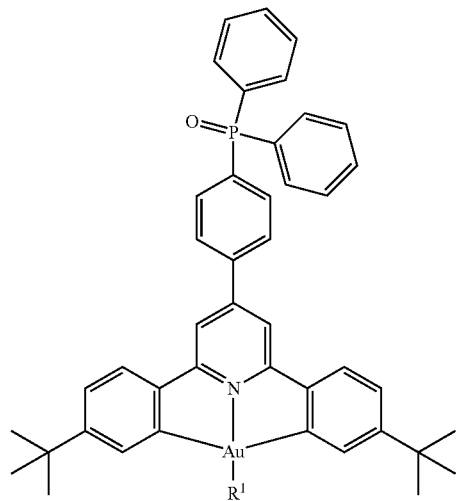

wherein R¹ is triphenylamine, 4-(tert-butyl)phenyl, or R¹ is any one of the following structures:

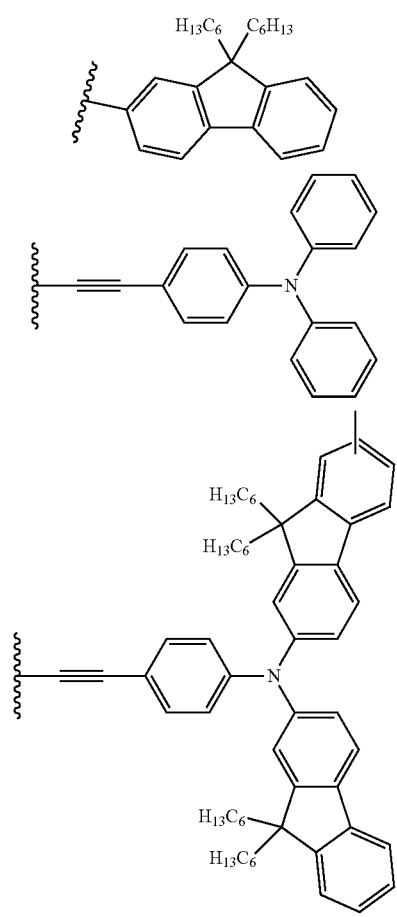

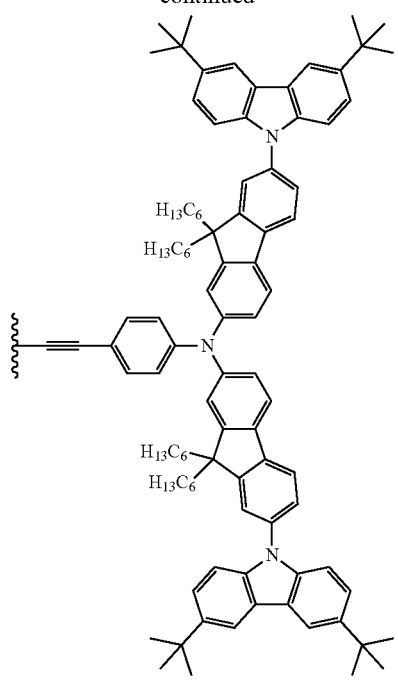

Also provided in the disclosure is a light-emitting device with an ordered structure comprising an anode, a hole-transporting layer, a light-emitting layer, an electron-transporting layer and a cathode wherein the light-emitting layer comprises a gold(III) compound having one of the following structures:

Compound 7

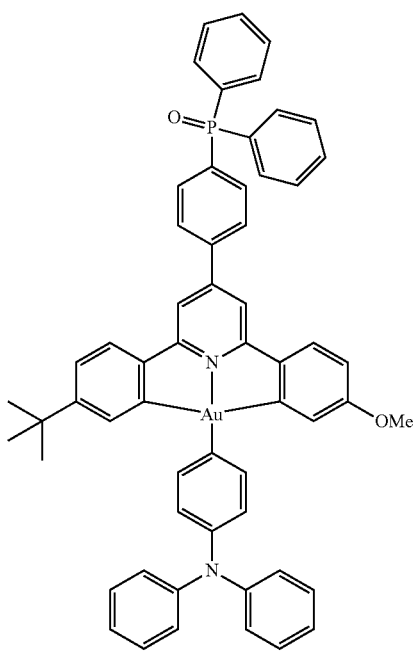

Compound 8
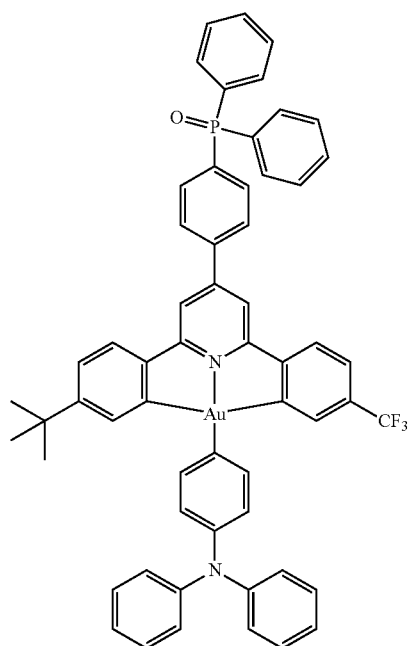
Compound 10
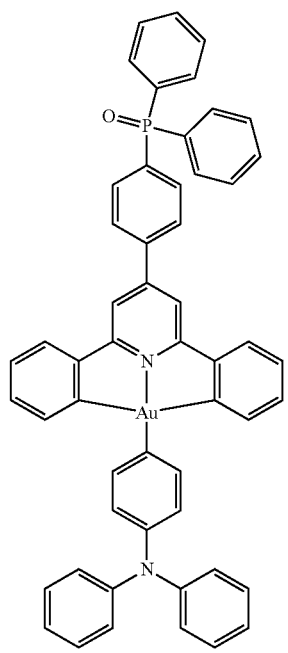
Compound 9
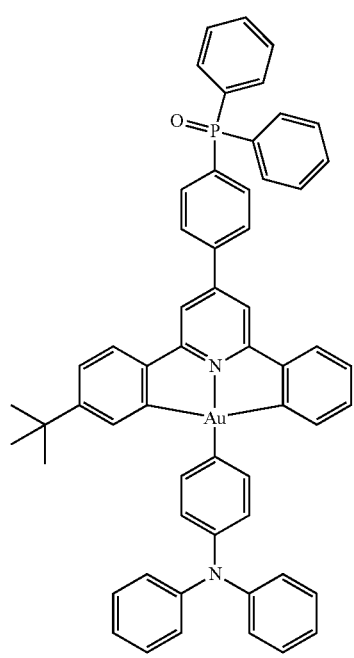
Compound 11
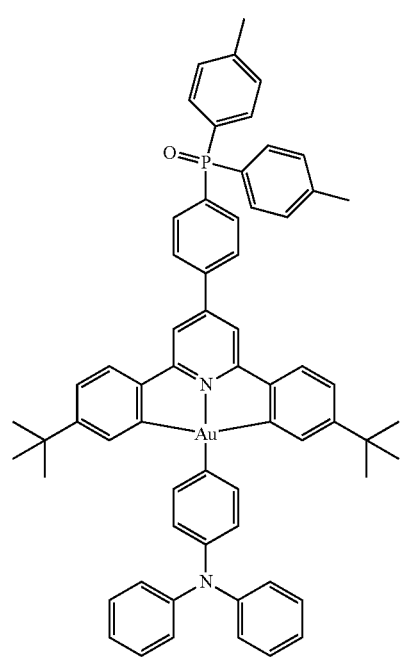

Compound 12
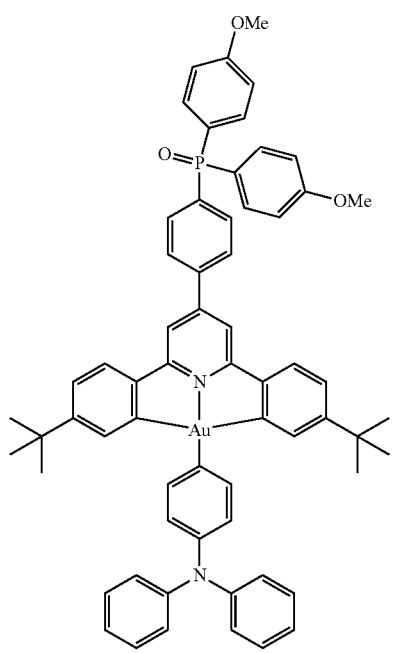
Compound 14
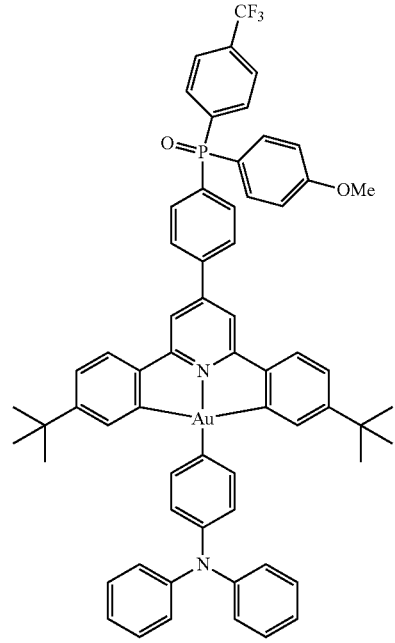
Compound 13
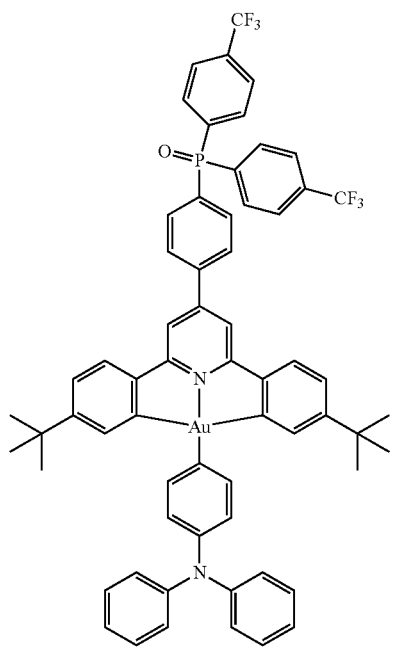
Compound 15
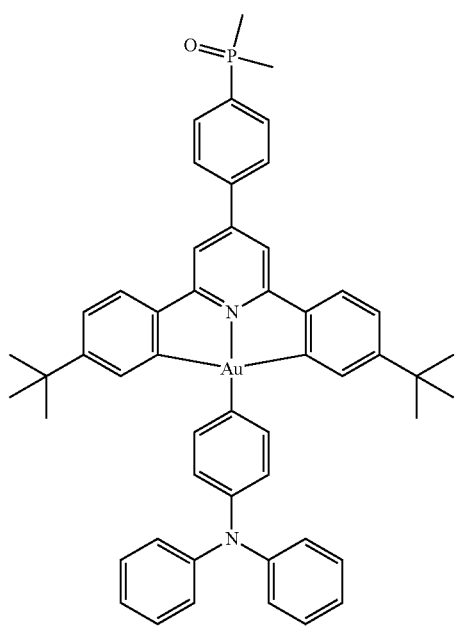

Compound 16
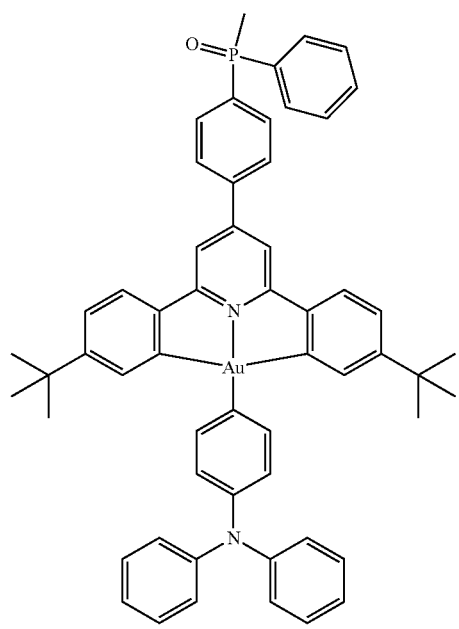
Compound 17
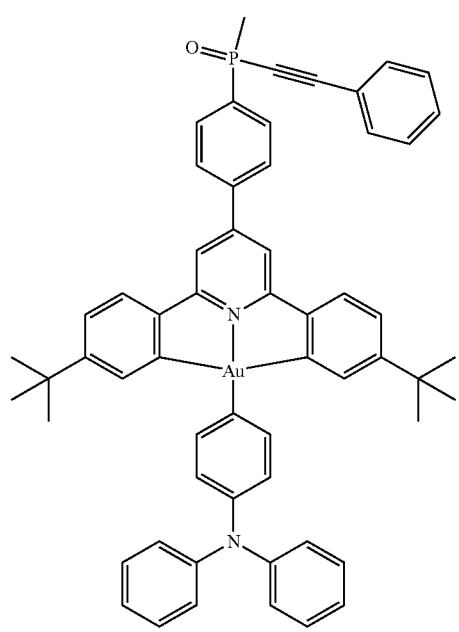
Compound 18
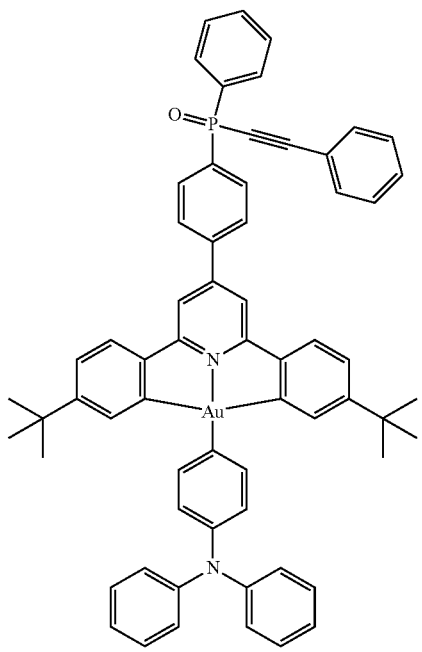
Compound 19
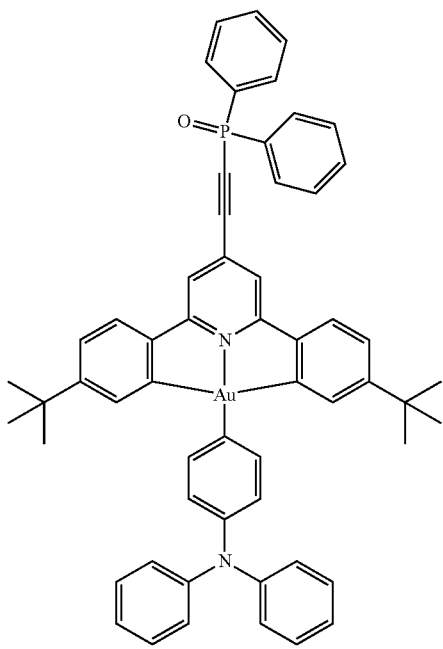

Compound 20
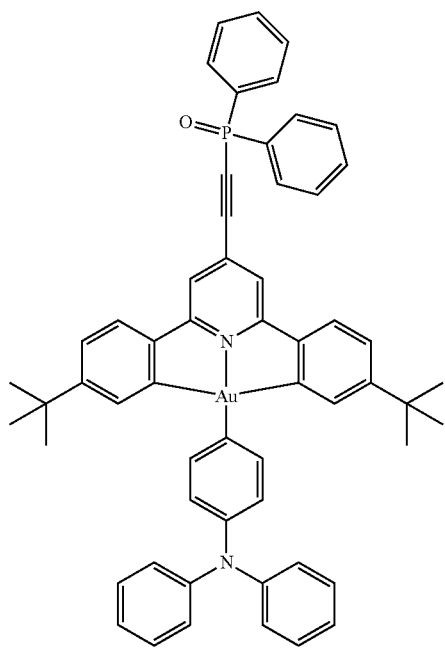
Compound 22
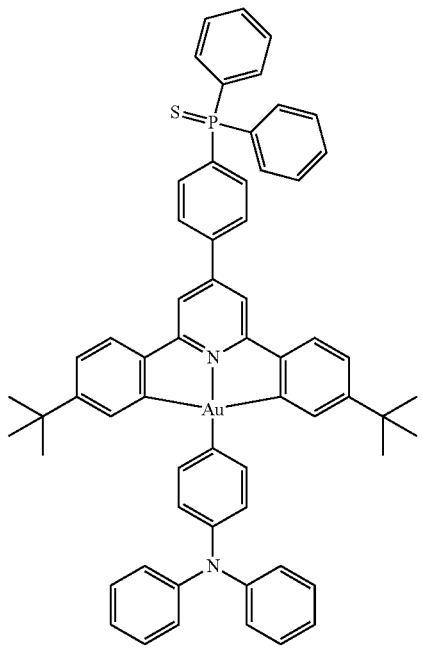
Compound 21
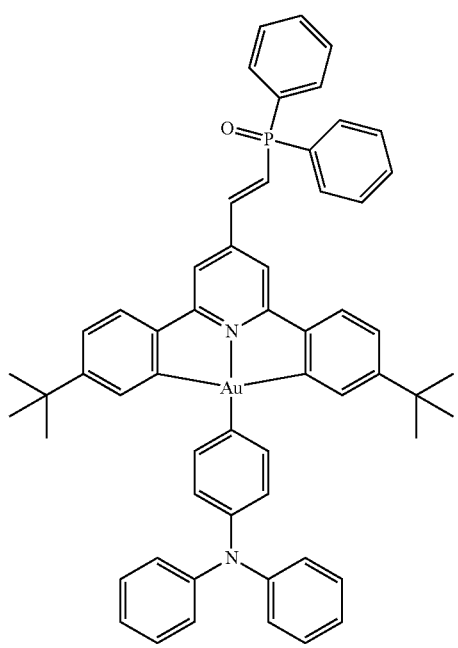
Compound 23
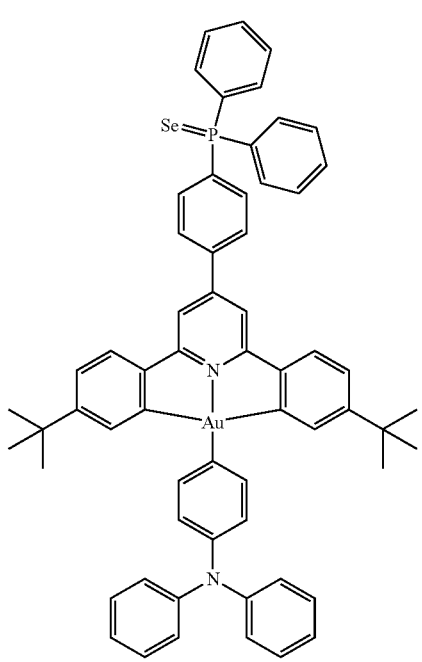

Compound 24
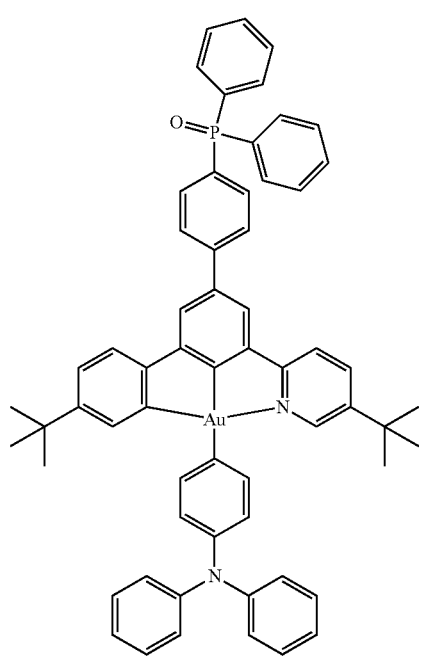
Compound 25
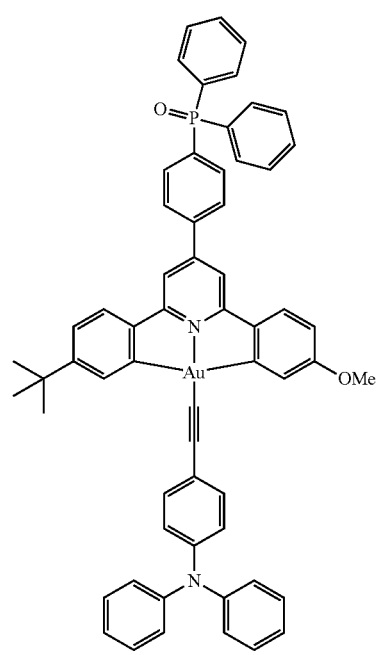
Compound 26
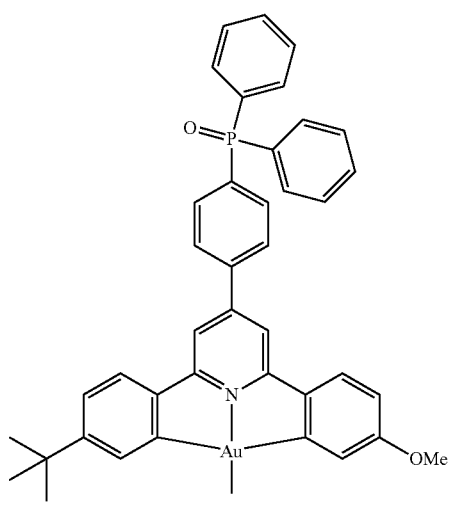
Compound 27
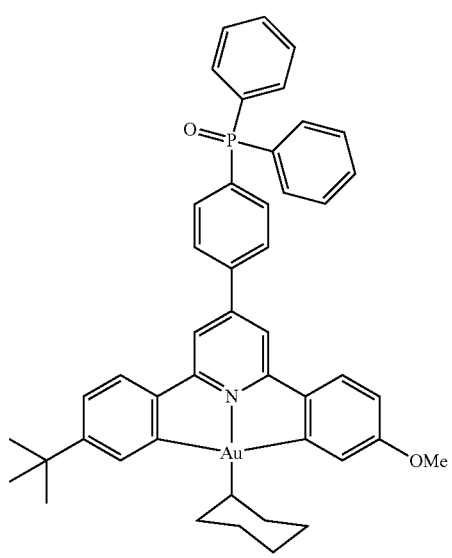
Compound 28
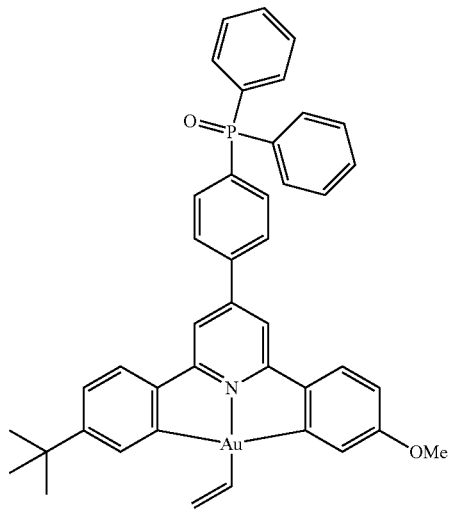

Compound 29
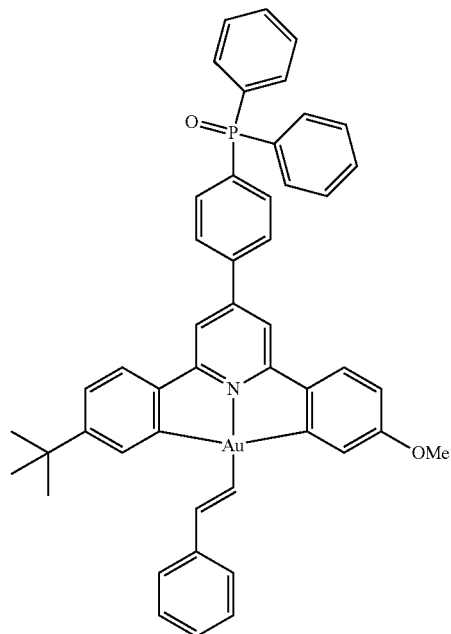
Compound 31
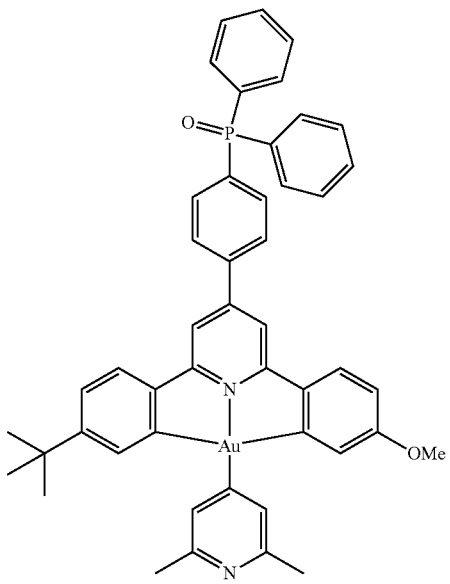
Compound 30
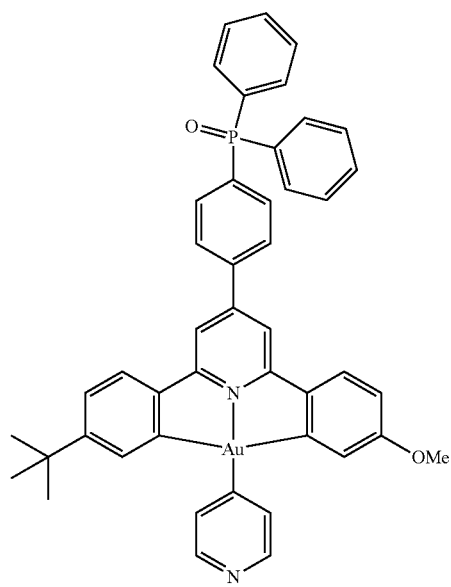
Compound 32
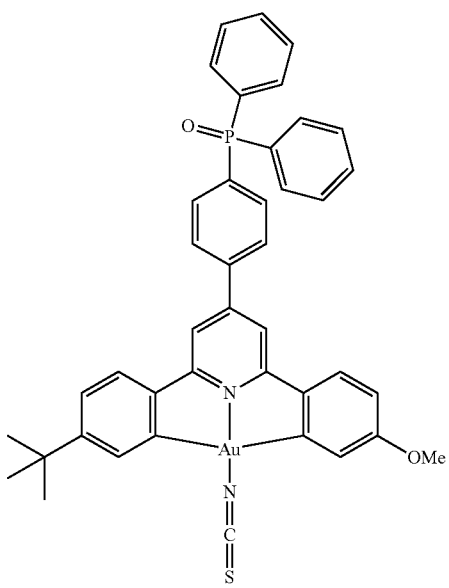

Compound 33
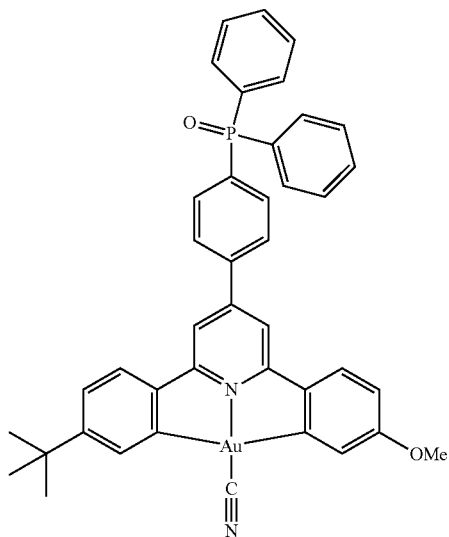
Compound 35
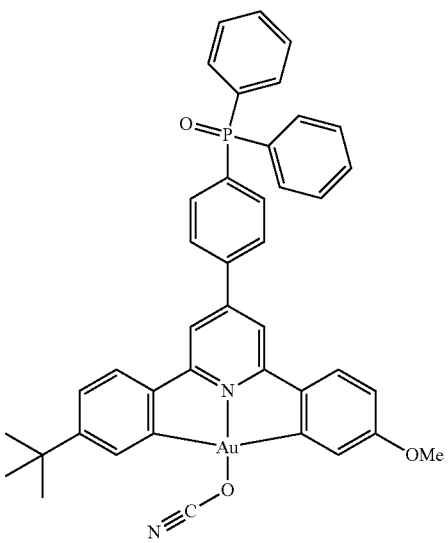
Compound 34
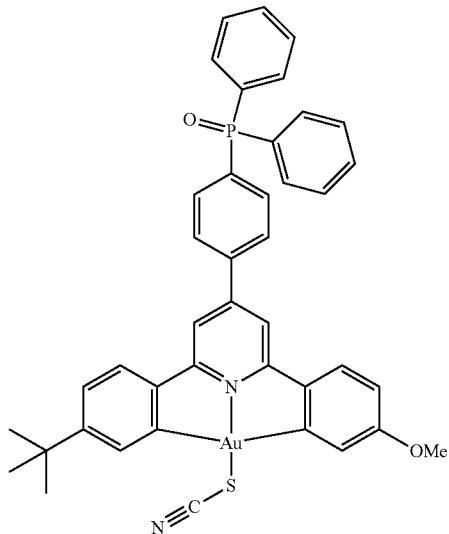
Compound 36
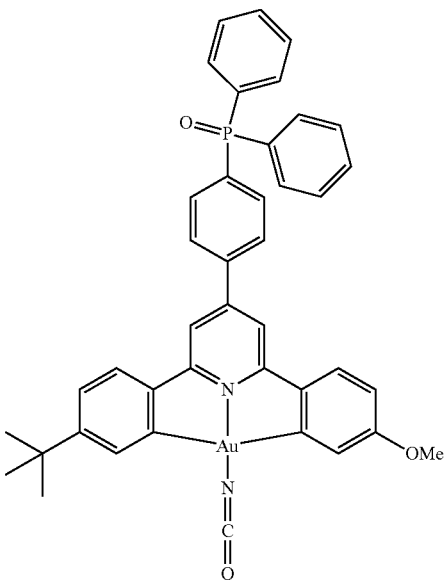

-continued
Compound 37
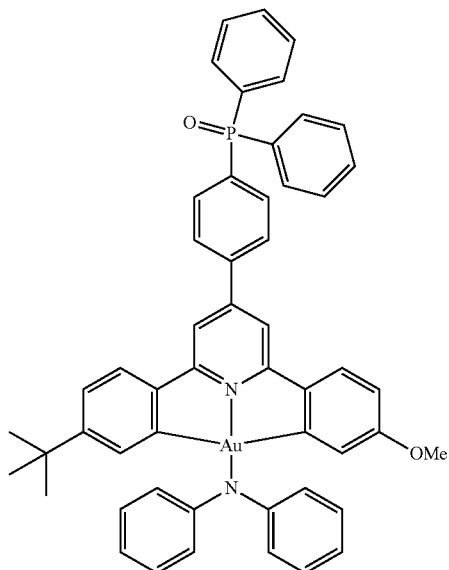
Compound 38
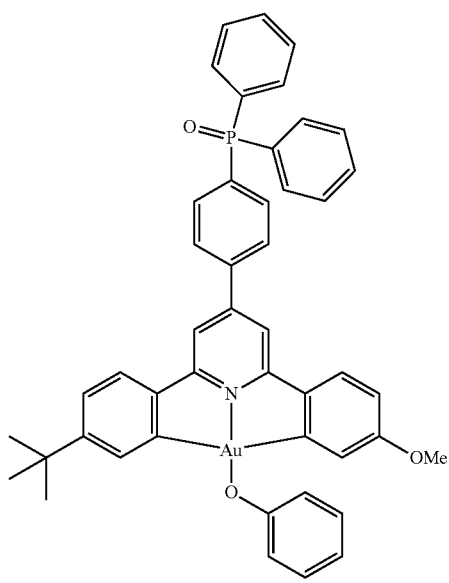
-continued
Compound 39
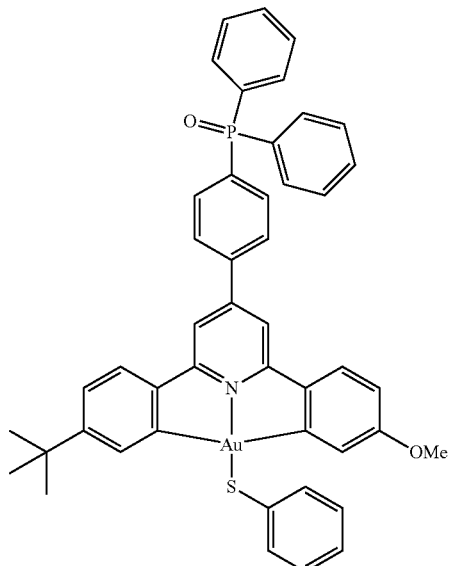
Compound 40
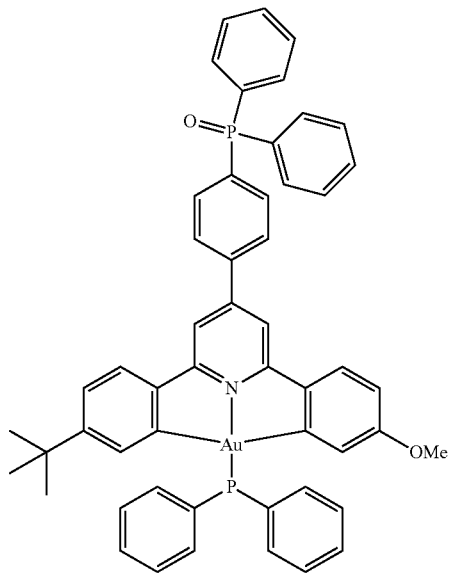

Compound 41
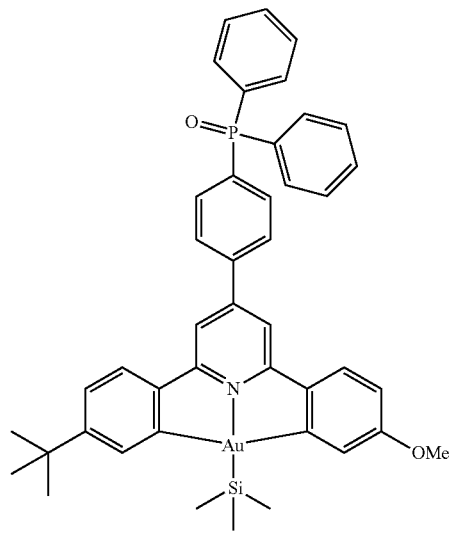
Compound 42
Compound 43
Compound 44
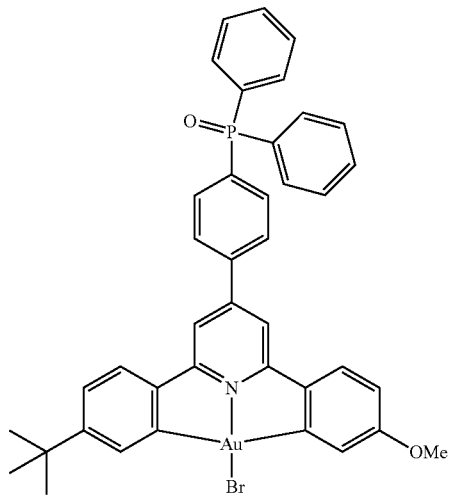
Compound 45
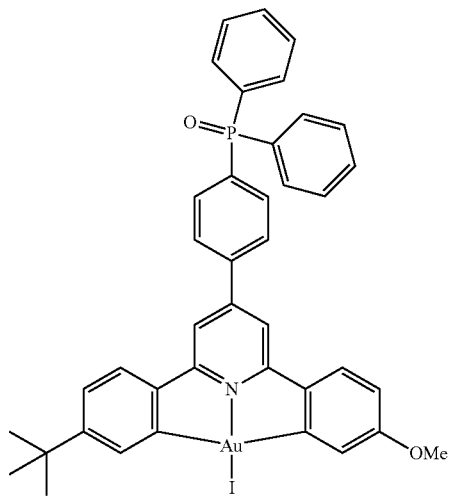
Compound 46
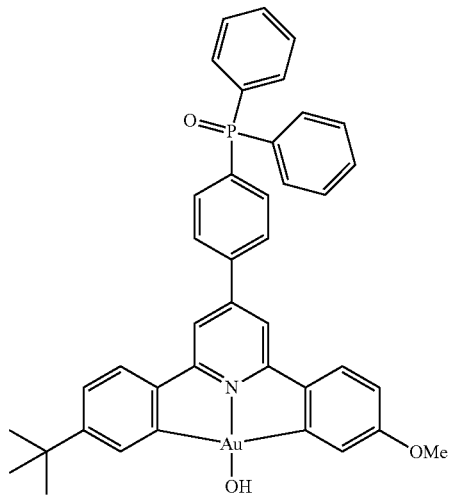

-continued

Compound 47

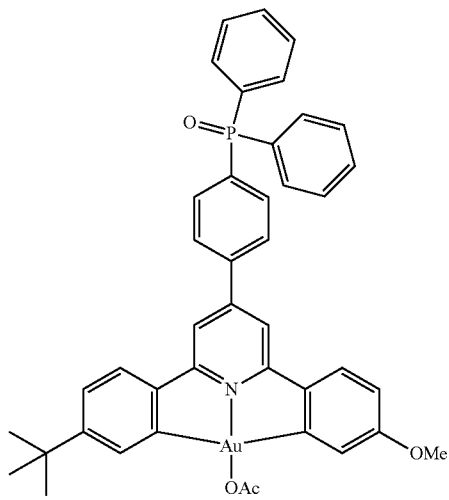

Compound 48

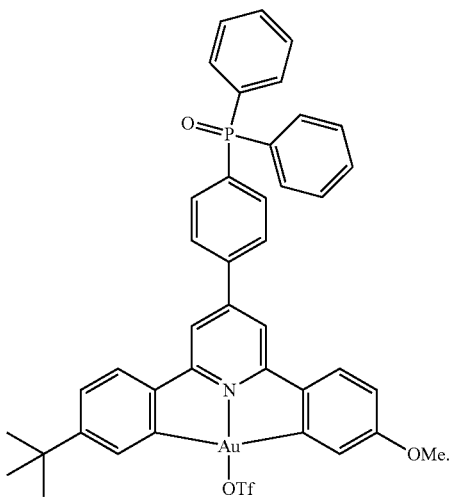

Provided in this disclosure is an apparatus comprising: a compound as described herein, and wherein the apparatus is selected from a television, a copier, a printer, a liquid crystal display, a measuring instrument, a display board, a marker lamp, an electrophotographic photoreceptor, a photoelectric transducer, a solar cell or an image sensor, such that the apparatus incorporates the compound for light emission or light absorption purposes.

4. BRIEF DESCRIPTION OF THE DRAWINGS

The invention is illustrated in the figures of the accompanying drawings which are meant to be exemplary and not limiting, in which like references are intended to refer to like or corresponding parts, and in which:

FIG. 1 presents a schematic diagram of the structure of an OLED device, in accordance with one or more embodiments herein.

Figure 2:
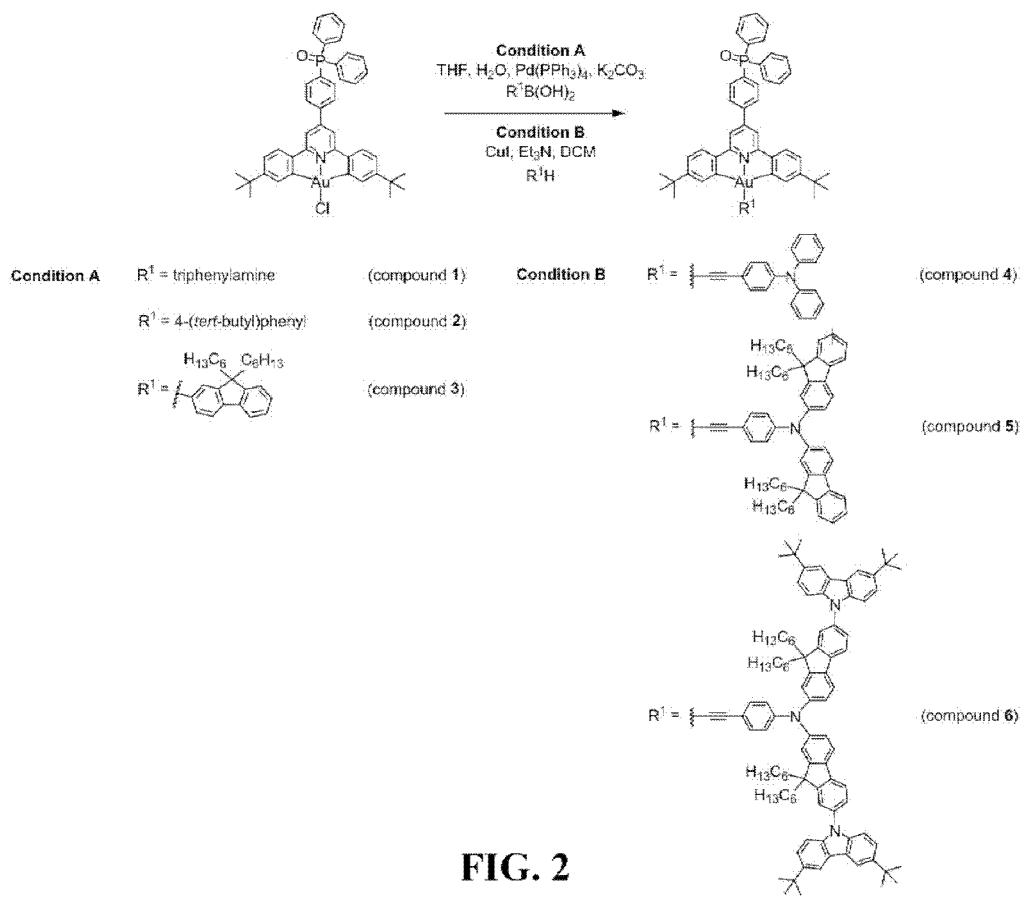

FIG. 2 presents chemical structures of compounds 1-6 as described herein for use as an OLED emitter according to one or more embodiments herein.

Figure 3:
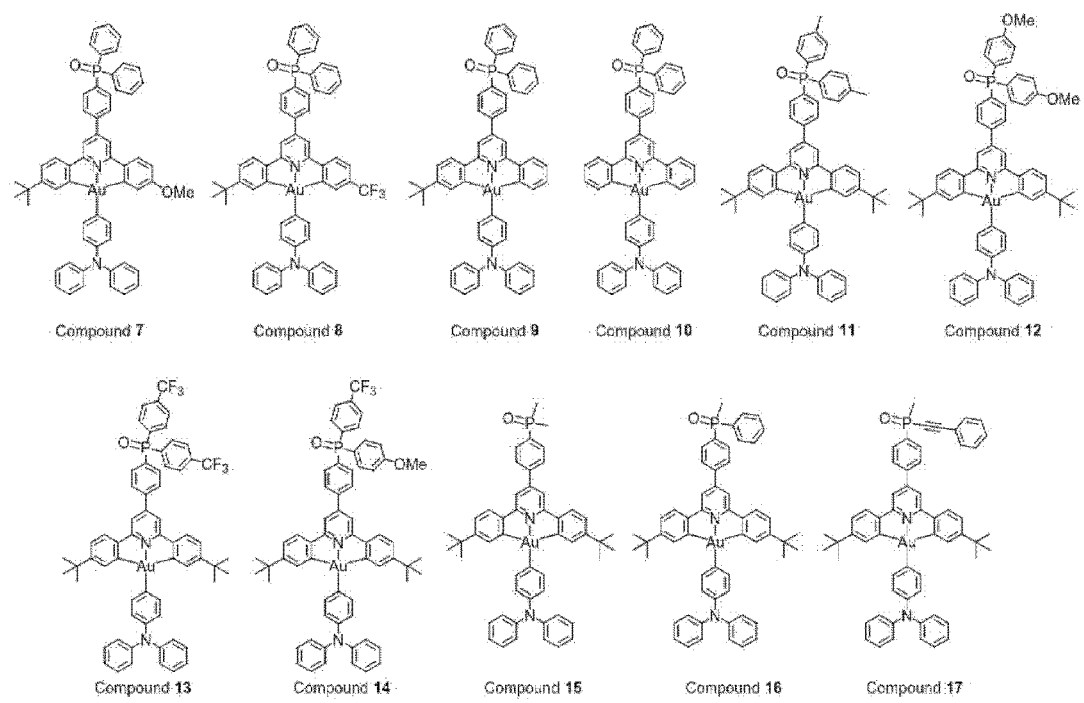

FIG. 3 presents chemical structures of compounds 7-17 as described herein for use as an OLED emitter according to one or more embodiments herein.

Figure 4:
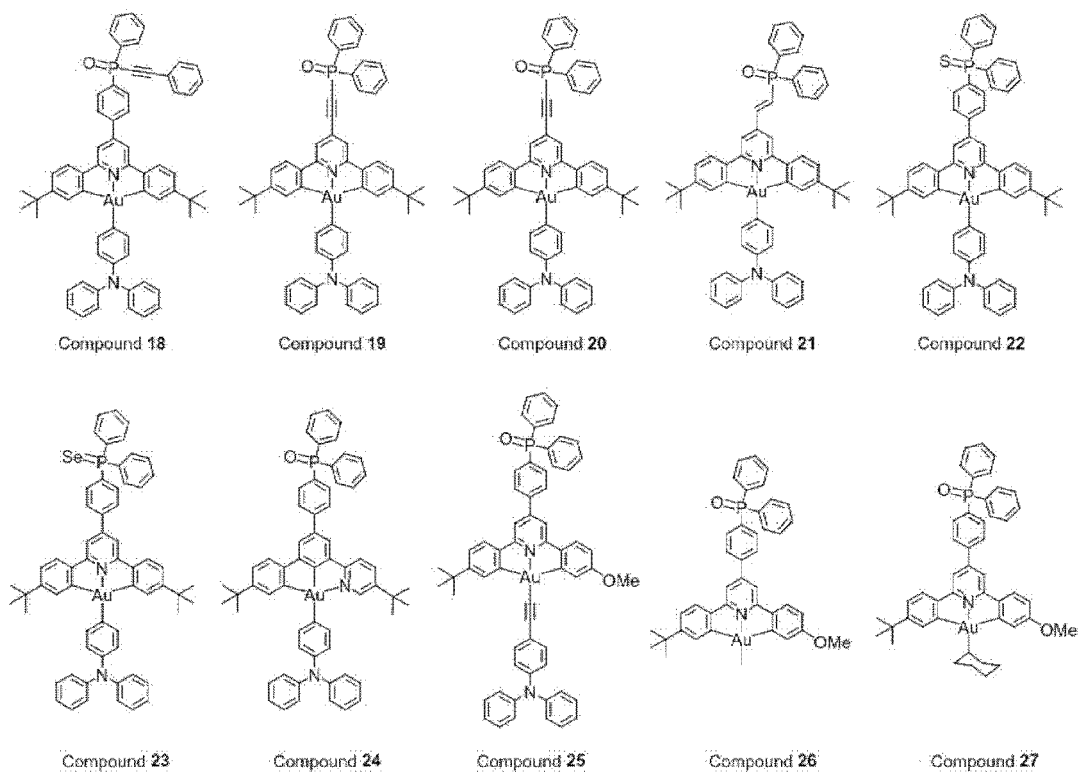

FIG. 4 presents chemical structures of compounds 18-27 as described herein for use as an OLED emitter according to one or more embodiments herein.

Figure 5:
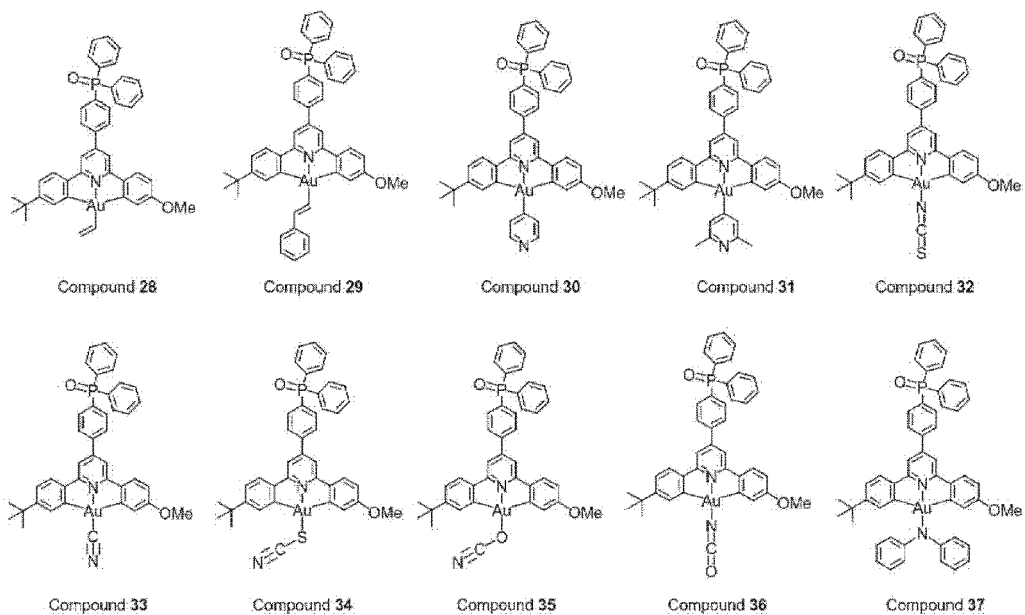

FIG. 5 presents chemical structures of compounds 28-37 as described herein for use as an OLED emitter according to one or more embodiments herein.

Figure 6:
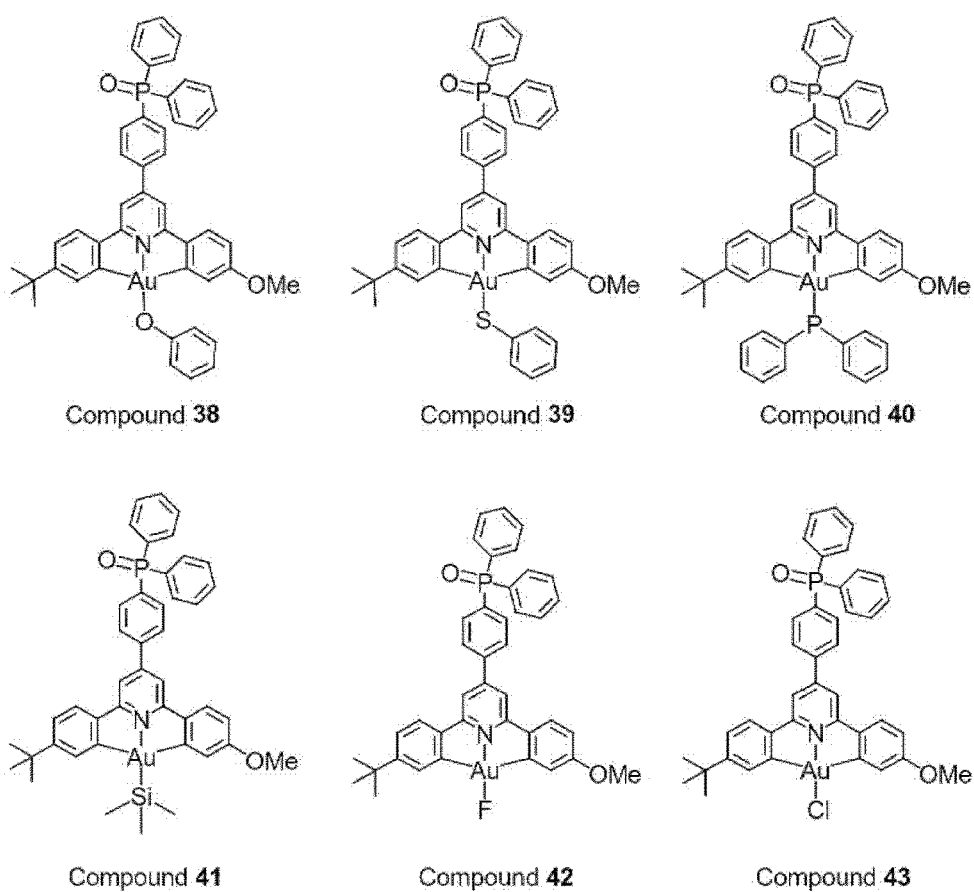

FIG. 6 presents chemical structures of compounds 38-43 as described herein for use as an OLED emitter according to one or more embodiments herein.

Figure 7:
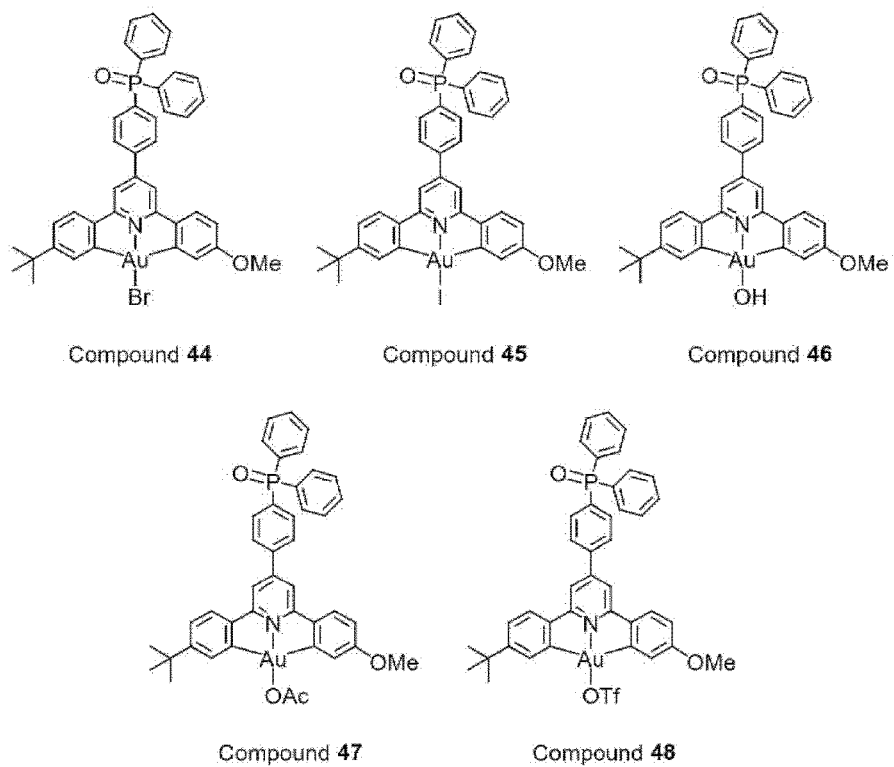

FIG. 7 presents chemical structures of compounds 44-48 as described herein for use as an OLED emitter according to one or more embodiments herein.

Figure 8:
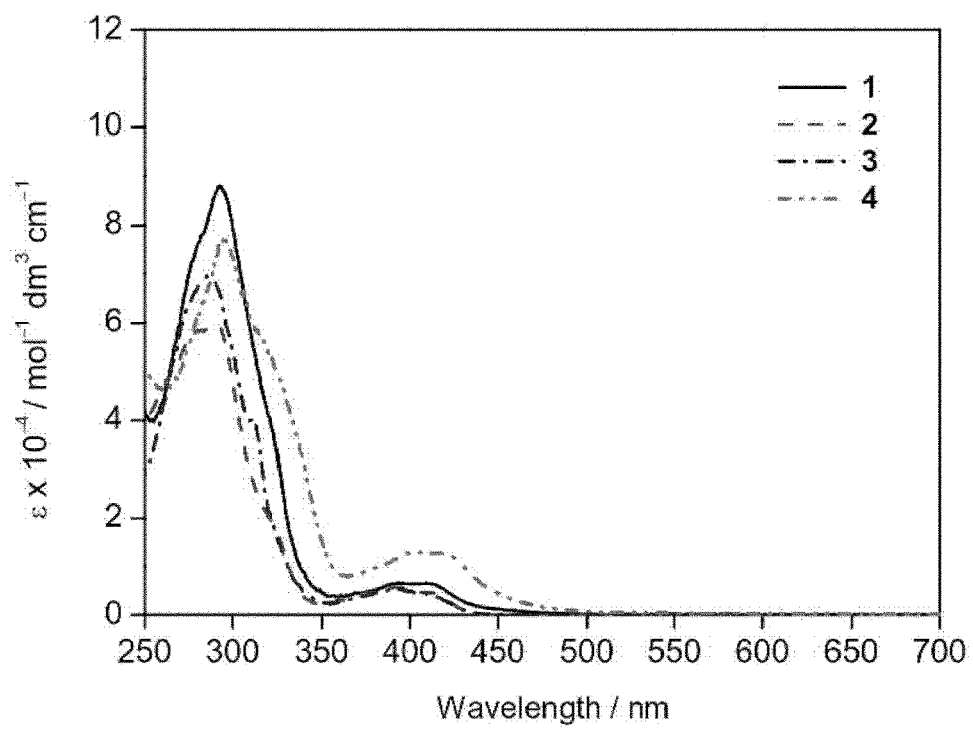

FIG. 8 presents a graphical representation of the UV-visible absorption spectra of the compounds of FIG. 2 in dichloromethane at 298 K, in accordance with one or more embodiments herein.

Figure 9:
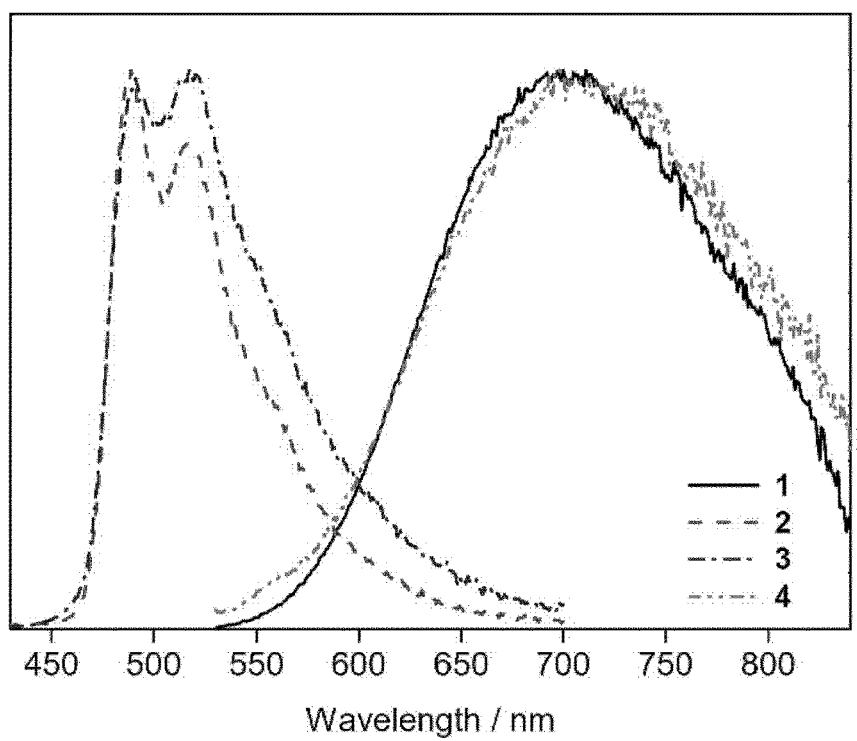

FIG. 9 presents a graphical representation of the normalized photoluminescence spectra of the compounds of FIG. 2 in dichloromethane at 298 K, in accordance with one or more embodiments herein.

Figure 10:
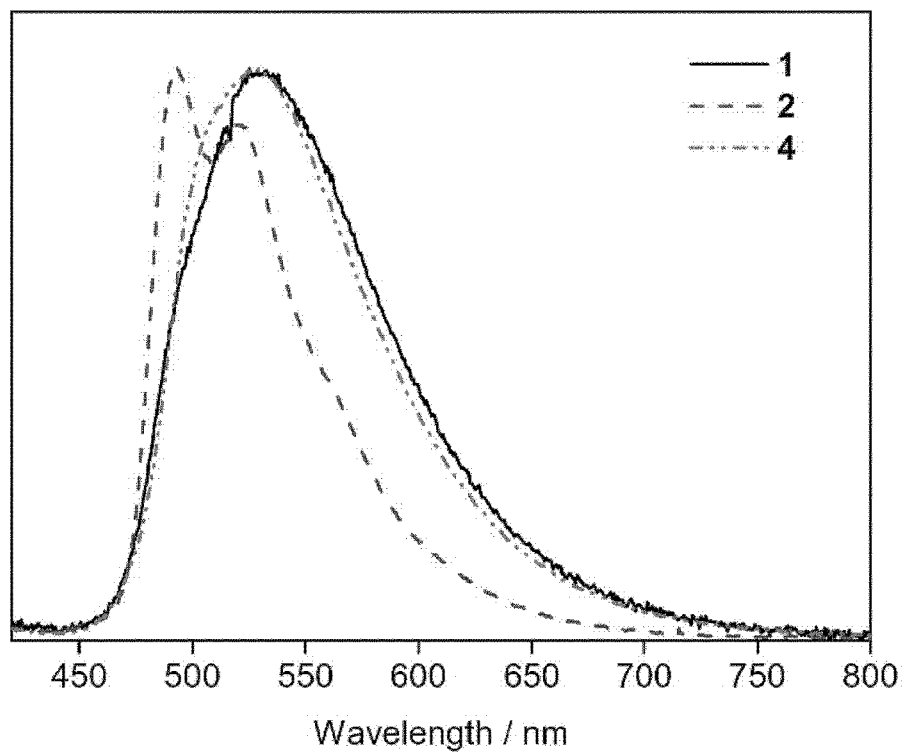

FIG. 10 presents a graphical representation of the normalized photoluminescence spectra of thin films of 5 wt % of the compounds of FIG. 2 doped into a mixed host containing 4,4',4"-tris(carbazol-9-yl)triphenylamine (TCTA) and 1,3-bis(carbazol-9-yl)benzene (MCP) (1:3 w/w) at 298 K, in accordance with one or more embodiments herein.

Figure 11:
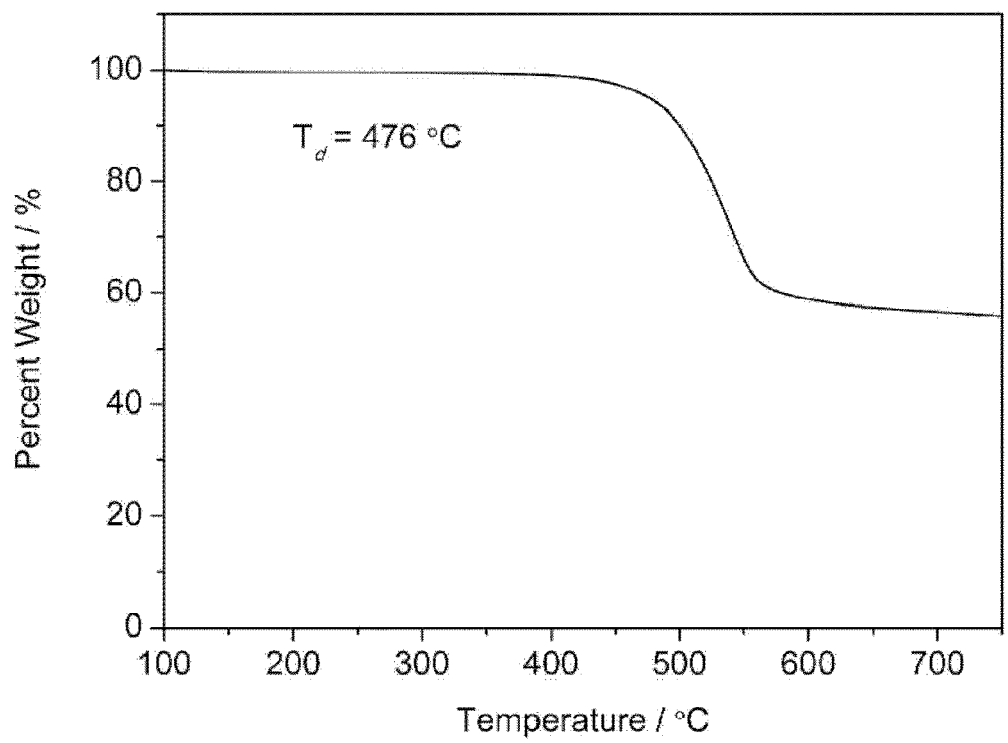

FIG. 11 presents a graphical representation of the thermogravimetric trace of compound 1, in accordance with one or more embodiments herein.

Figure 12:
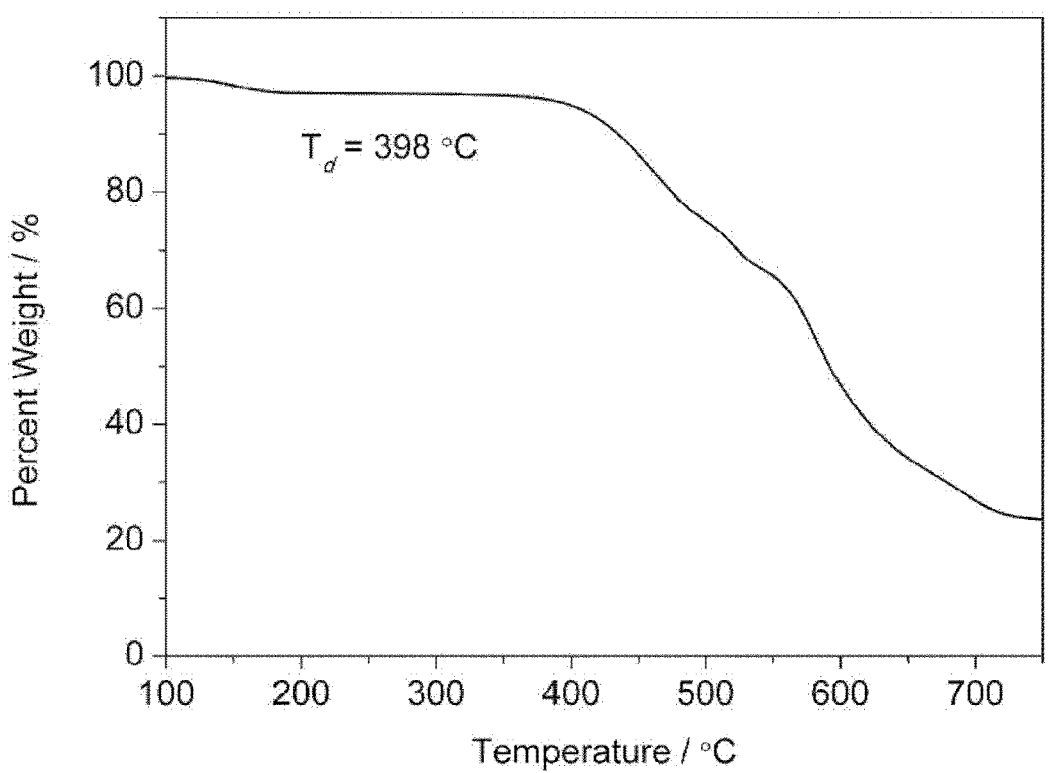

FIG. 12 presents a graphical representation of the thermogravimetric trace of compound 2, in accordance with one or more embodiments herein.

Figure 13:
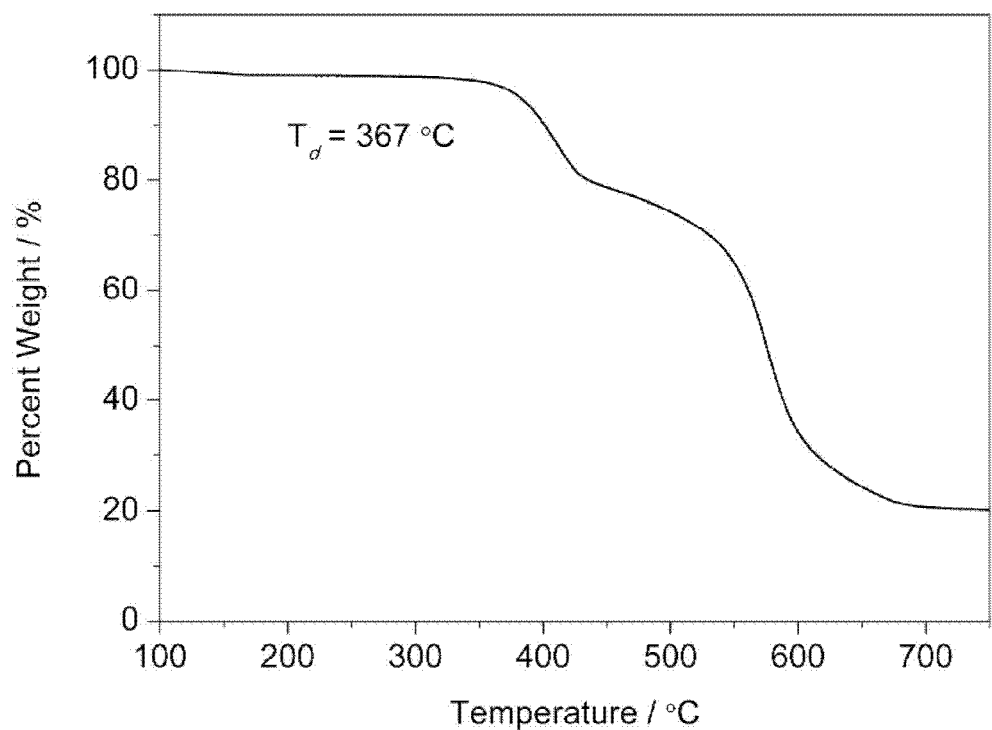

FIG. 13 presents a graphical representation of the thermogravimetric trace of compound 3, in accordance with one or more embodiments herein.

Figure 14:
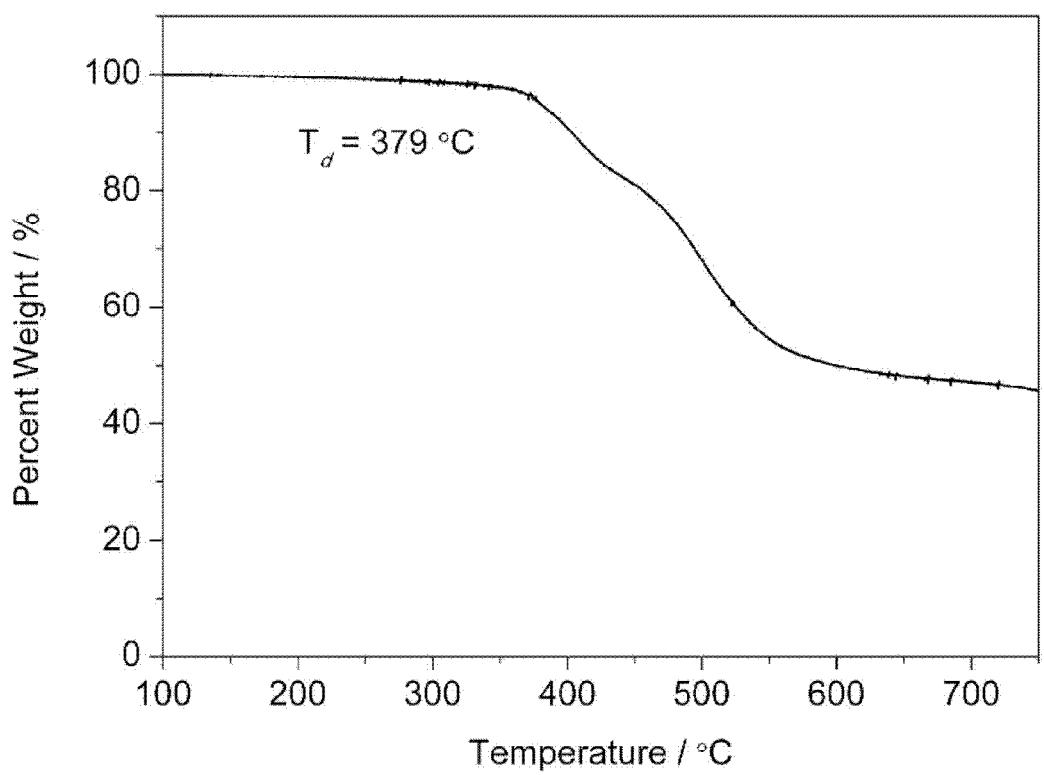

FIG. 14 presents a graphical representation of the thermogravimetric trace of compound 4, in accordance with one or more embodiments herein.

Figure 15:
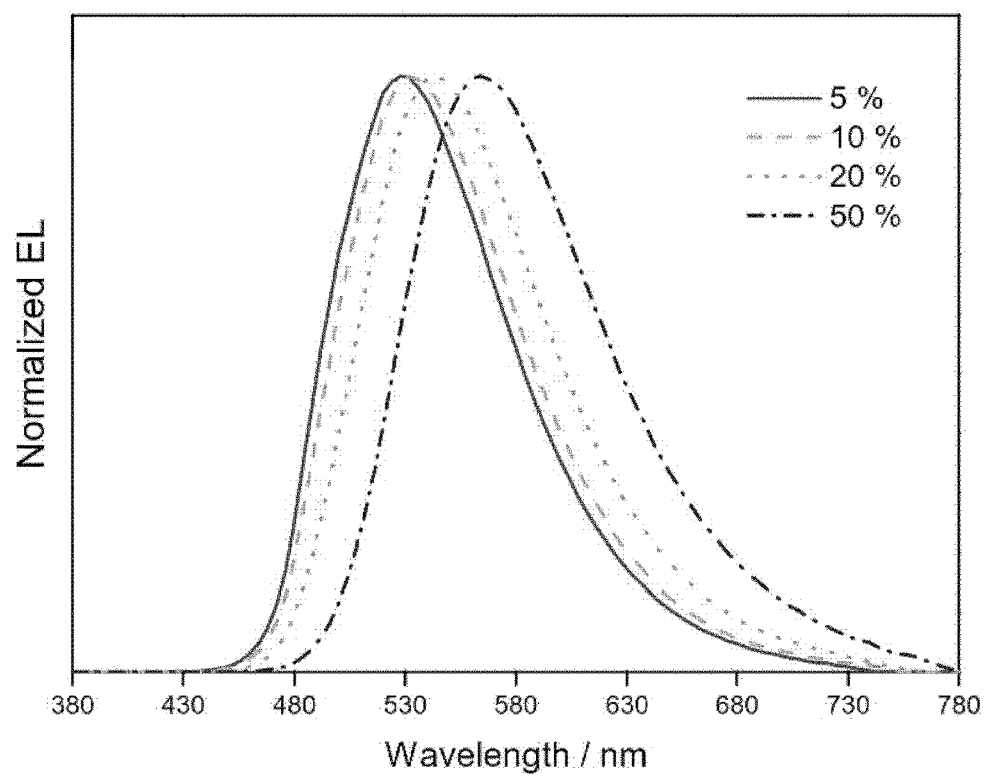

FIG. 15 presents a graphical representation of the normalized EL spectra of devices made from compound 1, in accordance with one or more embodiments herein, in which the compound 1 was doped into a mixed host consisting of TCTA and MCP at different concentrations.

Figure 16:
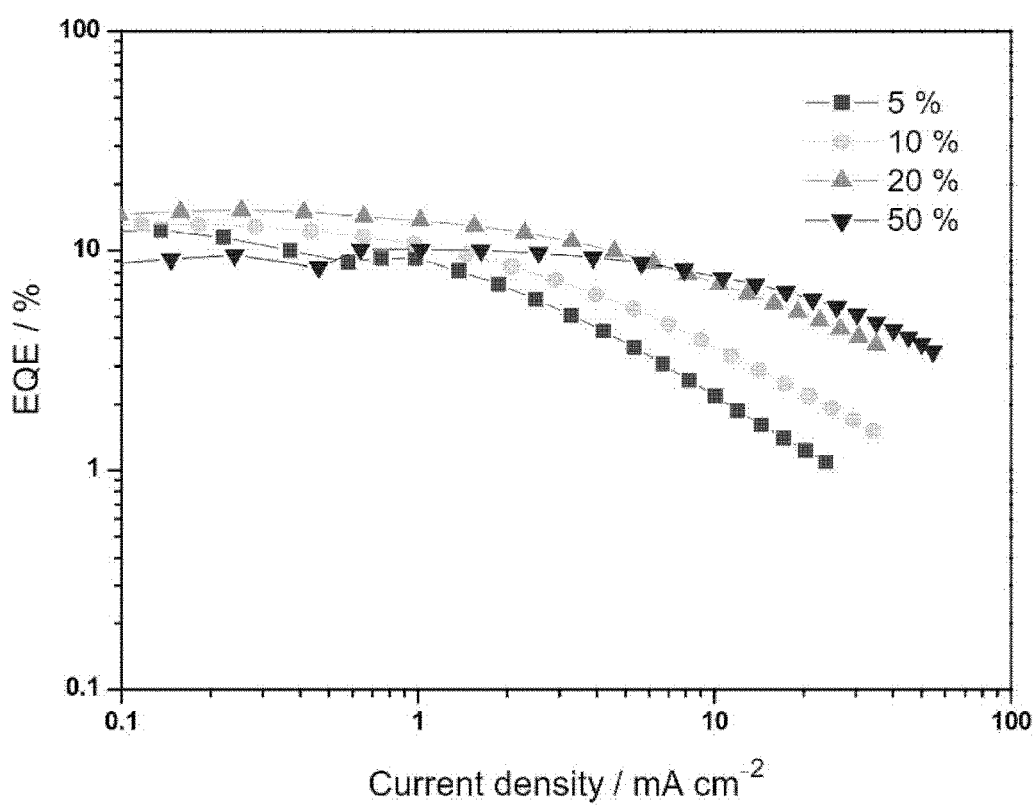

FIG. 16 presents a graphical representation of the EQEs of devices made from compound 1, in accordance with one or more embodiments herein, in which the compound 1 was doped into a mixed host consisting of TCTA and MCP at different concentrations.

Figure 17:
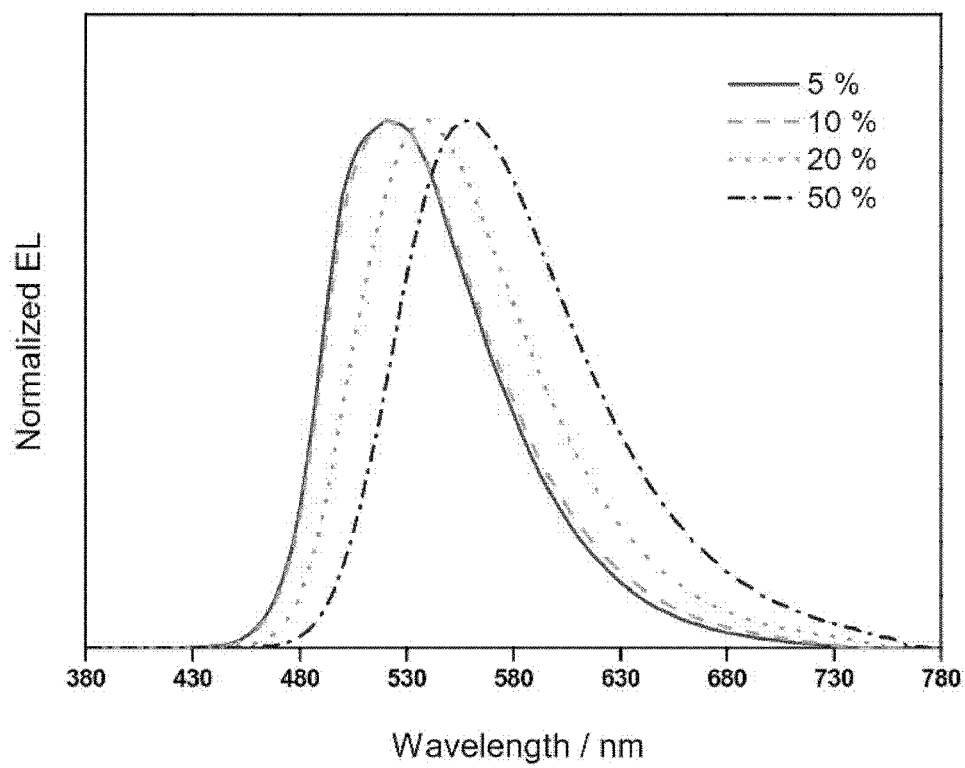

FIG. 17 presents a graphical representation of the normalized EL spectra of devices made from compound 4, in accordance with one or more embodiments herein, in which the compound 4 was doped into a mixed host consisting of TCTA and MCP at different concentrations.

Figure 18:
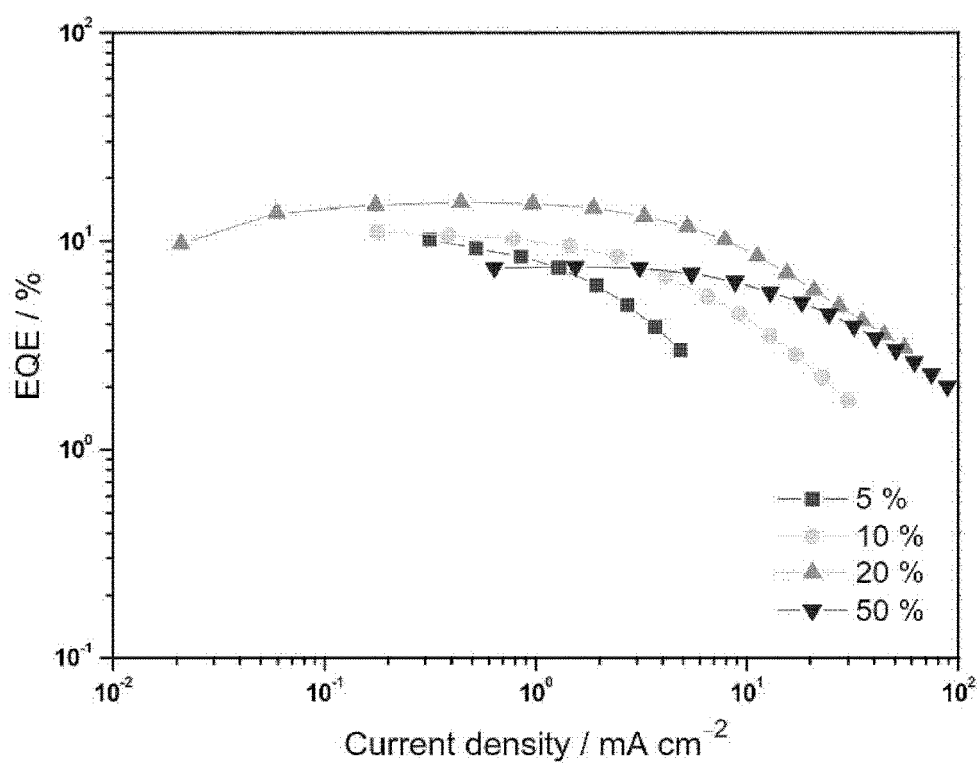

FIG. 18 presents a graphical representation of the EQEs of devices made from compound 4, in accordance with one or more embodiments herein, in which the compound 4 was doped into a mixed host consisting of TCTA and MCP at different concentrations.

Figure 19:
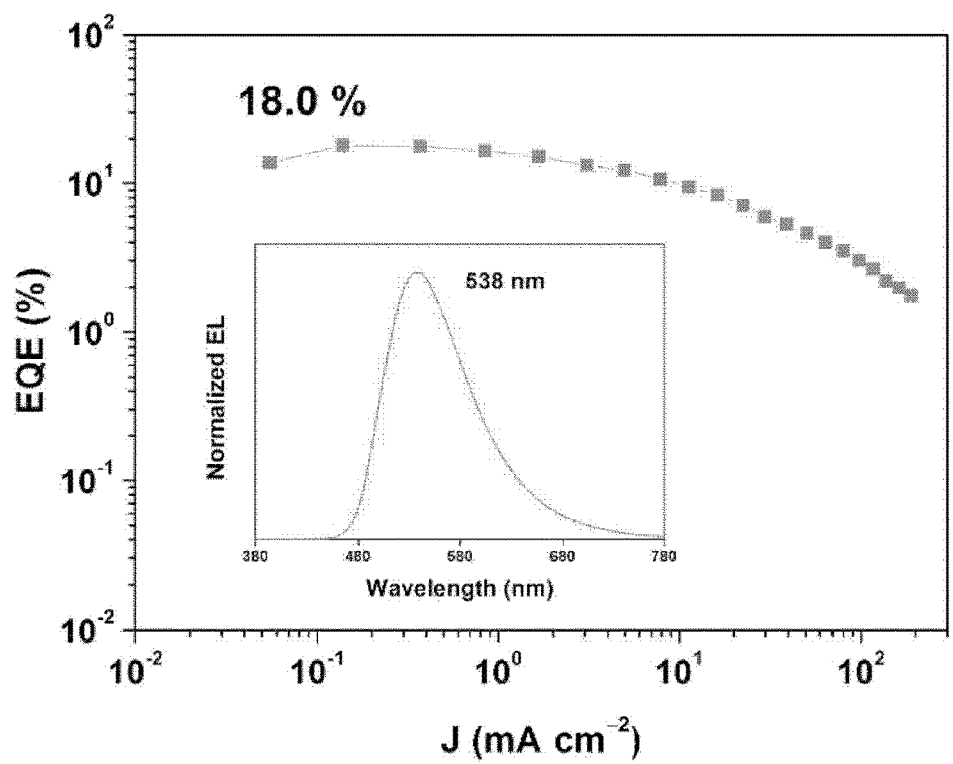

FIG. 19 presents a graphical representation of the EQE of the device made from 20 wt % compound 4, in accordance with one or more embodiments herein, in which the compound 4 was doped into a mixed host consisting of TCTA and MCP.

Figure 20:
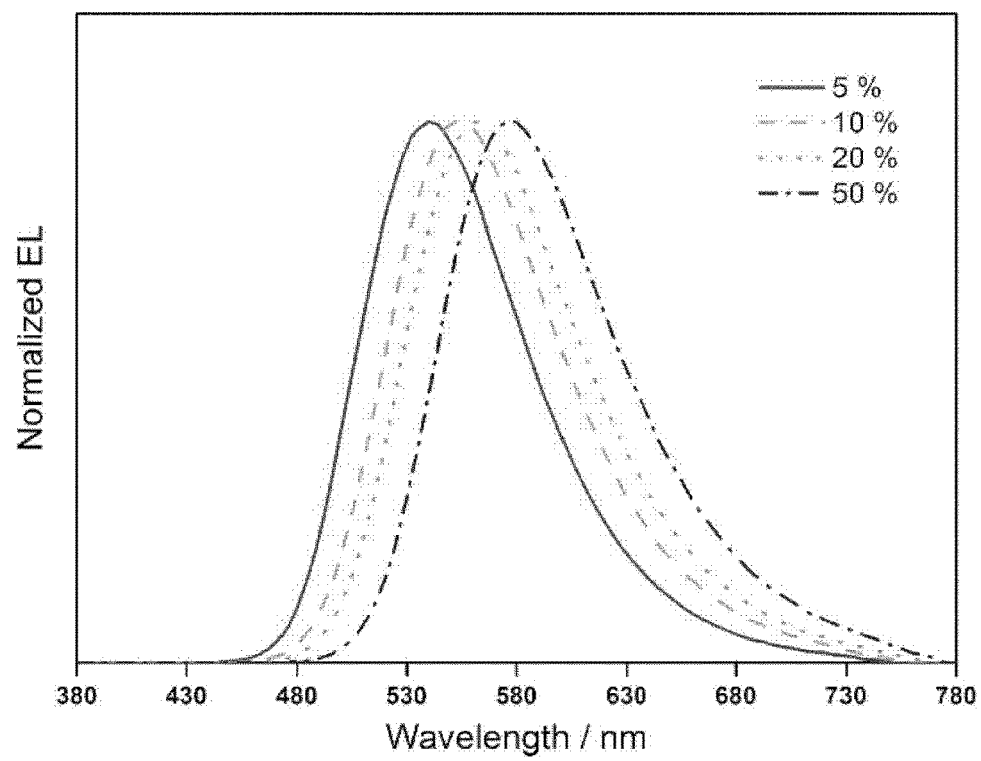

FIG. 20 presents a graphical representation of the normalized EL spectra of devices made from compound 5, in accordance with one or more embodiments herein, in which the compound 5 was doped into a mixed host consisting of TCTA and MCP at different concentrations.

Figure 21:
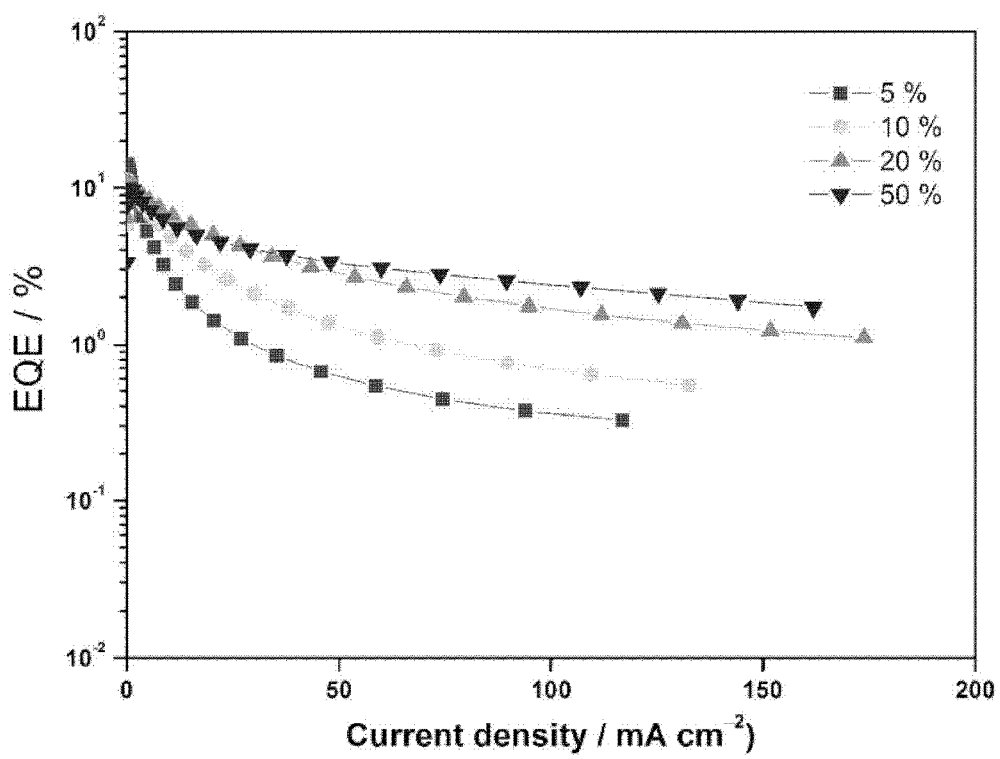

FIG. 21 presents a graphical representation of the EQEs of the device made from compound 5, in accordance with one or more embodiments herein, in which the compound 5 was doped into a mixed host consisting of TCTA and MCP at different concentrations.

Figure 22:
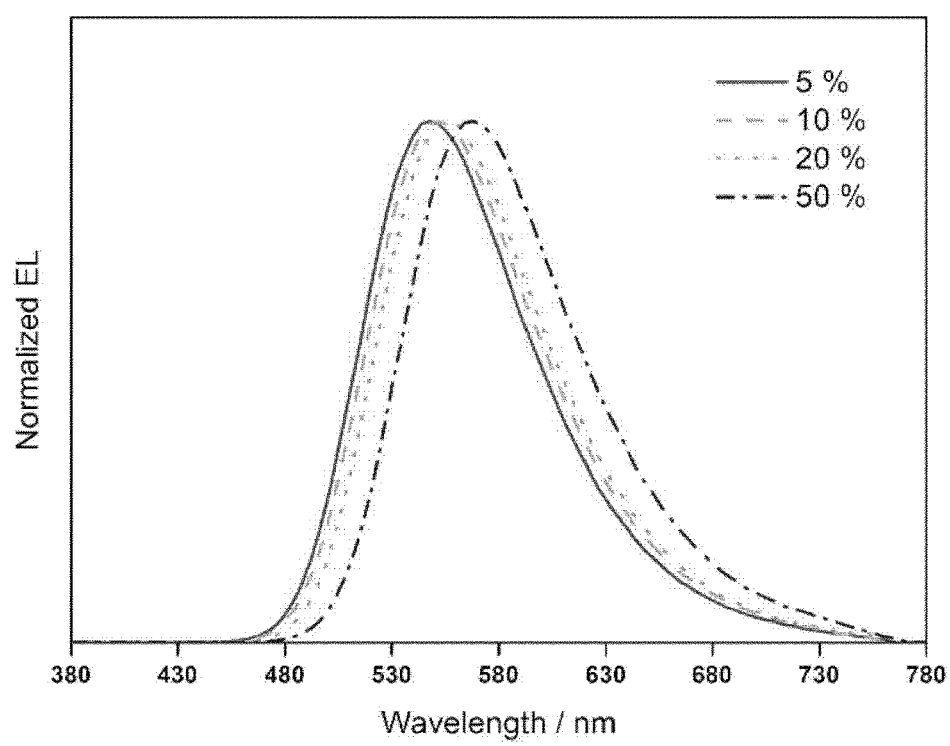

FIG. 22 presents a graphical representation of the normalized EL spectra of devices made from compound 6, in accordance with one or more embodiments herein, in which the compound 6 was doped into a mixed host consisting of TCTA and MCP at different concentrations.

Figure 23:
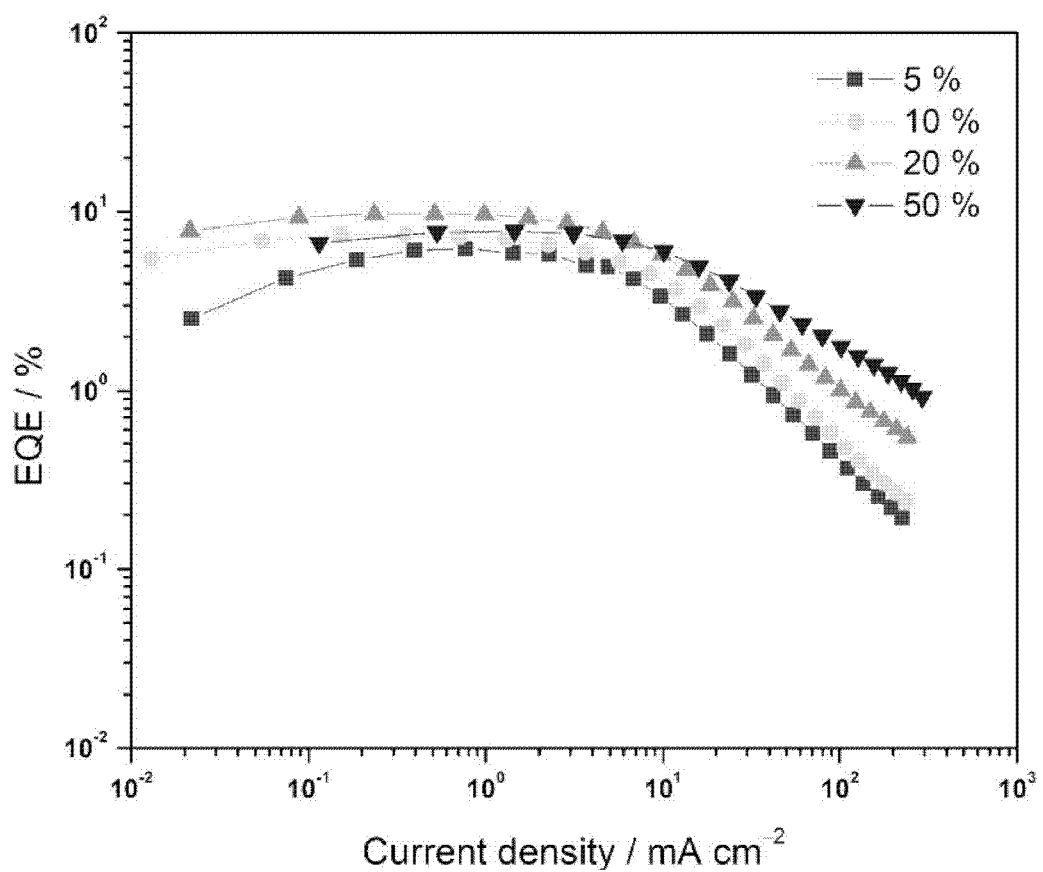

FIG. 23 presents a graphical representation of the EQEs of the device made from compound 6, in accordance with one or more embodiments herein, in which the compound 6 was doped into a mixed host consisting of TCTA and MCP at different concentrations.

4.1. DEFINITIONS

In the present disclosure the following terms are used.

The term "halo", "halogen" or "halide" as used herein includes fluorine, chlorine, bromine and iodine.

The term "pseudohalide" as used herein includes, but not limited to, cyanate, thiocyanate and cyanide.

The term "chalcogen" as used herein includes oxygen, sulfur, selenium and tellurium.

The term "pnictogen" as used herein includes nitrogen, phosphorus, arsenic and bismuth.

The term "alkyl" as used herein includes straight and branched chain alkyl groups, as well as cycloalkyl groups with alkyl groups having a cyclic structure. Preferred alkyl groups are those containing between one to eighteen carbon atoms and includes methyl, ethyl, propyl, isopropyl, butyl, isobutyl, tent-butyl, and other similar compounds. In addition, the alkyl group may be optionally substituted with one or more substituents selected from OR, $NR_2$, SR, C(O)R, C(O)OR, C(O)$NR_2$, CN, $CF_3$, $NO_2$, $SO_2$, SOR, $SO_3R$, halo and cyclic-amino, wherein R is independently alkyl, alkenyl, alkynyl, alkylaryl, aryl, or cycloalkyl.

The term "alkenyl" as used herein includes both straight and branched chain alkene radicals. Preferred alkenyl groups are those containing between two and eighteen carbon atoms. In addition, the alkenyl group may be optionally substituted with one or more substituents selected from OR, $NR_2$, SR, C(O)R, C(O)OR, C(O)$NR_2$, CN, $CF_3$, $NO_2$, $SO_2$, SOR, $SO_3R$, halo and cyclic-amino, wherein R is independently alkyl, alkenyl, alkynyl, alkylaryl, aryl, or cycloalkyl.

The term "alkynyl" as used herein includes both straight and branched chain alkyne radicals. Preferred alkynyl groups are those containing between two and eighteen carbon atoms. In addition, the alkynyl group may be optionally substituted with one or more substituents selected from OR, $NR_2$, SR, C(O)R, C(O)OR, C(O)$NR_2$, CN, $CF_3$, $NO_2$, $SO_2$, SOR, $SO_3R$, halo and cyclic-amino, wherein R is independently alkyl, alkenyl, alkynyl, alkylaryl, aryl, or cycloalkyl.

The term "arylalkynyl" as used herein includes an alkynyl group which has an aromatic group as a substituent. In addition, the arylalkynyl group may be optionally substituted with one or more substituents selected from OR, $NR_2$, SR, C(O)R, C(O)OR, C(O)$NR_2$, CN, $CF_3$, $NO_2$, $SO_2$, SOR, $SO_3R$, halo and cyclic-amino, wherein R is independently alkyl, alkenyl, alkynyl, alkylaryl, aryl, or cycloalkyl.

The term "aryl," alone or in combination, includes carbocyclic aromatic systems. The systems may contain one, two or three rings wherein each ring may be attached together in a pendant manner or may be fused. For example, the rings can be 5- or 6-membered rings.

The term "alkylaryl" as used herein includes an aryl group which has an alkyl group as a substituent. In addition, the alkylaryl group may be optionally substituted with one or more substituents selected from OR, $NR_2$, SR, C(O)R, C(O)OR, C(O)$NR_2$, CN, $CF_3$, $NO_2$, $SO_2$, SOR, $SO_3R$, halo and cyclic-amino, wherein R is independently alkyl, alkenyl, alkynyl, alkylaryl, aryl, or cycloalkyl.

The term "alkenylaryl" as used herein includes an aryl group which has an alkenyl group as a substituent. In addition, the alkenylaryl group may be optionally substituted with one or more substituents selected from OR, $NR_2$, SR, C(O)R, C(O)OR, C(O)$NR_2$, CN, $CF_3$, $NO_2$, $SO_2$, SOR, $SO_3R$, halo and cyclic-amino, wherein R is independently alkyl, alkenyl, alkynyl, alkylaryl, aryl, or cycloalkyl.

The term "arylalkenyl" as used herein includes an aryl group which has an alkenyl unit as the point of attachment to the gold(III) metal center. In addition, the arylalkenyl group may be optionally substituted with one or more substituents selected from OR, $NR_2$, SR, C(O)R, C(O)OR, C(O)$NR_2$, CN, $CF_3$, $NO_2$, $SO_2$, SOR, $SO_3R$, halo and cyclic-amino, wherein R is independently alkyl, alkenyl, alkynyl, alkylaryl, aryl, or cycloalkyl.

The term "heteroaryl," alone or in combination, includes heterocyclic aromatic systems. The systems may contain one, two or three rings wherein each ring may be attached together in a pendant manner or may be fused. For example, the rings can be 5- or 6-membered rings.

The terms "heterocyclic" and "heterocycle" refer to a 3 to 7-membered ring containing at least one heteroatom. This includes aromatic rings including, but not limited to, pyridine, thiophene, furan, pyrazole, imidazole, oxazole, isoxazole, thiazole, isothiazole, pyrrole, pyrazine, pyridazine, pyrimidine, benzimidazole, benzofuran, benzothiazole, indole, naphthalene, triazole, tetrazole, pyran, thiapyran, oxadiazole, triazine, tetrazine, carbazole, dibenzothiophene, dibenzofuran, fluorine, and non-aromatic rings including but not limited to piperazine, piperidine, and pyrrolidine. The groups of the present invention can be substituted or unsubstituted. Preferred substituents include but are not limited to alkyl, alkoxy, aryl.

The term "heteroatom" as used herein includes S, O, N, P, Se, Te, As, Sb, Bi, B, Si and Ge.

The term "substituted" refers to any level of substitution although mono-, di- and tri-substitutions are preferred. For example, substituents include hydrogen, halogen, aryl, alkyl and heteroaryl. As used herein, the following can be substituted or unsubstituted: benzene, pyridine, thiophene, furan, pyrazole, imidazole, oxazole, isoxazole, thiazole, isothiazole, pyrrole, pyrazine, pyridazine, pyrimidine, benzimidazole, benzofuran, benzothiazole, indole, naphthalene, triazole, tetrazole, pyran, thiapyran, oxadiazole, triazine, tetrazine, carbazole, dibenzothiophene, dibenzofuran, piperazine, piperidine, and pyrrolidine.

The term "cyclometalating ligand" includes, but is not limited to, 2,6-diphenylpyridine (C^N^C), 2,6-bis(4-tert-butylphenyl)pyridine ('BuC^N^'Bu), 2,6-diphenyl-4-(2,5-difluorophenyl)pyridine (2,5-$F_2$—$C_6H_3$—C^N^C), 2,6-diphenyl-4-p-tolylpyridine (C^NTol^C), 2,6-diphenyl-4-phenylpyridine (C^NPh^C), 2,6-bis(4-fluorophenyl)pyridine (FC^N^CF), 2,6-diphenyl-4-(4-isopropylphenyl)pyridine (4-'Pr-Ph-C^N^C), 2,6-diphenyl-4-(4-nitrophenyl)pyridine (4-$NO_2$-Ph-C^N^C), 2,6-diphenyl-4-(4-methoxyphenyl)pyridine (4-OMe-Ph-C^N^C), 2,6-diphenyl-4-(4-methylyphenyl)pyridine (4-Me-Ph-C^N^C)2,6-diphenyl-4-(4-ethylphenyl)-pyridine (4-Et-Ph-C^N^C), 2,6-diphenyl-4-(2,3,4-trimethoxyphenyl)pyridine (2,3,4-OMe$_3$-Ph-C^N^C), 2,6-bis(4-methoxyphenyl)-4-(4-nitrophenyl)pyridine (4-NO$_2$-Ph-MeOC^N^COMe), 2,6-bis(2,4-dichlorophenyl)-4-(4-isopropylphenyl)-pyridine (4-$^i$Pr-Ph-C^N^CC$_{12}$), 2,6-diphenyl-4-(4-tosylphenyl)pyridine (4-OTs-Ph-C^N^C), 2,6-diphenyl-4-(4-dimethylaminophenyl)pyridine (4-NMe$_2$-Ph-C^N^C), 2,6-diphenyl-4-(4-diphenylaminophenyl)pyridine (4-NPh$_2$-Ph-C^N^C), 2,6-diphenyl-4-(4-bromophenyl)pyridine (4-Br-Ph-C^N^C), 2,6-diphenyl-4-(4-chlorophenyl)pyridine (4-Cl-Ph-C^N^C), 2,6-diphenyl-4-(4-flurophenyl)pyridine (4-F-Ph-C^N^C), 2,6-diphenyl-4-(4-iodophenyl)pyridine (4-I-Ph-C^N^C), 2,6-diphenyl-4-(2,5-dimethylphenyl)pyridine (2,5-Me$_2$-Ph-C^N^C), 2,6-diphenyl-4-(2,3,4,5,6-pentafluorophenyl)pyridine (2,3,4,5,6-F$_5$-Ph-C^N^C), and 1,3-diphenylisoquinoline (dpiq).

5. DETAILED DESCRIPTION

The present disclosure describes gold compounds for use as emitters in OLEDs, and more particularly it describes a novel class of gold(III) compounds with group 15 element-containing tridentate ligand and the syntheses of these compounds. The gold(III) compounds are coordination compounds that contain one strong σ-donating group and one cyclometalating tridentate ligand, both coordinated to a gold(III) metal center. Other embodiments are directed to OLEDs based on this class of luminescent gold(III) complexes and methods related thereto. These novel luminescent gold(III) compounds contain aryl- or aryl-substituted group 15 moiety attached on the cyclometalating tridentate ligand and one strong σ-donating group, both coordinated to a gold(III) metal center. These solution-processable compounds can be used as light-emitting materials for PHOLEDs.

The luminescent gold(III) compounds of the present invention exhibit high photoluminescence quantum yield of up to 65% in solid-state thin films, and have been demonstrated to serve as phosphorescent dopants in the fabrication of solution-processable OLEDs. The gold(III) compounds disclosed herein, when implemented in a high performance solution-processable OLED, produce superior EL with high current efficiencies of up to 57.8 cd A$^{-1}$ and high EQEs of up to 18.0%. More importantly, a small efficiency roll-off of ~7% is obtained for the optimized device at high brightness of 1000 cd m$^{-2}$. This EQE value improves upon the values reported by other solution-processable OLEDs based on gold(III) complexes. The compounds disclosed herein produce results that are comparable to the state-of-the-art solution-processable OLEDs based on iridium(III) complexes and thermally activated delayed fluorescence (TADF) materials. In this way, the present invention provides new classes of solution-processable phosphors for the OLED display and solid-state lighting industries that can be fabricated by using low-cost and high efficiency solution-processing techniques to obtain phosphorescence-based OLEDs.

The novel class of gold(III) compounds described herein further shows either strong photoluminescence via a triplet excited state upon photo-excitation, or EL via a triplet exciton upon applying a DC voltage. According to one or more embodiments herein, these gold(III) compounds are highly soluble in common organic solvents such as dichloromethane, chloroform and toluene. Alternatively, the compounds can be doped into a host matrix for thin film deposition by spin-coating or ink-jet printing or other known fabrication methods. In one or more embodiments, the compounds can be used for the fabrication of OLEDs as phosphorescent emitters or dopants to generate EL.

While the gold(III) compounds described herein are described with use in OLEDs, the compounds have additional applications as would be understood to those who are skilled in the art. The gold(III) compounds described herein have strong light-emitting and light absorption properties that make them suitable for inclusion into common apparatuses for which light emission or absorption are desired. For example, the gold(III) compounds may be used as, but are not limited to, the backlighting of flat panel displays of wall-mounted televisions, copiers, printers, liquid crystal displays, measuring instruments, display boards, marker lamps, electrophotographic photoreceptors, photoelectric transducers, solar cells and image sensors.

With reference now to FIG. 1, the gold(III) compounds as in one or more embodiments herein can be fashioned into an OLED structure 100. The OLED structure 100 includes a cathode 110, an electron transport layer 120 ("ETL"), a light-emitting layer 130 (or "emissive layer"), a hole-transporting layer 140 ("HTL"), an anode 150, and a substrate 160. The light-emitting layer 130 includes a luminescent gold(III) compound as described herein. Although not shown in FIG. 1, in one or more embodiments OLED 100 further includes a hole blocking layer and/or a carrier confinement layer to improve the device performance. Device structures with modifications to include various carrier blocking layers, carrier injection layers and interlayers can also be used to improve the device performance.

The cathode 110 and anode 150 are a pair of electrodes sandwiching these plurality of semiconductor layers that cause EL when voltage is applied to the OLED 100. The cathode 110 acts as a transmissive electron injector that injects electrons into the organic emissive layer 130 when the cathode is negatively biased. The cathode comprises a thin fluoride layer (which may be omitted) and a metal or metal alloy, preferably having a work function of less than 4 eV. The cathode 110 may be made of suitable materials such as, for example, Mg:Ag, Ca, Li:Al, Al, or Ba. The anode 150 injects holes into the emissive layer when the anode is positively biased. The anode 150 is composed of a conductive and optionally transmissive layer. In one or more embodiments, viewing the emissive layer 130 through the substrate 160 is desirable, and the anode is transparent. In other embodiments, the emissive layer 130 is viewed through the top electrode and the transmissive characteristics of anode 150 are immaterial, and therefore any appropriate materials including metals or metal compounds having a work function of greater than 4.1 eV may be used. For example, appropriate metals include silver, gold, iridium, nickel, molybdenum, palladium, and platinum. In one or more embodiments, the anode 150 is transmissive, and suitable materials are metal oxides, including ITO, aluminum- or indium-doped zinc oxide, tin oxide, magnesium-indium oxide, nickel-tungsten oxide, and cadmium-tin oxide. The preferred metals and metal oxides can be deposited by evaporation, sputtering, laser ablation, and chemical vapor deposition. The cathode 110 and anode 150 can have thicknesses between 100-200 nm.

In one or more embodiments, the anode 150 layer is positioned on top of a substrate 160. The substrate 160 is electrically insulated and is used to emit the light created by the OLED 100, in which it is typically made of transparent material. For example, the substrate 160 can be made of glass, plastic foil, or a transparent polymer. In one or more alternative embodiments, the substrate is opaque and comprises one or more semiconducting materials or ceramics. In one embodiment of the invention, the emissive layer 130 is viewed through the substrate 160, or through both sides of the device, and substrate comprises a transparent glass substrate or a plastic foil. In other embodiments, the emissive layer 130 is viewed only through the top electrode, and substrate 160 comprises an opaque semiconductor or ceramic wafers.

The ETL 120 provides high electron affinity and high electron mobility to the OLED 100 for electrons to flow across the various OLED layers. To do this, the electron-transporting layer 120 includes materials or mixtures of materials having a high ionization potential and wide optical band gap. In one or more embodiments, the ETL 120 has a thickness between 30-80 nm. In one or more embodiments, additional electron-transporting materials are added to ETL 120 to facilitate electron injection. The materials for the ETL 120 are selected to maximize OLED efficiency. As some non-limiting examples, suitable electron-transporting materials include but not limited to 1,3,5-tris(phenyl-2-benzimidazolyl)-benzene (TPBI), 1,3,5-tri[(3-pyridyl)-phen-3-yl] benzene (TmPyPB), bathocuproine (BCP), bathophenanthroline (BPhen) and bis(2-methyl-8-quinolinolate)-4-(phenylphenolate)aluminum (BAlq), tris-[2,4,6-trimethyl-3-(pyridin-3-yl)phenyl]borane (3TPYMB), and 1,3-bis[3,5-di(pyridin-3-yl)phenyl]benzene (BmPyPhB). In one embodiment, the electron-transporting layer 120 is prepared as an organic film by thermal evaporation, spin-coating, ink-jet printing from a solution, or other known fabrication methods.

Light-emitting layer or emissive layer 130 in FIG. 1 is formed by doping the phosphorescent gold(III) metal complex as a dopant into a host material. Suitable host materials should be selected so that the triplet excitons can be transferred efficiently from the host material to the phosphorescent dopant material. Suitable host materials include, but not limited to, certain aryl amines, triazoles and carbazole compounds. Examples of desirable hosts are but not limited to 4,4'-bis(carbazol-9-yl)biphenyl (CBP), MCP, TCTA, 3-(4-biphenylyl)-4-phenyl-5-tert-butylphenyl-1,2,butylphenyl-1,2,4-triazole (TAZ), p-bis(triphenylsilyl)benzene (UGH2), and poly-(N-vinylcarbazole) (PVK). In certain embodiments, any one of the compounds 1 to 48 can be doped into a mixed host consisting of non-limiting examples of CBP, MCP, TCTA, TAZ, UGH2, PVK or a combination thereof.

In general, the emissive layer 130 is sandwiched between the hole-transporting layer 140 and the electron-transporting layer 120. To ensure an efficient exothermic energy transfer between the host material and the dopant material, the triplet energy of the host material must be larger than that of the dopant material. In addition, both the ionization potential and the electron affinity of the host material should be larger than those of the dopant material in order to achieve efficient Förster energy transfer from the host to the dopant. In order to confine triplet excitons within the emissive layer, the triplet energy of the hole-transporting material and electron-transporting material should be larger than that of the dopant material.

The HTL 140 is layered on top of the anode 150 and plays a role in the adjustment of electron/hole injection to attain transport balance of charge carriers in the emissive layer 130 of the OLED 100. In one or more embodiments, the HTL 140 has a thickness between 30-80 nm. The materials for the HTL 140 are selected to maximize OLED efficiency. As some non-limiting examples, the HTL 140 can include, but not limited to, polycyclic aromatic compounds, for example, 4,4'-bis[N-(1-naphthyl)-N-phenylamino]biphenyl (NPB), 4,4'-bis[N-(3-methylphenyl)-N-phenylamino]biphenyl (TPD), 4,4',4"-tris[(3-methylphenyl)phenylamino]triphenylamine (MTDATA), and di-[4-(N,N-ditolyl-amino)phenyl]cyclohexane (TAPC). In addition, polymeric hole-transporting materials can be used including PVK, polythiophene, polypyrrole, polyaniline, and copolymers including poly(3,4-ethylenedioxythiophene):poly(styrenesulfonate) (PEDOT:PSS).

With reference to FIGS. 2-7, the basic chemical structure of the luminescent gold(III) compounds is exemplified in compounds 4 to 48.

In some embodiments of the invention, the luminescent gold(III) compounds of general structures (I) are prepared in high purity. The compounds described have been represented throughout by their monomeric structure. As is well known to those skilled in the art, the compounds may also be present as dimers, trimers or dendrimers. The luminescent gold(III) compounds can be used to form thin films by spin-coating, ink-jet printing or other known fabrication methods and be applied in OLEDs.

More broadly, these luminescent gold(III) compounds have the chemical structure shown in generic formula (I) below,

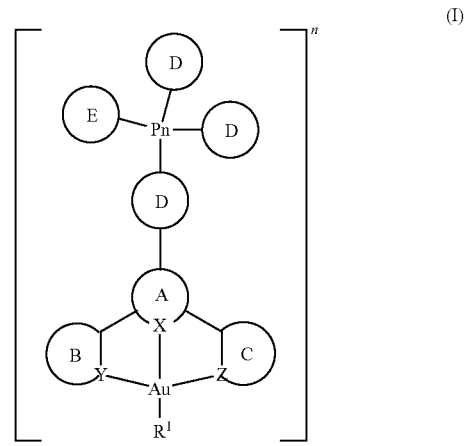

in which:

X is nitrogen or carbon;

Y and Z are nitrogen or carbon;

A is cyclic structure derivative of phenyl group or heterocyclic group;

B and C are cyclic structure derivatives of phenyl groups or heterocyclic groups;

D is any alkyl, cyclic aliphatic or aromatic structures, in which each D group can be identical or non-identical;

Pn is pnictogen selected from nitrogen, phosphorus, arsenic and bismuth;

E can be any chalcogen selected from oxygen, sulphur, selenium, tellurium, being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn;

$R^1$ is any carbon or heteroatom donor ligand, halide or pseudohalide, which could be either monoanionic or neutral. $R^1$ is selected from, but not limited to, alkyl, substituted alkyl, aryl, substituted aryl, heteroaryl, substituted heteroaryl, heterocyclic aryl, substituted heterocyclic aryl, alkynyl, substituted alkynyl, alkoxy, amide, thiolate, phosphide, chloride, bromide, iodide, cyanate, thiocyanate or cyanide; and n is zero, a positive integer or a negative integer.

In gold(III) compound with generic formula (I), rings A, B and C are independently benzene, phenyl derivatives, heterocycle or heterocyclic derivatives, but are not limited to, with one or more alkyl, alkenyl, alkynyl, aryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or heterocyclic group, wherein R is independently alkyl, alkenyl, alkynyl, alkyaryl, aryl, or cycloalkyl.

In one or more embodiments, D is selected from, but is not limited to, alkyl, heteroatom-containing alkyl, aryl, substituted aryl, heteroaryl, substituted heteroaryl, arylalkenyl and substituted arylalkenyl. In one or more embodiments, E is selected from, but is not limited to, chalcogen being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn.

In certain embodiments, the gold(III) compound has the structure:

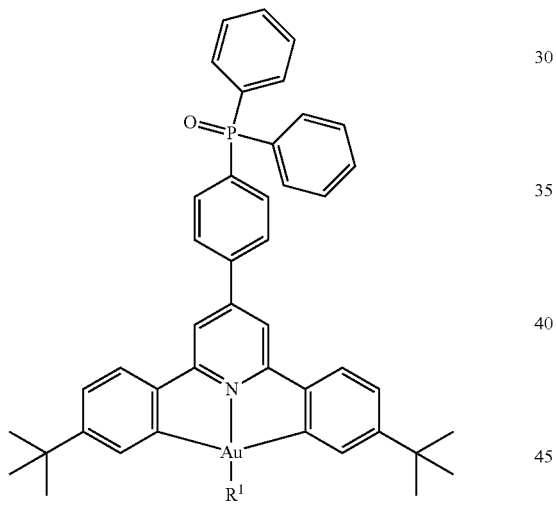

wherein $R^1$ is triphenylamine, 4-(tert-butyl)phenyl, or $R^1$ is any one of the following structures:

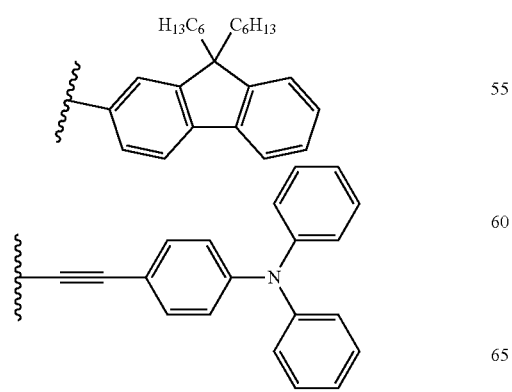

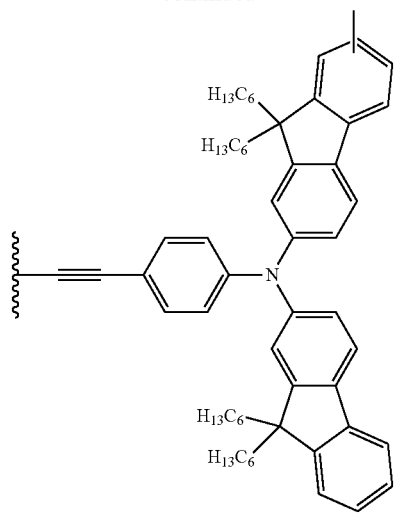

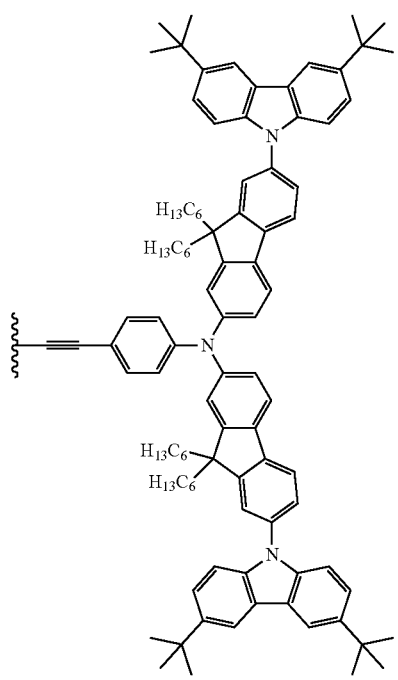

In certain embodiments, the gold(III) compound has one of the following structures:

Compound 7
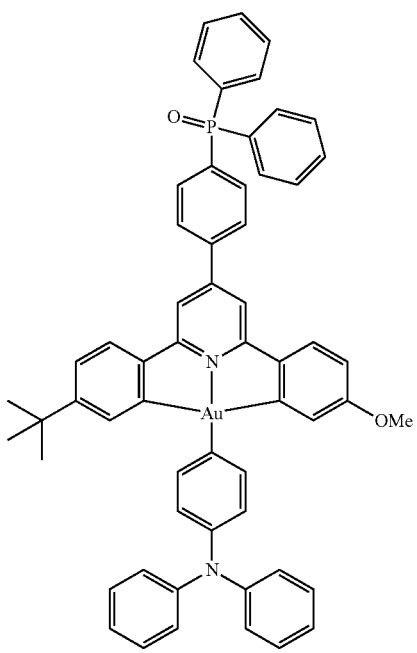
Compound 8
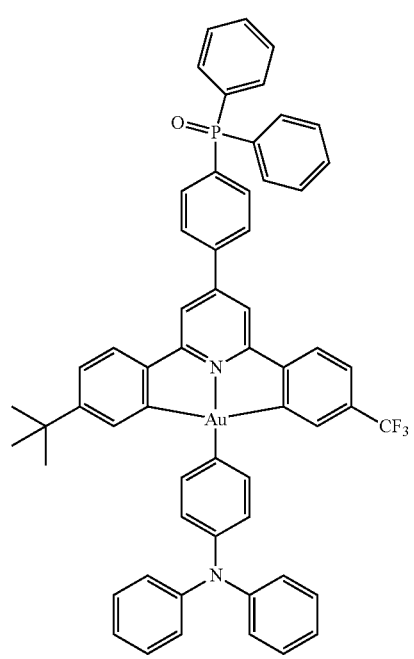
Compound 9
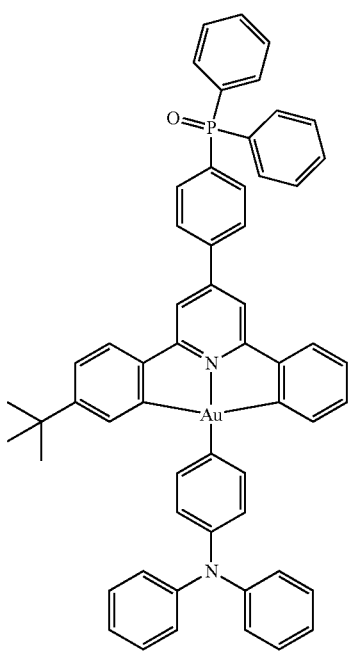
Compound 10
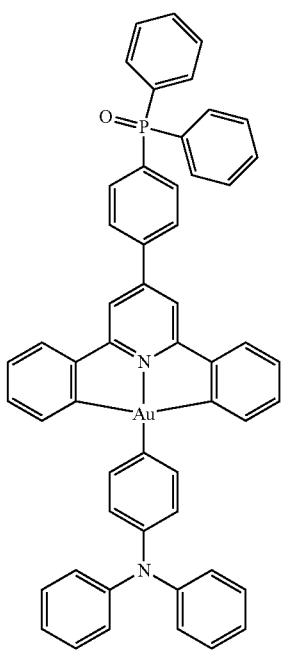

Compound 11
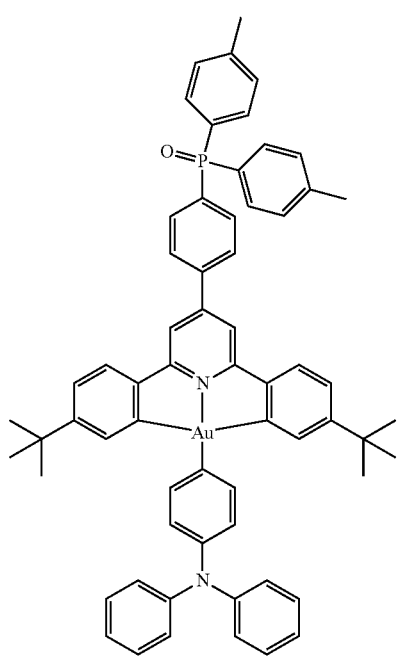
Compound 12
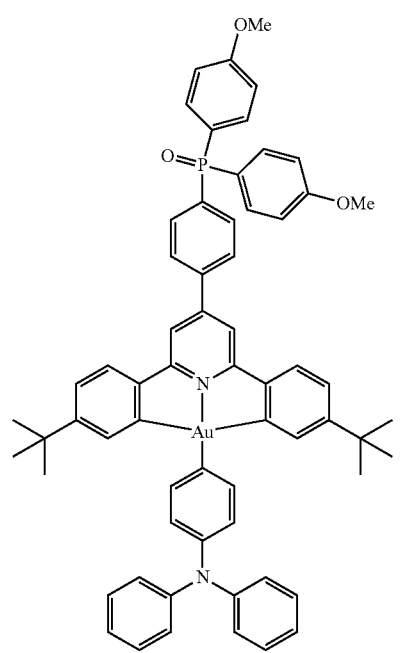
Compound 13
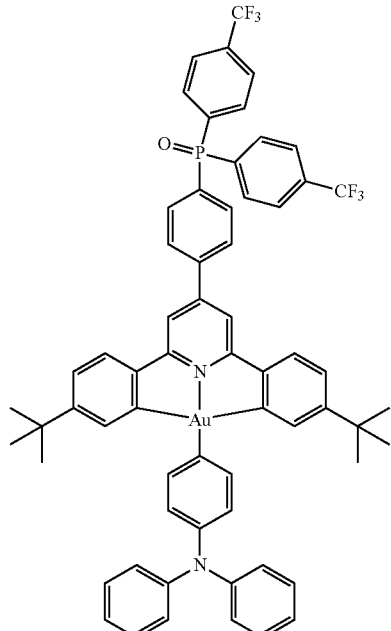
Compound 14
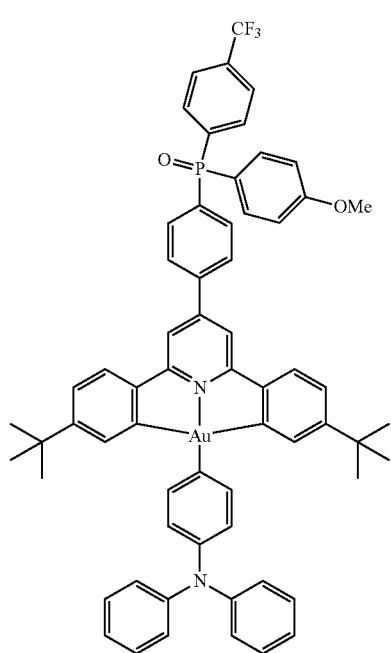

Compound 15
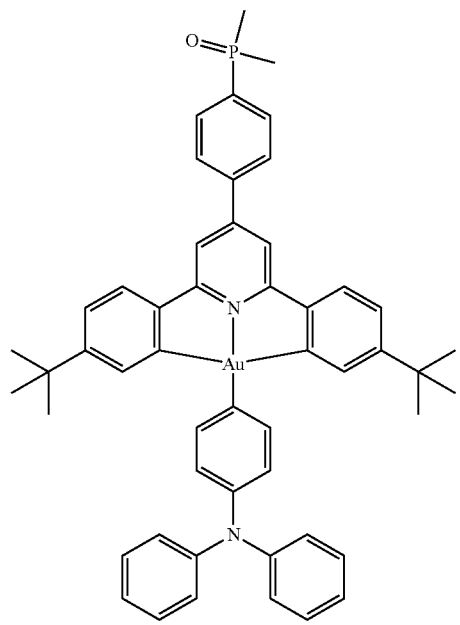
Compound 17
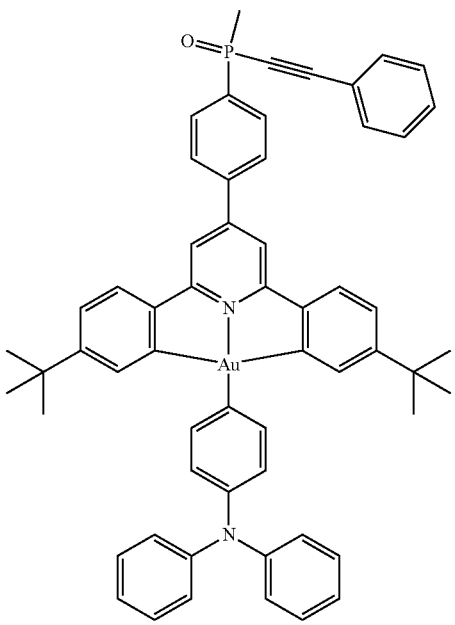
Compound 16
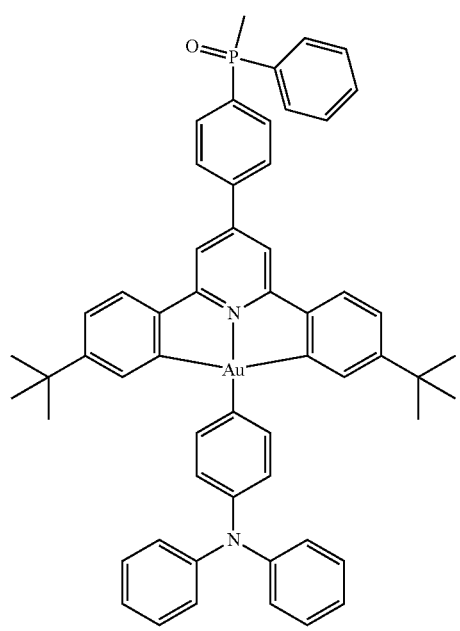
Compound 18
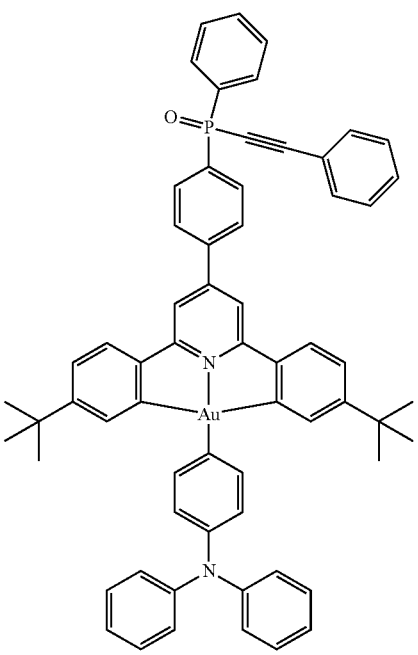

Compound 19
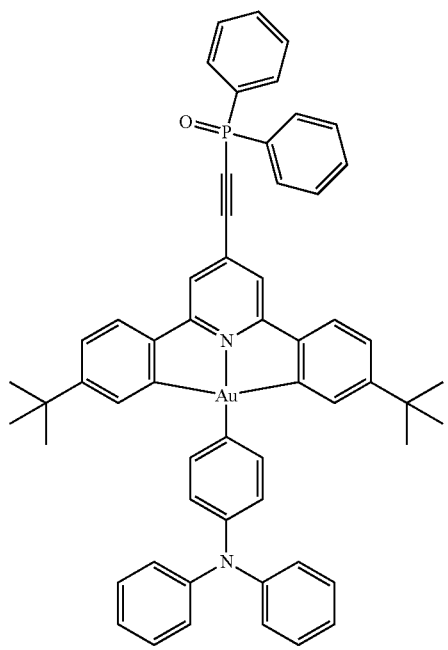
Compound 20
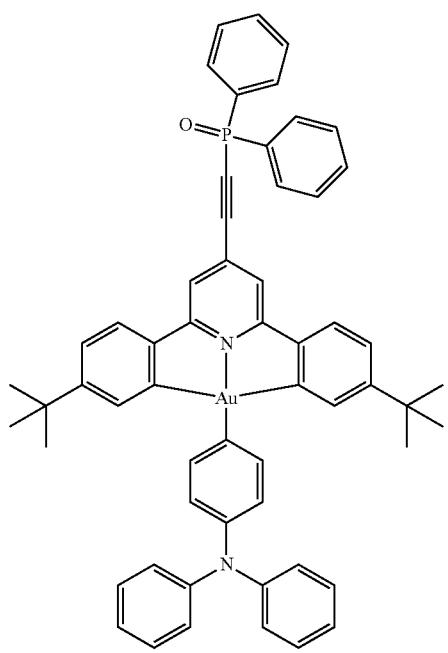
Compound 21
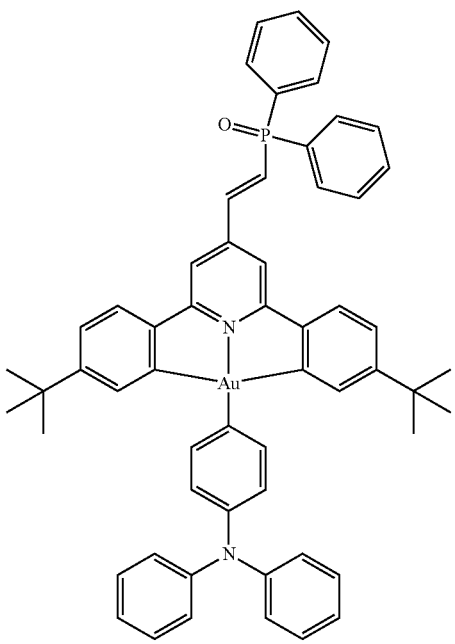
Compound 22
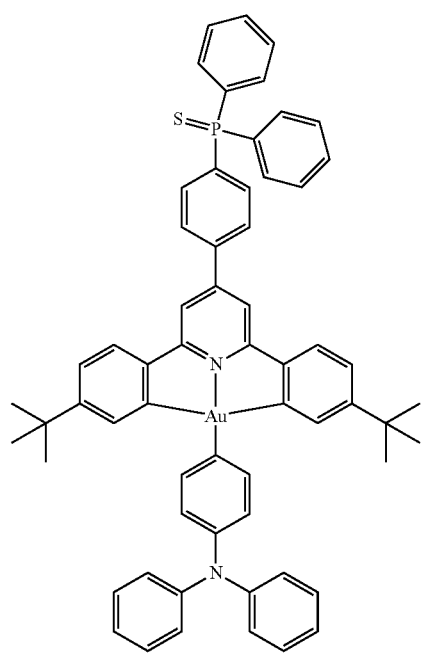

Compound 23
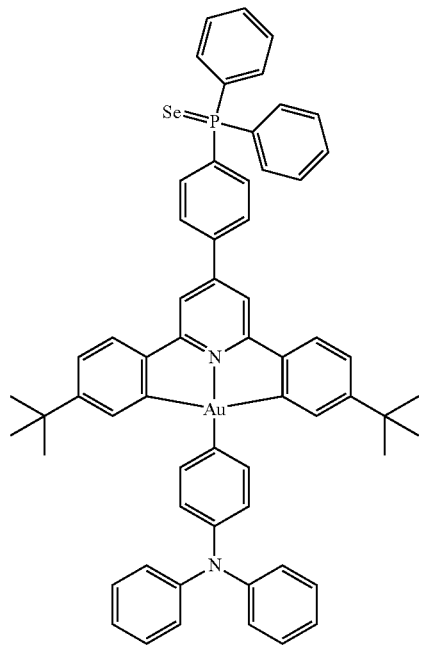
Compound 24
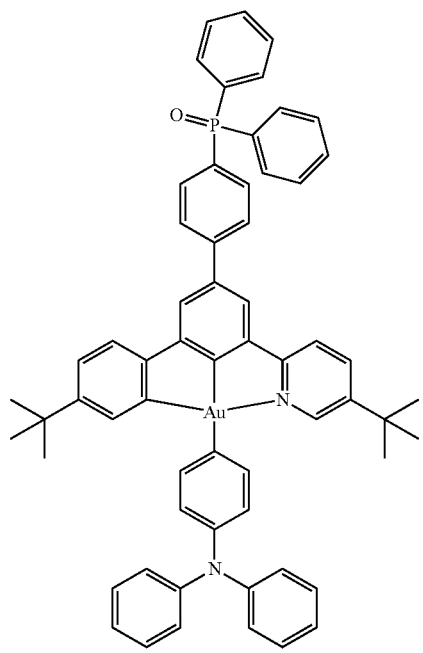
Compound 25
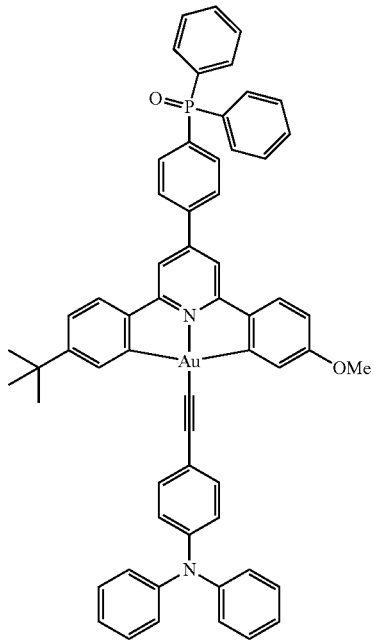
Compound 26
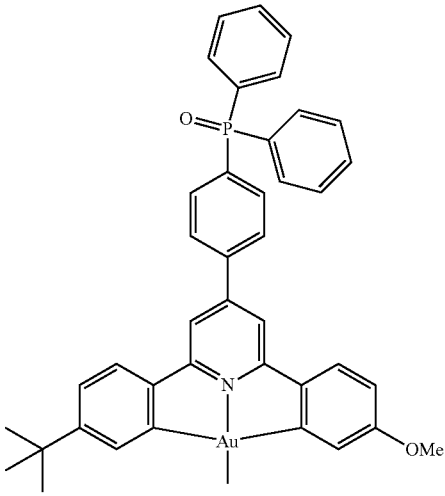

Compound 27
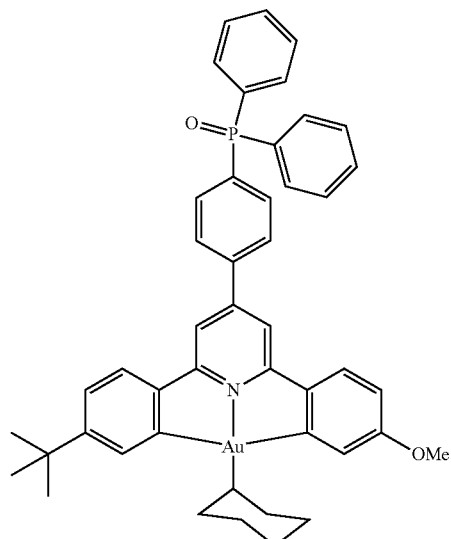
Compound 28
Compound 29
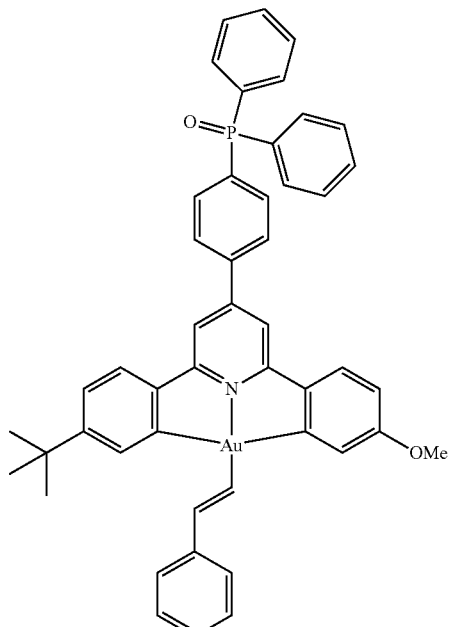
Compound 30
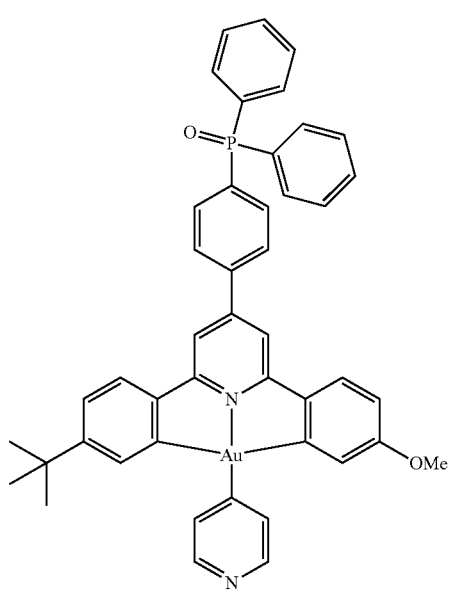

Compound 31
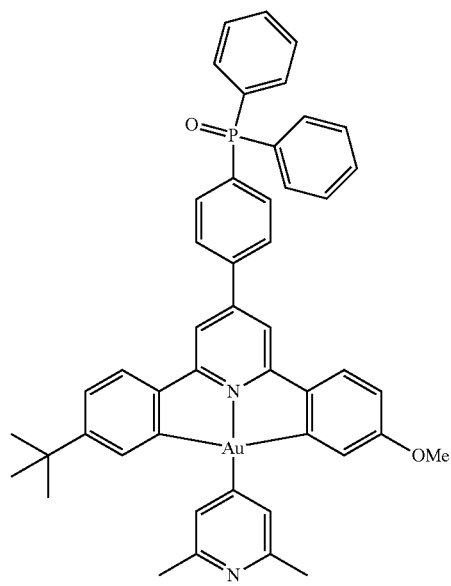
Compound 33
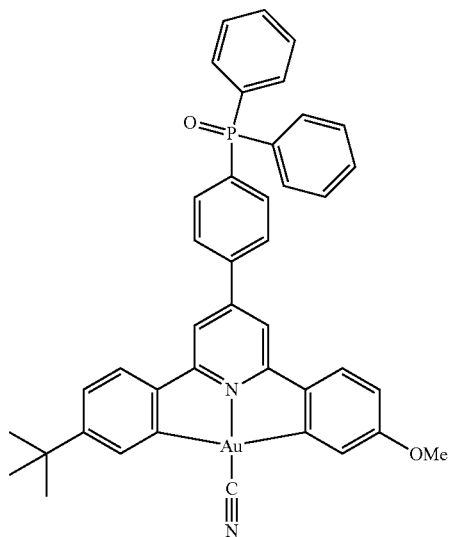
Compound 32
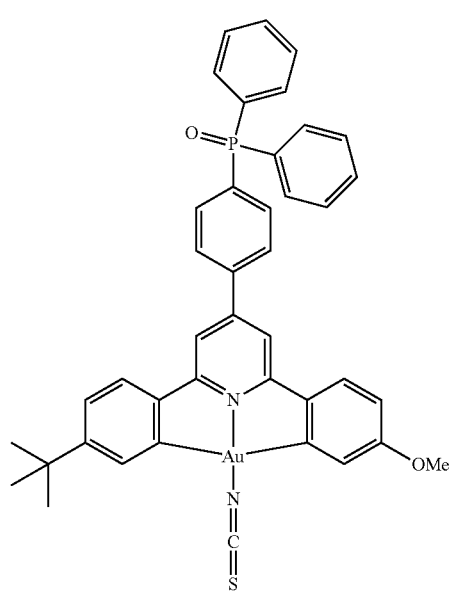
Compound 34
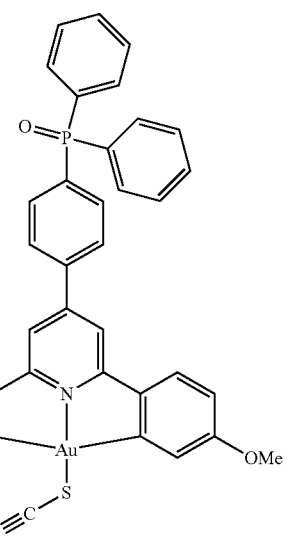

Compound 35
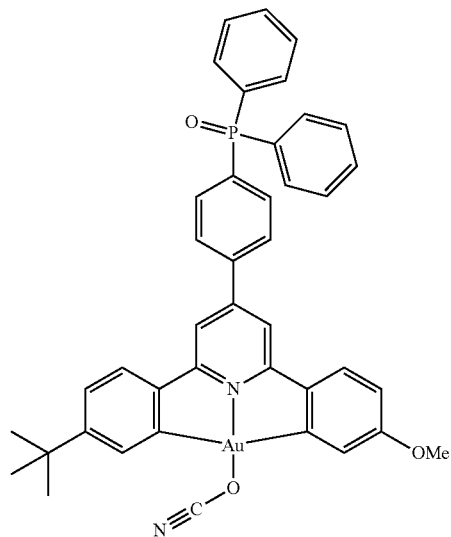
Compound 36
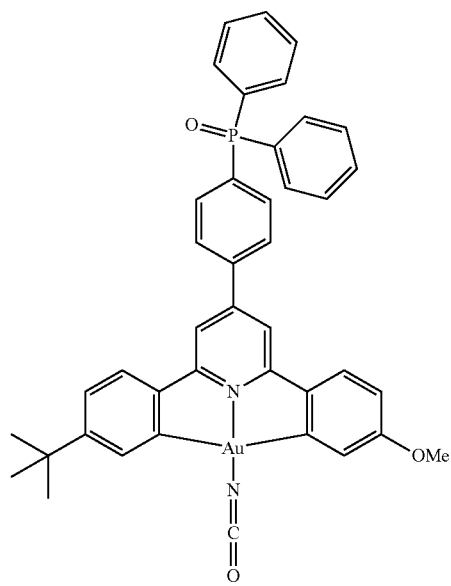
Compound 37
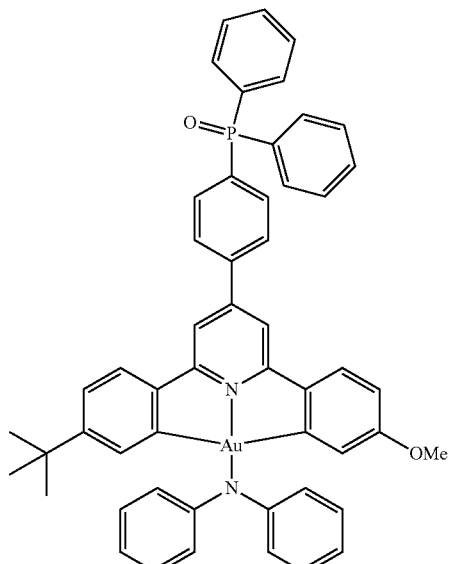
Compound 38
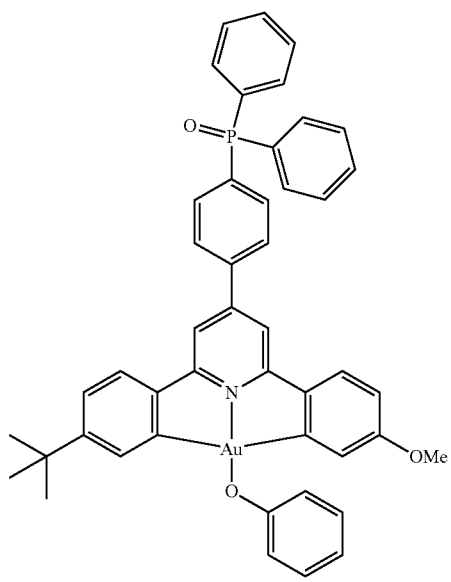

Compound 39
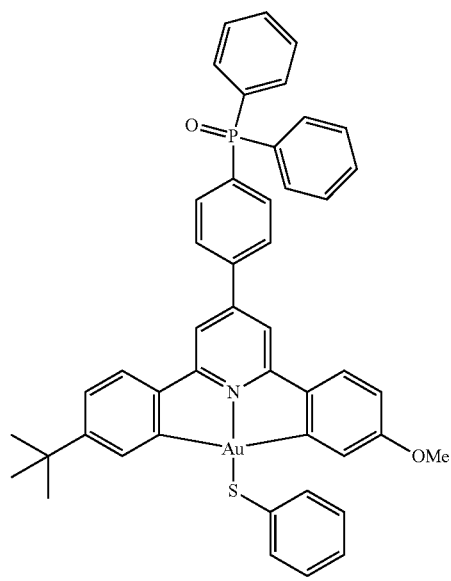
Compound 40
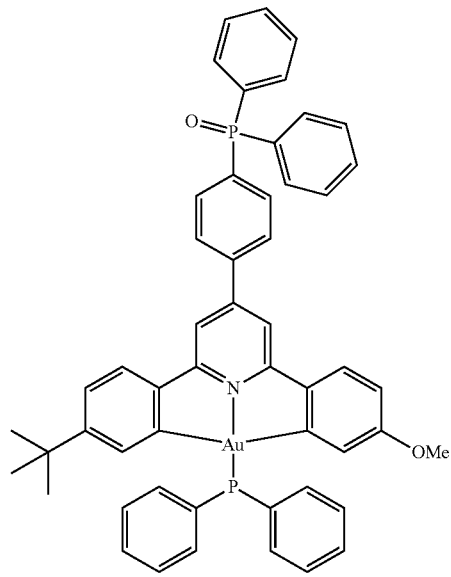
Compound 41
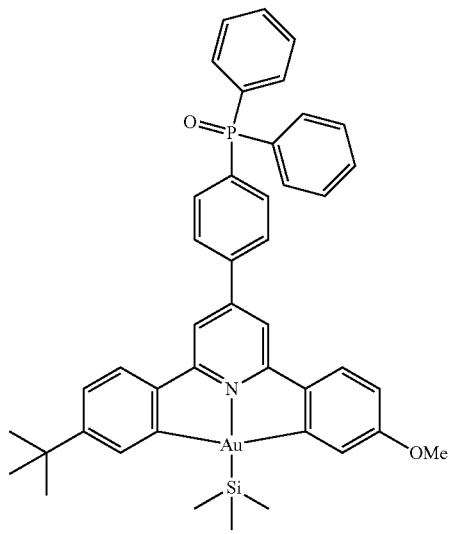
Compound 42
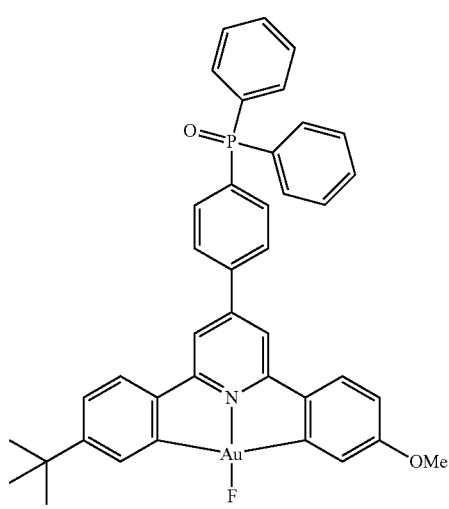
Compound 43

-continued

Compound 44
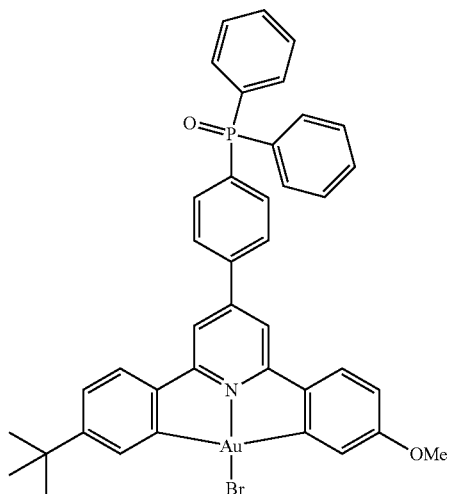

Compound 45
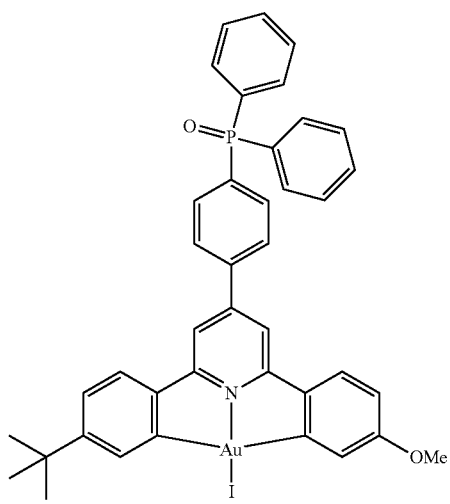

Compound 46
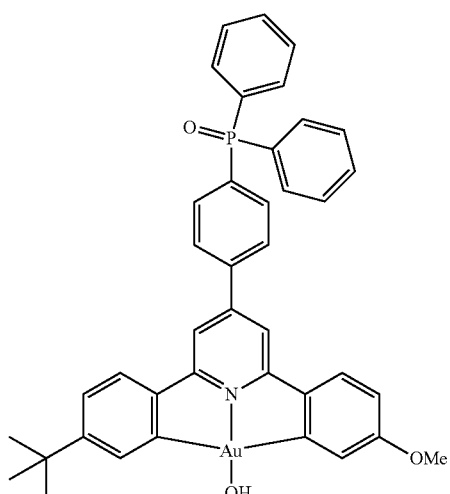

-continued

Compound 47
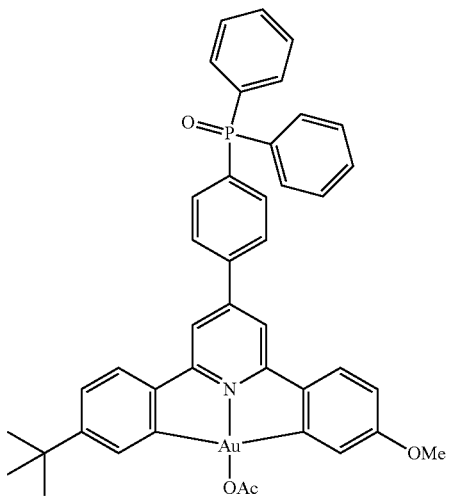

Compound 48
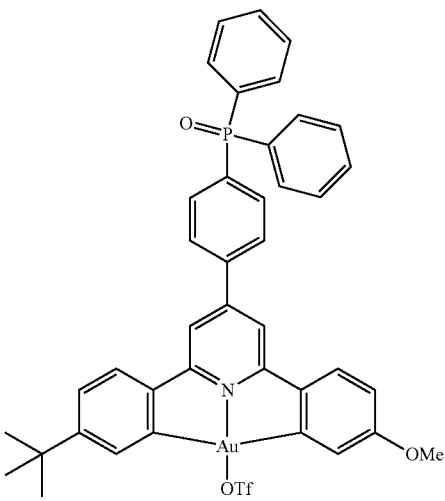

In one or more embodiments of the invention, novel luminescent gold(III) compounds are either the primary luminescent material or a secondary luminescent material in device. In some embodiments, the novel gold(III) compounds are employed as electrophosphorescent dopants in multilayer OLED with an EQE of up to 18.0%. Advantageously, the novel gold(III) compounds can be deposited to prepare OLEDs by spin-coating, screen printing or ink-jet printing. In addition, the incorporation of electron-transporting phosphine oxide moiety or its analogues helps to increase the overall device performance. The high solubility of the luminescent gold(III) compounds in a variety of organic solvents permits simple and economic manufacturing and patterning of large-area displays.

In one or more embodiments, the luminescent gold(III) compounds disclosed herein are deposited as a thin layer on a substrate layer. In one or more embodiments, the thickness of the deposited gold(III) compound is 10-20 nm, 21-30 nm, 31-40 nm, 41-50 nm, 51-60 nm, 61-70 nm, 71-80 nm, 81-90 nm, or 91-100 nm.

The present invention will be illustrated more specifically by the following non-limiting examples, it being understood that changes and variations can be made therein without deviating from the scope and the spirit of the invention as hereinafter claimed. It is also understood that various theories as to why the invention works are not intended to be limiting.

6. EXAMPLES

The following are examples that illustrate embodiments for practicing the disclosure described herein. These examples should not be construed as limiting.

Example 1

General synthetic methodology:

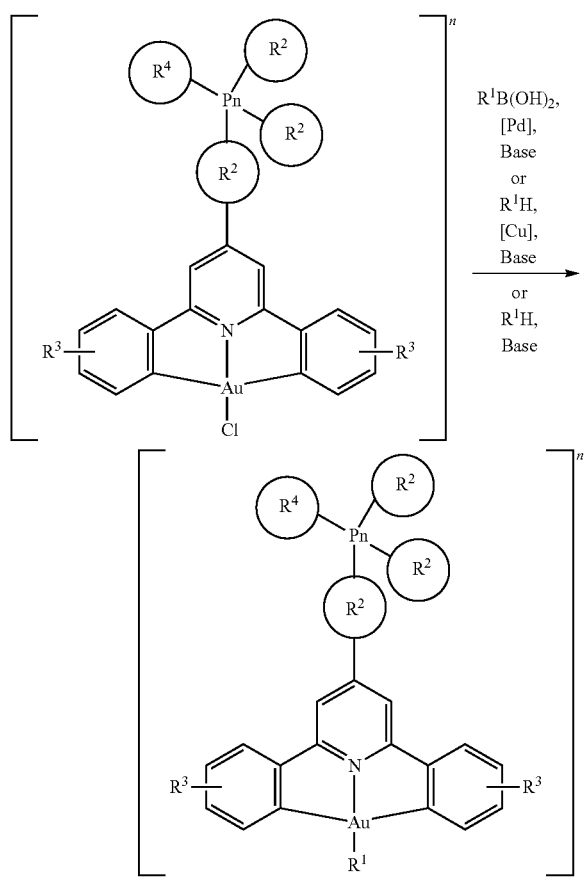

wherein:

$R^1$ is selected from, but is not limited to, alkyl, substituted alkyl, aryl, substituted aryl, heteroaryl, substituted heteroaryl, heterocyclic aryl, substituted heterocyclic aryl, alkynyl or substituted alkynyl. $R^1$ could also be group with heteroatom as the donor atom and is selected from, but not limited to, nitrogen, oxygen, sulphur or phosphorus;

$R^2$ and $R^3$ groups are each independently selected from, but are not limited to, alkyl, alkenyl, alkynyl, alkylaryl, aryl and cycloalkyl with one or more alkyl, alkenyl, alkynyl, alkylaryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or a heterocyclic group, wherein R is independently alkyl, alkynyl, alkylaryl, aryl or cycloalkyl;

$R^4$ can be any chalcogen selected from oxygen, sulphur, selenium, tellurium, being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn;

Pn is pnictogen selected from nitrogen, phosphorus, arsenic and bismuth;

n is zero, a positive integer or a negative integer.

Synthesis and Characterization:

The tridentate ligands, O=PPh₃'BuC^N^C'Bu, and the precursor compounds, [Au(O=PPh₃'BuC^N^CBu)Cl] were prepared according to modification of a procedure reported in the literature [Kröhnke, F. *Synthesis* 1 (1976); Wong, K. H.; Cheung, K. K.; Chan, M. C. W.; Che, C. M. *Organometallics* 17, 5305 (1998)]. The target compounds were synthesized either by the reaction of the [Au(O=PPh₃'BuC^N^CBu)Cl] with the corresponding arylboronic acid in the presence of a catalytic amount of palladium (0) catalyst and base in organic solvent, or by the reaction of the [Au(O=PPh₃'BuC^N^CBu)Cl] with alkyne in the presence of catalytic amount of CuI and base in organic solvent. For example, compound 1 as shown in FIG. 2 was synthesized by stirring a mixture of [Au(O=PPh₃'BuC^N^CBu)Cl] (400 mg, 0.47 mmol), boronic acid (815 mg, 2.82 mmol), Pd(PPh₃)₄ (58 mg, 0.05 mmol) and K₂CO₃ (334 mg, 2.42 mmol) in degassed tetrahydrofuran/H₂O (54 mL, 25:2, v/v) at 80° C. overnight under a nitrogen atmosphere. After removing solvent, the crude product was purified by column chromatography with silica gel to give a yellow solid. The product was further purified by dissolving in ethyl acetate and layered with diethyl ether. The solid was filtered and dried under vacuum to give a yellow solid (323 mg). Continuing with reference to FIG. 2, compounds 2-3 were synthesized using similar procedure as compound 1. Compound 4 was synthesized by stirring a mixture of [Au(O=PPh₃'BuC^N^CBu)Cl] (300 mg, 0.35 mmol), 4-ethynyl-N,N-diphenylaniline (100 mg, 0.37 mmol) and CuI (3 mg, 0.02 mmol) in degassed dichloromethane (20 mL) overnight under a nitrogen atmosphere. After removing the solvent, the crude product was purified by column chromatography with silica gel to give a yellow oil. Then it was dissolved in dichloromethane and layered with diethyl ether. The solid was filtered and dried under vacuum to give a yellow solid (345 mg). Compounds 5 and 6 were synthesized using similar procedure as compound 4 and the chemical structures of compounds 7-48 were shown in FIGS. 3-7. Compounds 7-48 can be synthesized using similar process as modified by one skilled in the art.

¹H NMR spectra were recorded on a Bruker AVANCE 500 or 600 (500 MHz, 600 MHz) Fourier-transform NMR spectrometer with chemical shifts reported relative to tetramethylsilane (δ 0 ppm). ³¹P{¹H} NMR spectra were recorded on a Bruker AVANCE 400 (162 MHz) Fourier-transform NMR spectrometer with chemical shifts reported relative to 85% H₃PO₄ (δ 0 ppm). IR spectra were recorded as KBr disks on a Bio-Rad FTS-7 FTIR spectrometer (4000-400 cm⁻¹). The results of the analyses confirm the high purity of all compounds 1-6.

The characterization data of compounds 1-6 are as follows:

Compound 1: [Au(O=PPh₂-C₆H₄—'BuC^N^C'Bu)(PhNPh₂)]. Yield: 323 mg, 65%. ¹H NMR (500 MHz, tetrahydrofuran-d₈, δ/ppm): δ 8.05-8.01 (m, 2H), 7.98 (s, 2H), 7.94-7.88 (m, 2H), 7.80 (d, J=8.2 Hz, 2H), 7.78-7.71 (m, 4H), 7.61-7.56 (m, 6H), 7.53-7.48 (m, 4H), 7.27 (dd, J=8.2, 2.1 Hz, 2H), 7.24-7.19 (m, 4H), 7.14-7.11 (m, 4H), 7.11-7.07 (m, 2H), 6.96-6.90 (m, 2H), 1.28 (s, 18H). ³¹P{¹H}NMR (162 MHz, tetrahydrofuran-d₈, δ/ppm): δ 21.71. IR (KBr): 1121 cm⁻¹ ν(P=O). Elemental analyses:

Found (%): C 68.58, H 5.25, N 2.54. Calcd for $C_{61}H_{54}N_2OPAu\cdot 0.5H_2O$: C 68.60, H 5.19, N 2.62.

Compound 2: [Au(O=PPh$_2$-C$_6$H$_4$-$^t$BuC^N^CBu)(Ph$^t$Bu)]. Yield: 120 mg, 53%. $^1$H NMR (600 MHz, tetrahydrofuran-d$_8$, δ/ppm): δ 8.03 (dd, J=8.2, 2.2 Hz, 2H), 7.97 (s, 2H), 7.93-7.87 (m, 2H), 7.79 (d, J=8.2 Hz, 2H), 7.78-7.72 (m, 4H), 7.60-7.55 (m, 4H), 7.54-7.47 (m, 6H), 7.36-7.32 (m, 2H), 7.25 (dd, J=8.2, 2.0 Hz, 2H), 1.39 (s, 9H), 1.24 (s, 18H). $^{31}$P{$^1$H} NMR (162 MHz, tetrahydrofuran-d$_8$, δ/ppm): δ 21.70. IR (KBr): 1121 cm$^{-1}$ ν(P=O). Elemental analyses: Found (%): C 66.51, H 5.57, N 1.58. Calcd for $C_{53}H_{53}NOPAu\cdot 0.5H_2O$: C 66.52, H 5.69, N 1.46.

Compound 3: [Au(O=PPh$_2$-C$_6$H$_4$-$^t$BuC^N^CBu){C$_{12}$H$_7$(C$_6$H$_{13}$)$_2$}]. Yield: 65 mg, 24%. $^1$H NMR (600 MHz, tetrahydrofuran-d$_8$, δ/ppm): δ 8.07-8.04 (m, 2H), 8.00 (s, 2H), 7.91 (dd, J=11.3, 8.2 Hz, 2H), 7.81 (d, J=8.2 Hz, 2H), 7.77-7.71 (m, 5H), 7.68-7.66 (m, 2H), 7.60-7.56 (m, 3H), 7.53-7.49 (m, 4H), 7.43 (d, J=2.0 Hz, 2H), 7.36-7.34 (m, 1H), 7.28 (td, J=7.4, 1.2 Hz, 1H), 7.26-7.21 (m, 3H), 2.06-2.02 (m, 4H), 1.19 (s, 18H), 1.14-1.02 (m, 12H), 0.90-0.82 (m, 2H), 0.74 (t, J=7.2 Hz, 6H), 0.71-0.64 (m, 2H). $^{31}$P{$^1$H} NMR (162 MHz, tetrahydrofuran-d$_8$, δ/ppm): δ 23.50. IR (KBr): 1118 cm$^{-1}$ ν(P=O). Elemental analyses: Found (%): C 70.95, H 6.64, 1.31. Calcd for $C_{68}H_{73}NOPau$: C 71.13, H 6.41, N 1.22.

Compound 4: [Au(O=PPh$_2$-C$_6$H$_4$-$^t$BuCANACBu)(C≡C-PhNPh$_2$)]. Yield: 345 mg, 90%. $^1$H NMR (600 MHz, dichloromethane-d$_2$, δ/ppm): δ 8.15 (d, J=2.1 Hz, 2H), 7.90-7.83 (m, 4H), 7.72-7.69 (m, 2H), 7.69-7.67 (m, 2H), 7.62-7.58 (m, 2H), 7.57-7.55 (m, 4H), 7.53-7.49 (m, 4H), 7.44 (d, J=8.6 Hz, 2H), 7.32-7.27 (m, 6H), 7.13-7.11 (m, 4H), 7.08-7.04 (m, 2H), 6.99 (d, J=8.6 Hz, 2H), 1.37 (s, 18H). $^{31}$P{$^1$H} NMR (162 MHz, dichloromethane-d$_2$, δ/ppm): δ 26.82. IR (KBr): 1121 cm$^{-1}$ ν(P=O), 2146 cm$^{-1}$ ν(C≡C) Elemental analyses: Found (%): C 69.07, H 5.02, N 2.51. Calcd for $C_{63}H_{54}N_2OPAu\cdot 0.5H_2O$: C 69.29.72, H 5.08, N 2.57.

Compound 5: [Au {O=PPh$_2$-C$_6$H$_4$-BuC^N^CBu} {C≡C—C$_6$H$_4$—N(C$_{13}$H$_7$(C$_6$H$_{13}$)$_2$)$_2$}]. Yield: 129 mg, 80%. $^1$H NMR (600 MHz, tetrahydrofuran-d$_8$, δ/ppm): δ 8.23 (d, J=2.2 Hz, 2H), 8.05 (dd, J=8.2, 2.2 Hz, 2H), 7.94-7.88 (m, 4H), 7.78-7.72 (m, 6H), 7.66 (d, J=7.4 Hz, 2H), 7.64 (d, J=8.2 Hz, 2H), 7.57 (td, J=7.5 Hz, 1.4 Hz, 2H), 7.50 (td, J=7.5 Hz, 2.7 Hz, 4H), 7.45 (d, J=8.7 Hz, 2H), 7.34 (d, J=7.4 Hz, 2H), 7.31-7.25 (m, 6H), 7.22 (t, J=7.4 Hz, 2H), 7.11-7.06 (m, 4H), 1.99-1.90 (m, 8H), 1.38 (s, 18H), 1.21-1.07 (m, 24H), 0.84-0.61 (m, 20H). $^{31}$P{$^1$H} NMR (162 MHz, tetrahydrofuran-d$_8$, δ/ppm): 6 23.61. IR (KBr): 1121 cm$^{-1}$ ν(P=O), 2146 cm$^{-1}$ ν(CC). Elemental analyses: Found (%): C 75.37, H 7.10, N 1.94. Calcd for $C_{1o1}H_{110}N_2OPAu\cdot 0.5H_2O$: C 75.59, H 7.10, N 1.94

Compound 6: [Au{O=PPh$_2$-C$_6$H$_4$-$^t$BuC^N^CBu} {C≡C—C$_6$H$_4$—N(C$_{13}$H$_6$(C$_6$H$_{13}$)$_2$—($^t$BuCbz))$_2$}]. Yield: 234 mg, 77%. $^1$H NMR (500 MHz, dichloromethane-d$_2$, δ/ppm): δ 8.22 (d, J=2.0 Hz, 2H), 8.18 (d, J=1.9 Hz, 4H), 7.90-7.85 (m, 6H), 7.73-7.69 (m, 6H), 7.64-7.59 (m, 6H), 7.55-7.49 (m, 14H), 7.41 (d, J=8.7 Hz, 4H), 7.36-7.32 (m, 4H), 7.18 (d, J=9.4 Hz, 4H), 2.03-1.91 (m, 8H), 1.48 (s, 36H,), 1.40 (s, 18H), 1.24-1.13 (m, 24H), 0.87-0.77 (m, 20H). $^{31}$P{$^1$H} NMR (202 MHz, dichloromethane-d$_2$, δ/ppm): δ 26.80. IR (KBr): 1118 cm$^{-1}$ ν(P=O), 2145 cm$^{-1}$ ν(C≡C). Elemental analyses: Found (%): C 78.04, H 7.35, N 2.60. Calcd for $C_{141}H_{156}N_4OPAu\cdot H_2O$: C 78.09, H 7.34, N 2.58

Example 2

The gold(III) compounds described herein have particular UV-vis absorption properties. The UV-vis absorption spectra of compounds 1-4 in dichloromethane at 298 K feature an intense vibronic-structured absorption band at ca. 270-320 nm with extinction coefficients (ε) on the order of 10$^4$ dm$^3$mol$^{-1}$ cm$^{-1}$, as shown in FIG. 8. This absorption band is tentatively assigned as the intraligand (IL) π→π*transition of the aromatic moieties. On the other hand, a moderately intense absorption band at ca. 350-430 nm is observed. This absorption band shows vibrational progressional spacings of ca. 1300 cm$^{-1}$, corresponding to the skeletal vibrational mode of the cyclometalating tridentate ligands. Similar to other structurally related gold(III) complexes, this absorption band is tentatively assigned to a metal-perturbed IL π→π*transition of the cyclometalating tridentate ligands with charge transfer character from the aryl ring to the pyridine unit. The assignment of a metal-to-ligand charge transfer transition would not be likely due to the non-reducing nature of the gold(III) center to achieve gold(IV) higher oxidation state. For complexes 1 and 4, the absorption tail beyond 435 nm could be tentatively assigned as ligand-to-ligand charge transfer (LLCT) π[auxiliary ligand]e→π*[C^N^C] transition. This absorption band is found to be more red-shifted for compound 4 than 1 because the effective conjugation length of the auxiliary ligands is longer in compound 4. As a result, the highest occupied molecular orbital (HOMO) of compound 4 is higher-lying than that of 1, and the absorption band becomes more red-shifted. The UV-visible absorption data of compounds 1-4 in dichloromethane at 298 K have been summarized in Table 1 below. The UV-vis absorption and emission spectra of compounds 1-4 provide the fundamental photophysical data that offer useful guidelines for the design of the chemical structures to tune the emission color of the emitters in both the solution and the solid state.

TABLE 1

Photophysical data for compounds 1-4

| Compound | Medium (T/K) | Absorption $\lambda_{max}$/nm ($\varepsilon_{max}$/dm$^3$mol$^{-1}$cm$^{-1}$) | Emission $\lambda_{max}$/nm ($\tau_O$ /μs) | $\Phi_{sol}$ | $\Phi_{film}$ |
|---|---|---|---|---|---|
| 1 | CH$_2$Cl$_2$ (298) | 278 sh (76055), 294 (87285), 390 (6430), 413 (6180) | 700 (<0.1) | 0.003[b] | 0.65[c] |
| 2 | CH$_2$Cl$_2$ (298) | 277 (58350), 290 (59370), 390 (5825), 414 (4560) | 489, 518, 562 sh (12.3) | 0.07[a] | 0.51[c] |
| 3 | CH$_2$Cl$_2$ (298) | 286 (69555), 390 (5490), 312 sh (40170), 389 (5435), 411 (3960) | 490, 518 (11.5) | 0.09[a] | 0.61[d] |

TABLE 1-continued

Photophysical data for compounds 1-4

| Compound | Medium (T/K) | Absorption $\lambda_{max}$/nm ($\varepsilon_{max}$/dm$^3$mol$^{-1}$cm$^{-1}$) | Emission $\lambda_{max}$/nm ($\tau_O$ /µs) | $\Phi_{sol}$ | $\Phi_{film}$ |
|---|---|---|---|---|---|
| 4 | CH$_2$Cl$_2$ (298) | 296 (76550), 320 (55220), 403 (12970), 422 (12175) | 713 (<0.1) | 0.001[b] | 0.60[c] |

[a]The luminescence quantum yield, measured at room temperature using quinine sulfate in 0.5 M H$_2$SO$_4$ as the reference (excitation wavelength = 365 nm, $\Phi_{lum}$ = 0.546)
[b]The luminescence quantum yield, measured at room temperature using [Ru(bpy)$_3$]Cl$_2$ in degassed acetonitrile as the reference (excitation wavelength = 436 nm, $\Phi_{lum}$ = 0.06)
[c]$\Phi_{film}$ of gold (III) compound doped into 5 wt % TCTA:MCP (1:3 w/w) excited at wavelength of 320 nm
[d]$\Phi_{film}$ of gold (III) compound doped into 5 wt % MCP excited at wavelength of 320 nm Example 3

The gold(III) compounds described herein have particular emission properties and thermal stabilities. Unlike most of the other gold(III) compounds which are non-emissive or only show luminescence at low temperatures, compounds 1 and 4 display luminescence at 550-850 nm and compounds 2-3 show intense luminescence at 450-650 nm with respectable photoluminescence quantum yields in both solution and solid state thin-films at room temperature (See Table 1 above). The emission spectra of compounds 1-4 in degassed dichloromethane solution are shown in FIG. 9. Upon excitation at λ=380 nm in dichloromethane solution at 298 K, vibronic-structured emission bands with peak maxima at ca. 489 nm for compounds 2-3 are observed. The vibrational progressional spacings of ca. 1300 cm$^{-1}$ in the emission spectrum of compounds 2 and 3 match well with the v(C≡C) and v(C≡N) stretching modes of the tridentate ligand, suggesting an involvement of the tridentate ligand-based excited state. These emission bands are assigned as originating from a metal-perturbed IL $^3$[π→π*] state of the tridentate ligand, with probably mixing of charge transfer character from the aryl ring to the pyridyl moiety. FIG. 10 shows the normalized photoluminescence spectra of thin films of 5 wt % of compounds 1, 2, and 4 doped into TCTA:MCP (1:3 w/w) at 298 K. The emission energies are similar to those in solution and there is no significant spectral shift in the emission spectra for compounds without donor group on the auxiliary ligand, unlike most of the other platinum(II) and gold(III) systems.

This allows one to precisely control the emission energies of this class of complexes via the modification of cyclometalating tridentate ligands as well as the introduction of donor group(s) on the auxiliary ligand. It is worth noting that all of the gold(III) compounds show high thermal stability. As depicted in FIGS. 11-14, thermogravimetric analysis (TGA) data reveal that these compounds exhibit high decomposition temperatures (i.e. the temperature at which the material shows a 5% weight loss) of over 300 degree C.

Example 4

Solution-processable OLEDs according to an embodiment of the invention were constructed in the following manner:
a) A transparent anode ITO-coated borosilicate glass substrate (38 mm×38 mm) with sheet resistance of 30 1 per square was ultrasonicated in the commercial detergent Decon 90, rinsed in deionized water having a resistivity of 18.2 mega-ohm for 15 minutes, and then dried in an oven at 120 degree C. for at least an hour. The substrate was next subjected to an UV-ozone treatment in a Jelight 42-220 UVO-Cleaner equipped with a mercury grid lamp for 15 minutes in order to increase the work function of the ITO-coated glass substrate for better hole injection into the organic layer;
b) A 70-nm thick PEDOT:PSS hole-transporting layer was spin-coated by using a spin processor at 7000 rpm for 30 seconds onto the ITO-coated glass substrate of step a and baked at 110 degree C. for 10 minutes in air;
c) A 60-nm thick light-emitting layer was spin-coated by using a spin processor at 6000 rpm for 25 seconds onto PEDOT:PSS layer of step b, and baked at 80 degree C. for 10 minutes in air, in which compound 1 was doped into mixed host consisting of TCTA:MCP (1:3 w/w) at different concentrations in the range from 5 to 50 wt %;
d) The substrate was put into a vacuum chamber, and the chamber was pumped down from 1 bar to 5×10$^{-6}$ mbar;
e) A 5 nm thick 3TPYMB hole-blocking layer was deposited by thermal evaporation on doped light-emitting layer of step c;
f) A 30 nm thick TmPyPB electron-transporting layer was deposited by thermal evaporation on the 3TPYMB layer of step e; and
g) A 0.8 nm thick LiF layer and a 80 nm thick Al layer were deposited by thermal evaporation on the TmPyPB layer of step f to form an electron-injecting cathode.

3TPYMB, TmPyPB, LiF and Al were prepared by thermal evaporation from tantalum boats by applying current through the tantalum boats. Deposition rates were monitored with a quartz oscillation crystal and controlled at 0.1-0.2 nm s$^{-1}$ for both organic and metal layers. Current density-voltage-luminance characteristics of OLEDs were measured with a programmable Keithley model 2420 power source and a Spectrascan PR-655 colorimeter under ambient air conditions.

As depicted in FIG. 15, all devices exhibit Gaussian-shaped emission, and the EL spectra for all the devices made from compound 1 are almost identical to their emission spectra in solution without any undesirable emission coming from the adjacent carrier-transporting layers or the host materials. Upon increasing dopant concentration, a red shift in the emission maxima is observed. The emission wavelengths are found to shift from 528 nm to 564 nm in the concentration range of 5 to 50 wt % in TCTA:MCP (1:3 w/w), while the Commission Internationale de L'Eclairage (CIE) coordinates are found to shift from (0.33, 0.58) to (0.46, 0.52). This concentration dependence could be ascribed to the excimer emission resulting from π-π stacking of molecules at high concentrations, which is typically observed in square-planar metal complexes. In addition, all devices have been found to show a promising performance. In particular, a maximum current efficiency of 50.0 cd A$^{-1}$ and a power efficiency of 37.0 lm W$^{-1}$ can be achieved for the optimized device doped with 20 wt % of compound 1. This corresponds to a maximum EQE of 15.2% (FIG. 16).

Example 5

The same materials and processing procedures were employed as described in Example 4 except that compound 4 was doped into TCTA:MCP (1:3 w/w) as light emissive layer. Similar to the case of compound 1, the emission energies are strongly dependent on the dopant concentration (FIG. 17). Particularly, the CIE coordinates of the devices have been shifted from (0.30, 0.58) to (0.44, 0.54) with increasing dopant concentration from 5 to 50 wt %. In addition, high current efficiency of up to 51.6 cd $A^{-1}$ and EQE of 15.3% can be realized (FIG. 18). More notably, the optimized device (i.e. 20 wt %) exhibits a small efficiency roll-off of ~7% at high luminance of 1000 cd $m^{-2}$.

Example 6

The same materials and processing procedures were employed as described in Example 5 except that the electron-transporting material was replaced by Tm3PyP26PyB. With the use of a better electron-transporting material, the EL performance of the solution-processable OLEDs based on compound 4 can be further boosted up to 57.8 cd $A^{-1}$ and EQE of 18.0% (FIG. 19).

Example 7

The same materials and processing procedures were employed as described in Example 4 except that compound 5 was doped into TCTA:MCP (1:3 w/w) as light emissive layer. Similar to the case of compound 1, the emission energies are strongly dependent on the dopant concentration (FIG. 20). Particularly, the CIE coordinates of the devices have been shifted from (0.37, 0.58) to (0.50, 0.49) with increasing dopant concentration from 5 to 50 wt %. In addition, high current efficiency of up to 49.2 cd $A^{-1}$ and EQE of 14.3% can be realized (FIG. 21).

Example 8

The same materials and processing procedures were employed as described in Example 4 except that compound 6 was doped into TCTA:MCP (1:3 w/w) as light emissive layer. Similar to the case of other compounds, the emission energies are strongly dependent on the dopant concentration (FIG. 22). Particularly, the CIE coordinates of the devices have been shifted from (0.40, 0.57)) to (0.47, 0.52) with increasing dopant concentration from 5 to 50 wt %. In addition, high current efficiency of up to 32.0 cd $A^{-1}$ and EQE of 9.8% can be realized (FIG. 23).

Exemplary compounds, systems and methods are set out in the following items:

Item 1. A luminescent gold(III) compound according to structure (I):

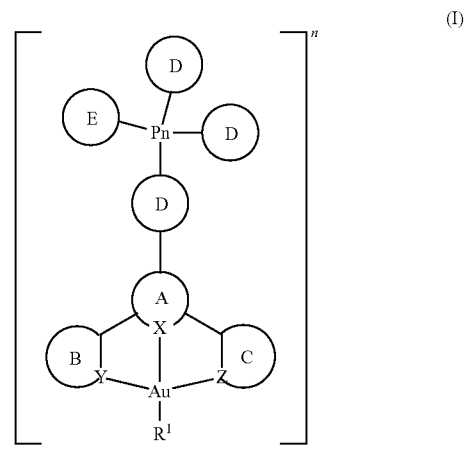

wherein:
(a) X is nitrogen or carbon;
(b) Y and Z are nitrogen or carbon;
(c) A is benzene, phenyl derivatives, heterocycle or heterocyclic derivatives;
(d) B and C are independently benzene, phenyl derivatives, heterocycle or heterocyclic derivatives;
(e) D is any alkyl, cyclic aliphatic or aromatic structures, in which each D group can be identical or non-identical;
(f) Pn is pnictogen selected from nitrogen, phosphorus, arsenic and bismuth;
(g) E can be any chalcogen selected from oxygen, sulphur, selenium, tellurium, being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn;
(h) $R^1$ is any carbon or heteroatom donor ligand, halide or pseudohalide, which could be either monoanionic or neutral. $R^1$ is selected from, but not limited to, alkyl, substituted alkyl, aryl, substituted aryl, heteroaryl, substituted heteroaryl, heterocyclic aryl, substituted heterocyclic aryl, alkynyl, substituted alkynyl, alkoxy, amide, thiolate, phosphide, chloride, bromide, iodide, cyanate, thiocyanate or cyanide; and
(i) n is zero, a positive integer or a negative integer.

Item 2. The gold(III) compound according to item 1, wherein the compound is deposited as a thin layer of 10-100 nm thick on a substrate layer.

Item 3. The gold(III) compound according to any one of the preceding items, wherein the thin layer is deposited by vacuum deposition, spin-coating, or inkjet printing.

Item 4. The gold(III) compound according to any one of the preceding items, wherein the compound has photoluminescence properties within a range of 380 to 1050 nm.

Item 5. The gold(III) compound according to any one of the preceding items, wherein the compound emits light in response to the passage of an electric current or to a strong electric field through the compound.

Item 6. The gold(III) compound according to any one of the preceding items, wherein the compound is used to fabricate an OLED.

Item 7. The gold(III) compound according to any one of the preceding items, wherein the gold(III) compound serves as the light-emitting layer of the OLED.

Item 8. The gold(III) compound according to any one of the preceding items, wherein the gold(III) compound serves as a dopant in the light-emitting layer or emissive layer of the OLED.

Item 9. The gold(III) compound according to any one of the preceding items, wherein the emission energy of the compound is dependent on the concentration of the gold(III) dopant and with donor groups on the auxiliary ligand, in which the donor group is selected from, but is not limited to, N, S, O, P.

Item 10. The gold(III) compound according to any one of the preceding items wherein the emission energy of the compound is independent of the concentration of the gold(III) compound without donor group on the auxiliary ligand, in which the donor group is selected from, but is not limited to, N, S, O, P.

Item 11. The gold(III) compound according to any one of the preceding items wherein the benzene, phenyl derivatives, heterocycle or heterocyclic derivatives comprises one or more alkyl, alkenyl, alkynyl, aryl, cycloalkyl, OR, $NR_2$, SR, C(O)R, C(O)OR, $C(O)NR_2$, CN, $CF_3$, $NO_2$, $SO_2$, SOR, $SO_3R$, halo, aryl, substituted aryl, heteroaryl, substituted heteroaryl or heterocyclic group, and wherein D is alkyl, heteroatom-containing alkyl, aryl, substituted aryl, heteroaryl, substituted heteroaryl, arylalkenyl and substituted arylalkenyl, E is chalcogen being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn, and R is independently alkyl, alkenyl, alkynyl, alkyaryl, aryl, or cycloalkyl.

Item 12. A gold(III) compound having the structure:

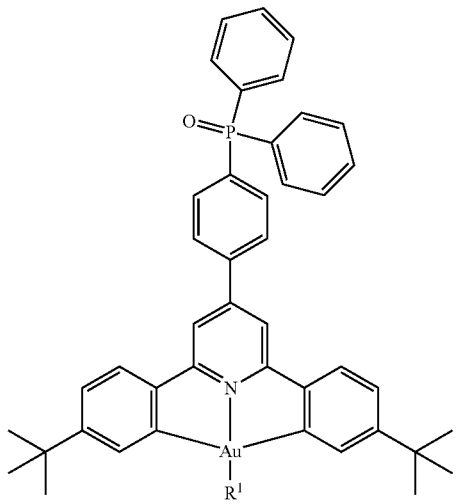

wherein $R^1$ is triphenylamine, 4-(tert-butyl)phenyl, or Rle is any one of the following structures:

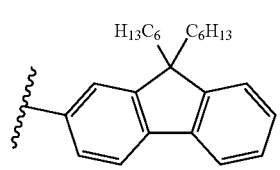

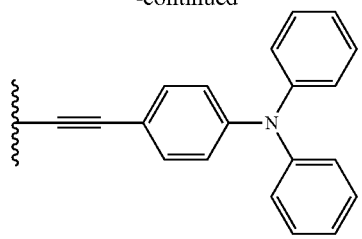

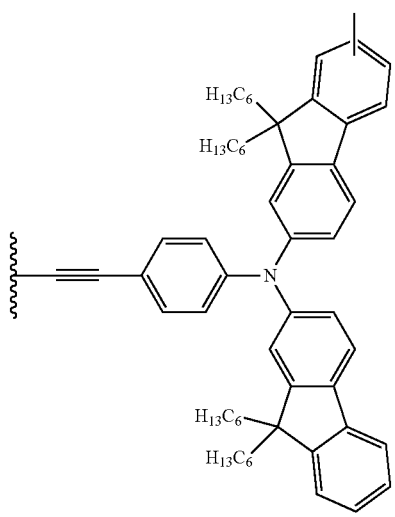

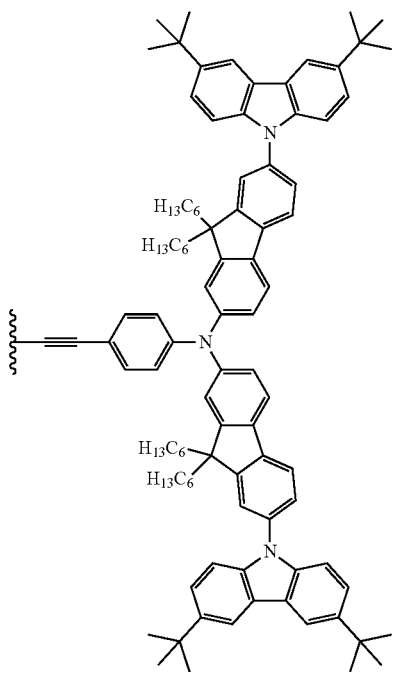

Item 13. A gold(III) compound having one of the following structures:

Compound 7
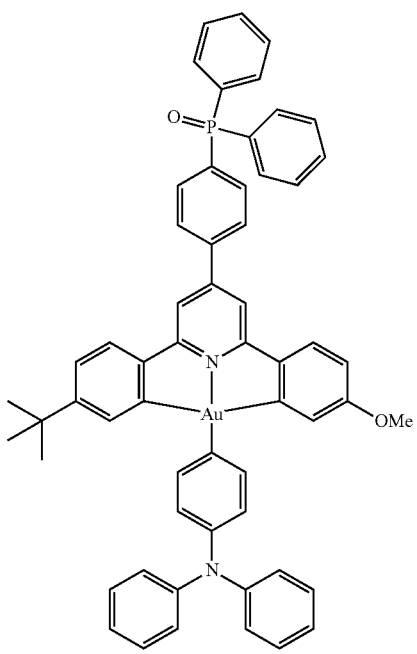
Compound 8
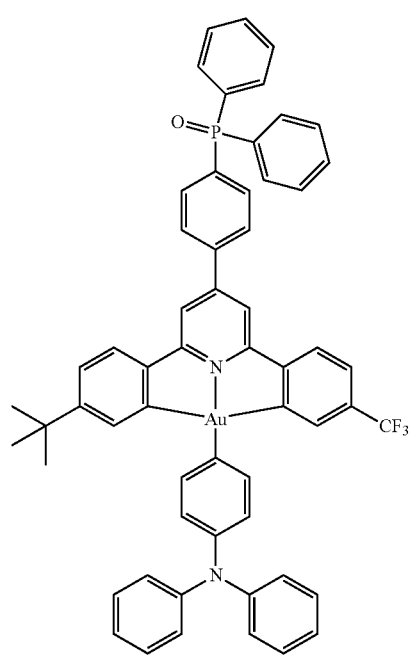
-continued
Compound 9
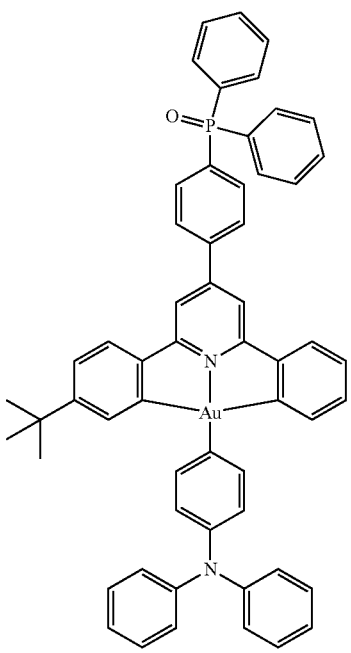
Compound 10
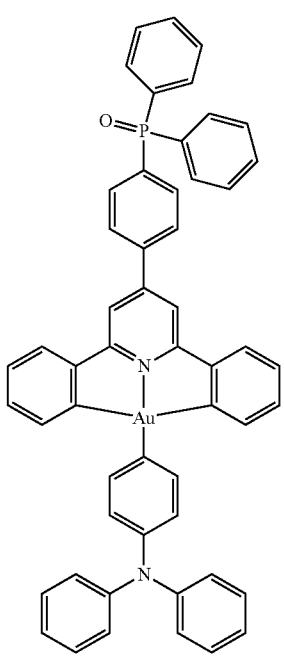

Compound 11
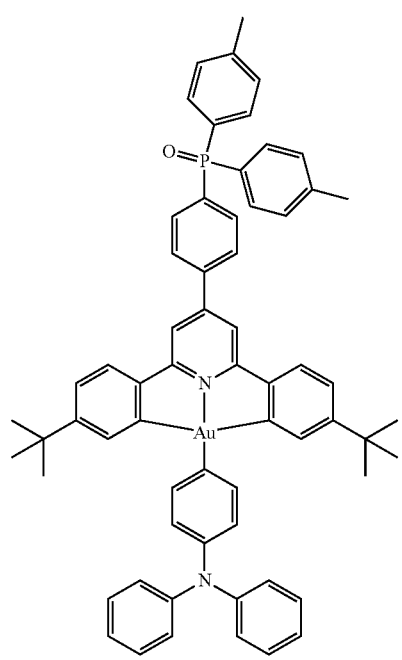
Compound 12
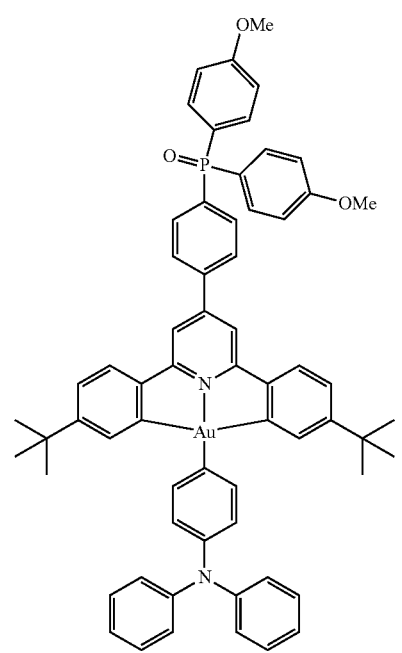
Compound 13
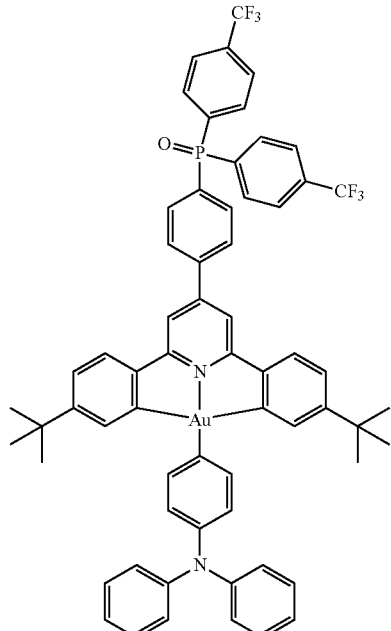
Compound 14
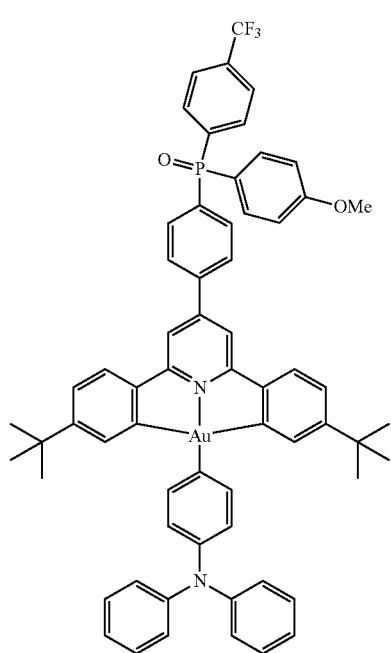

Compound 15
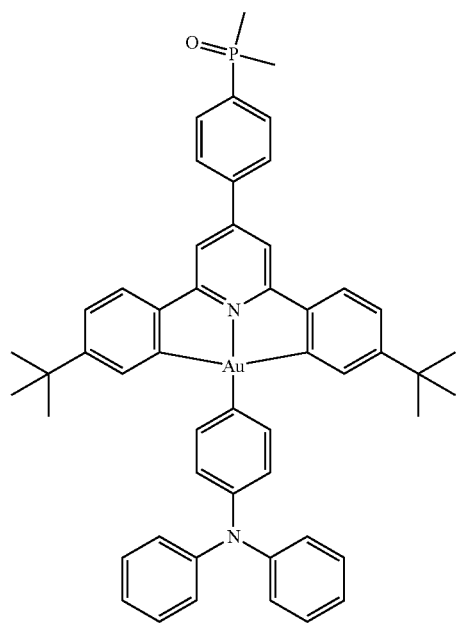
Compound 17
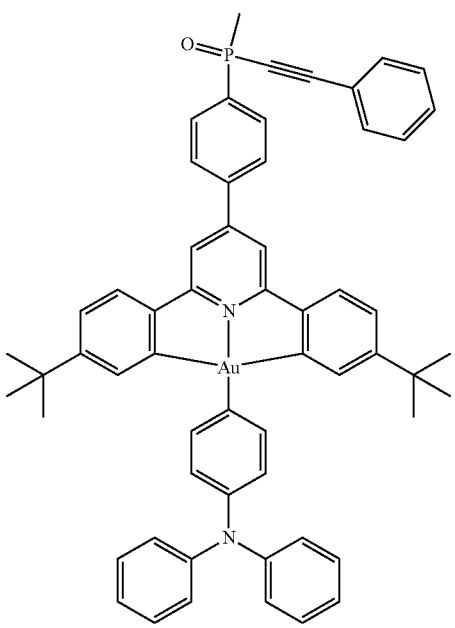
Compound 16
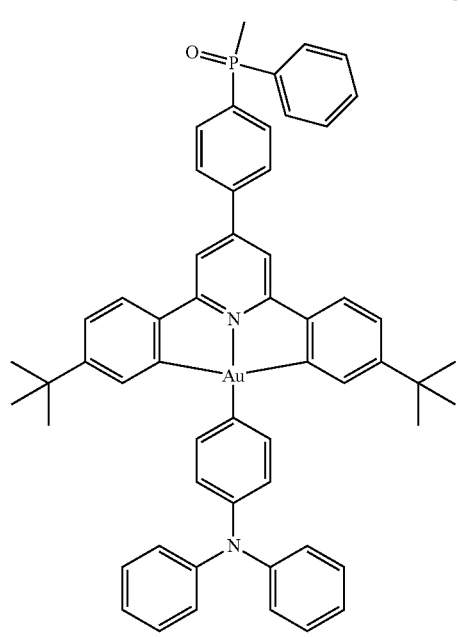
Compound 18
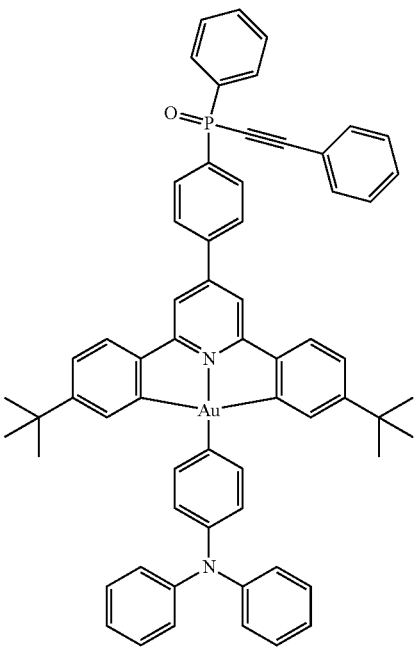

Compound 19
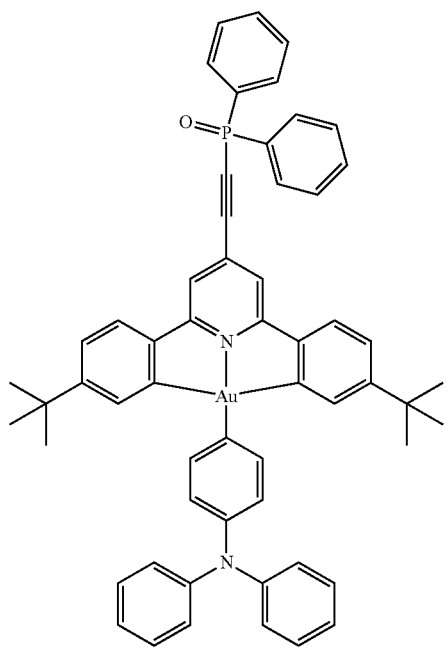
Compound 21
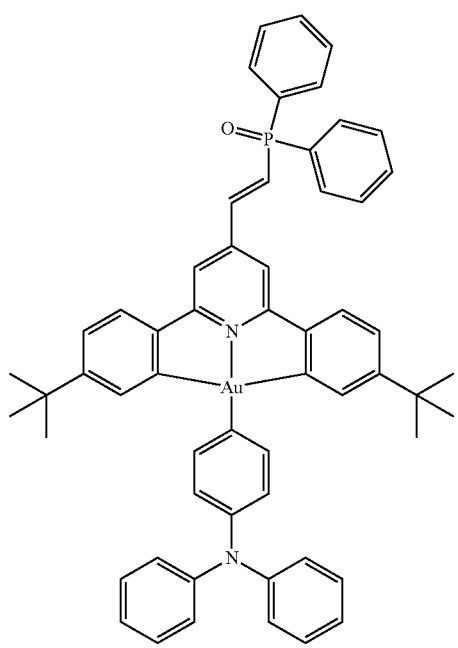
Compound 20
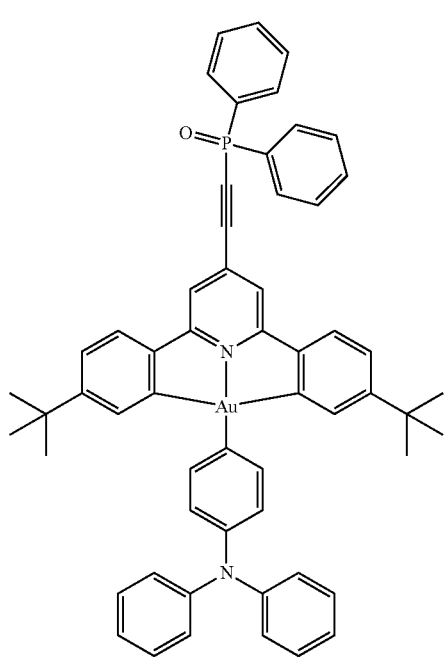
Compound 22
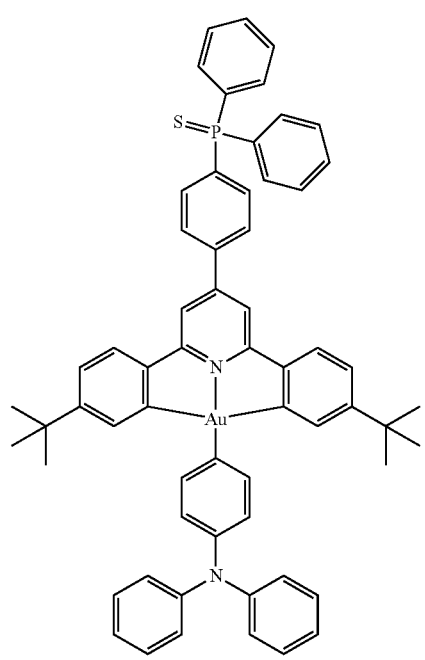

Compound 23
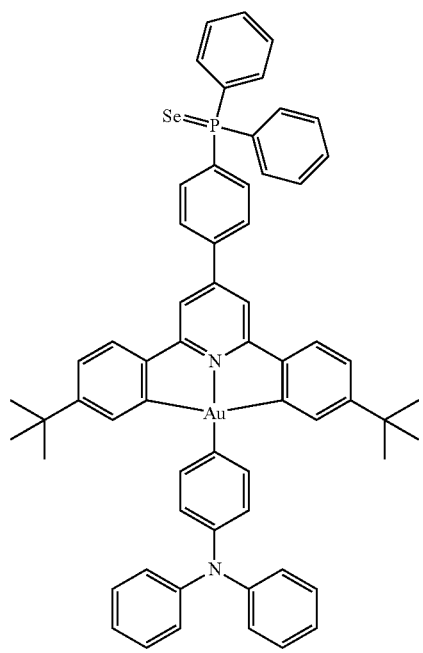
Compound 24
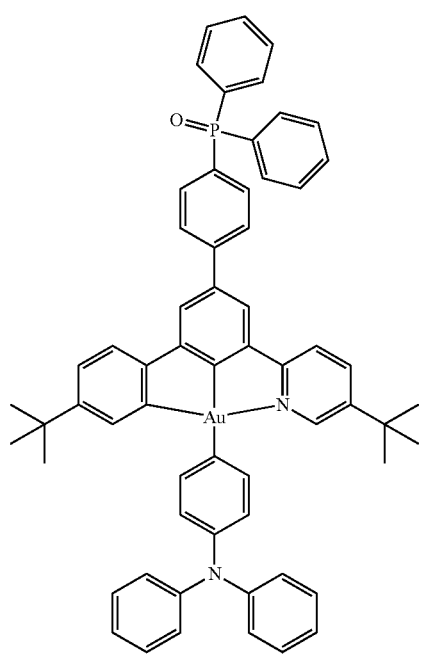
Compound 25
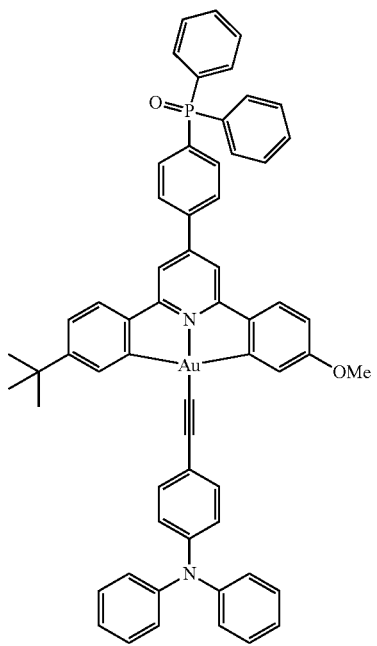
Compound 26
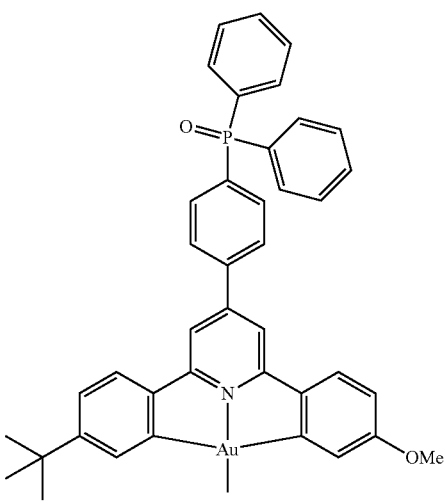

Compound 27
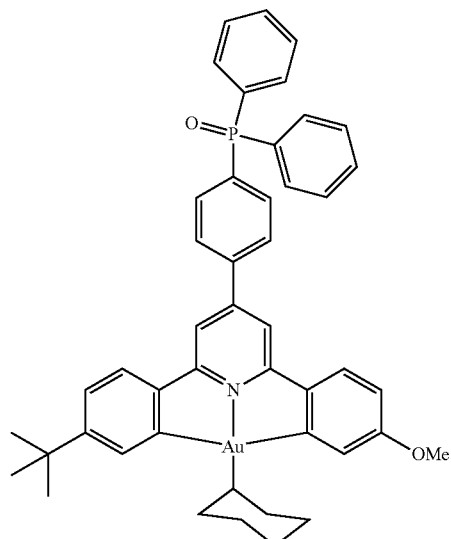
Compound 28
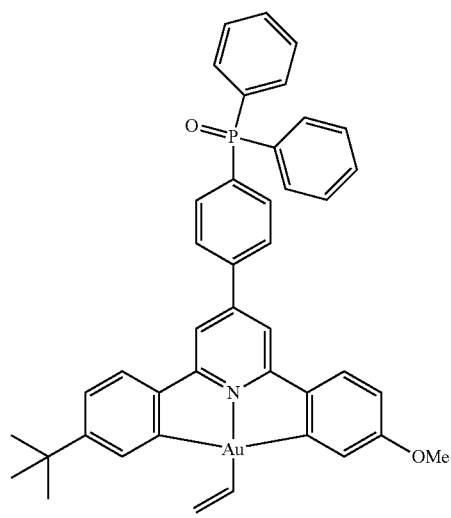
Compound 29
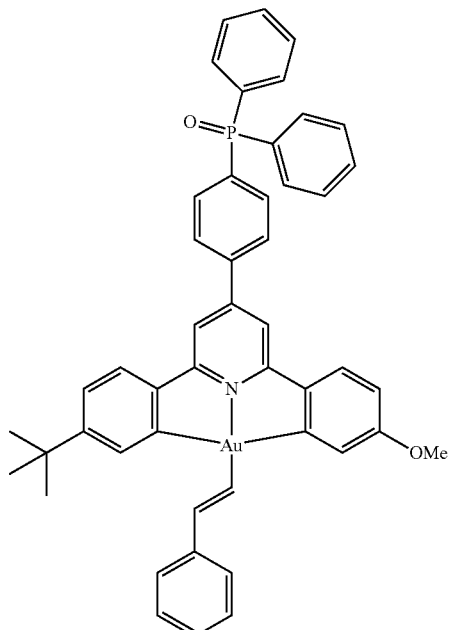
Compound 30
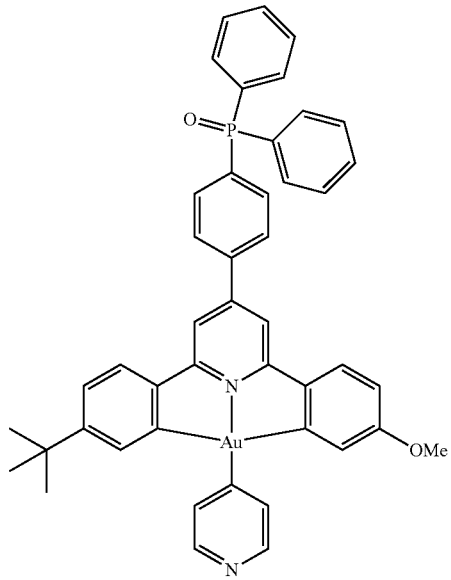

Compound 31
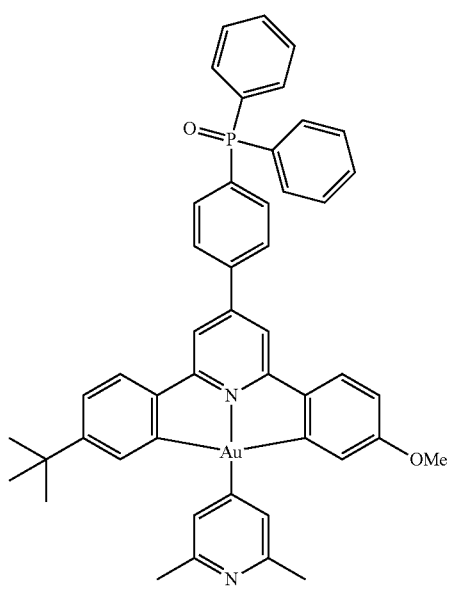
Compound 33
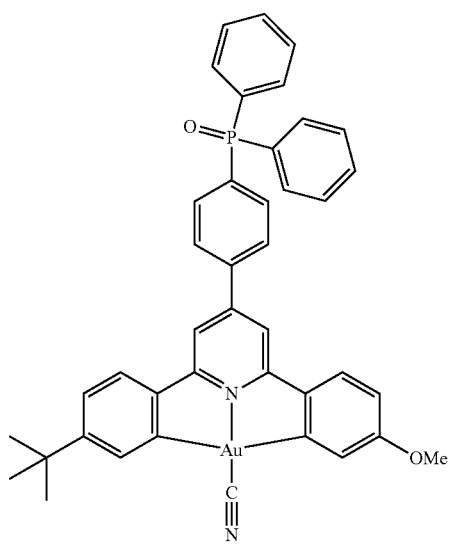
Compound 32
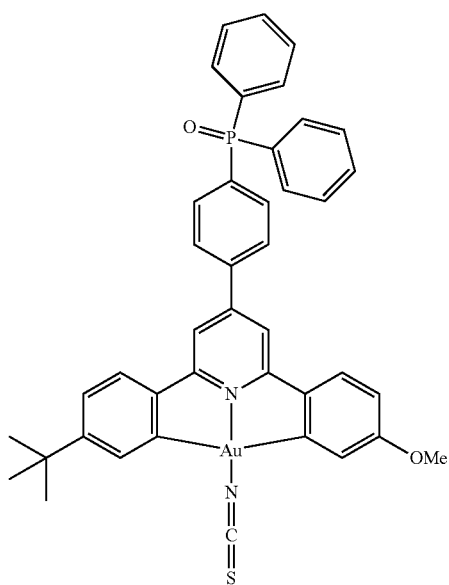
Compound 34
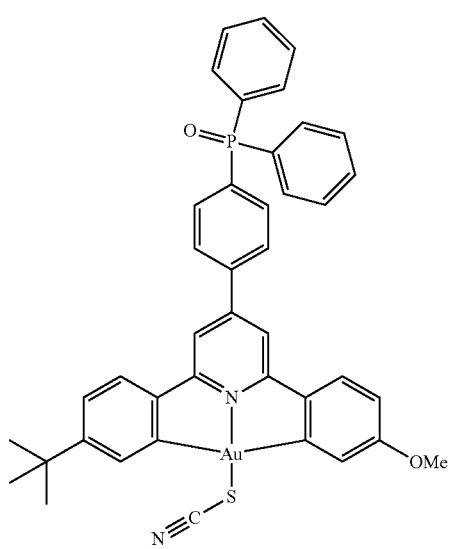

Compound 35
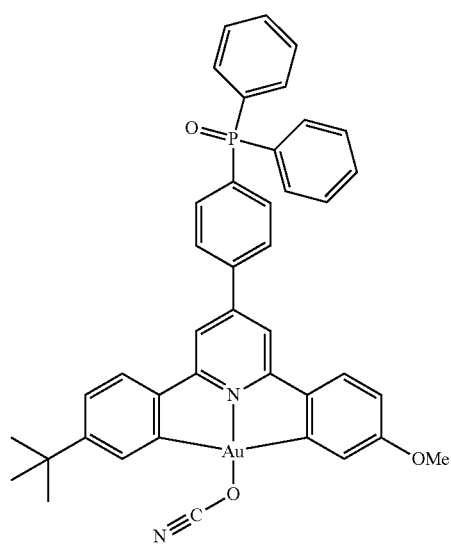
Compound 36
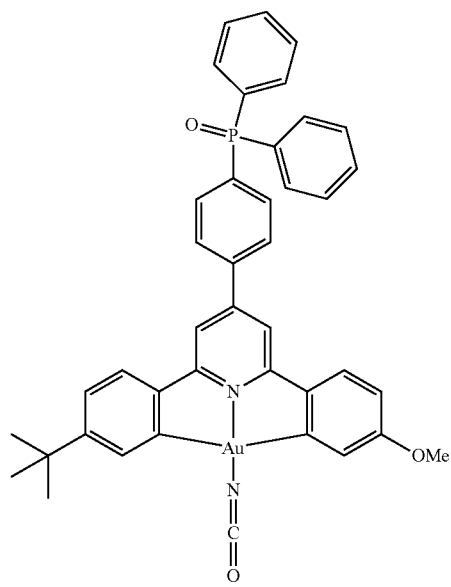
Compound 37
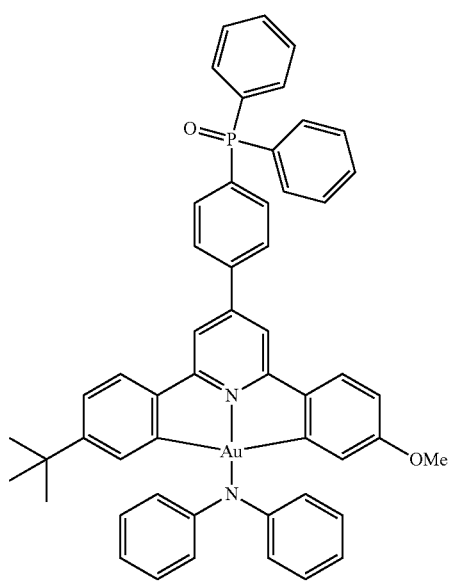
Compound 38
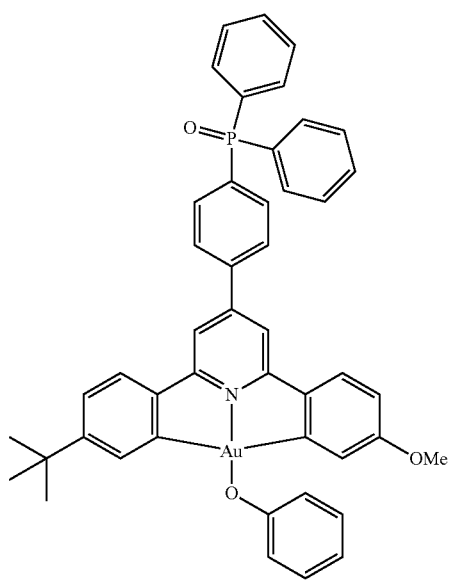

Compound 39
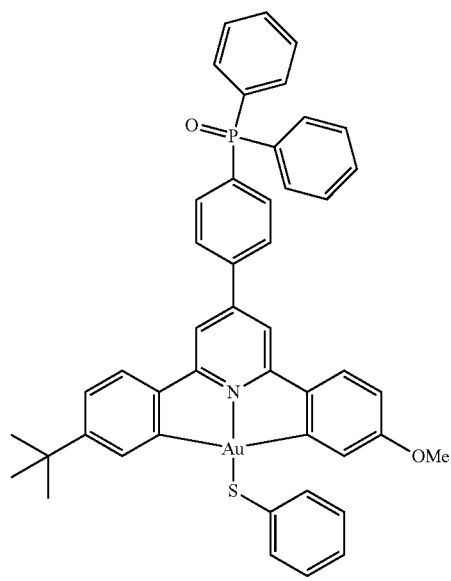
Compound 40
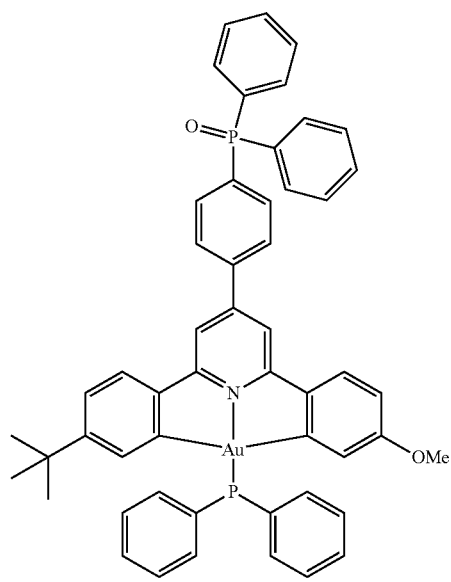
Compound 41
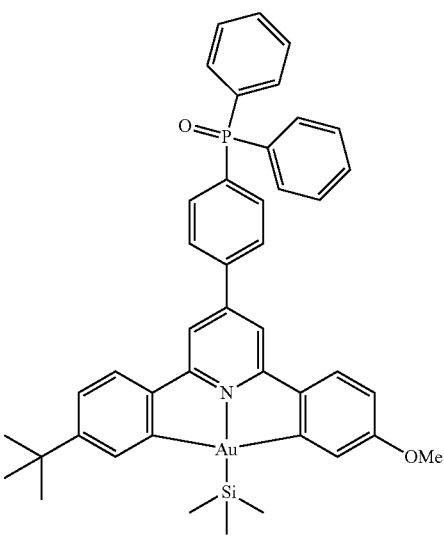
Compound 42
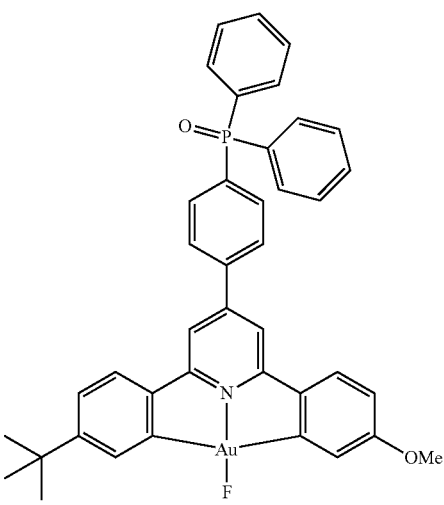
Compound 43
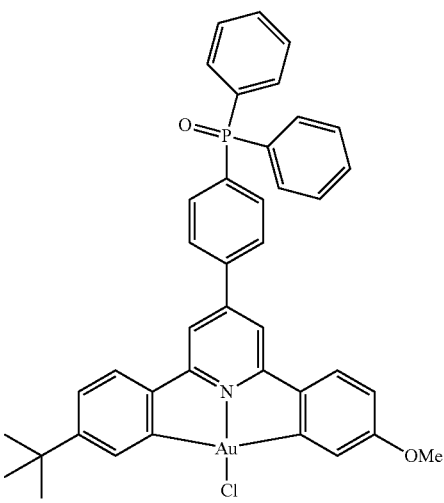

Compound 44
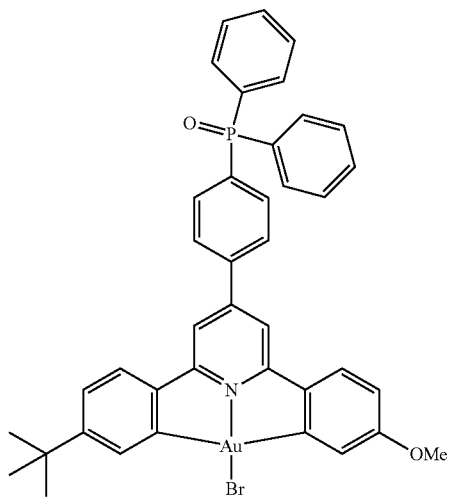
Compound 45
Compound 47
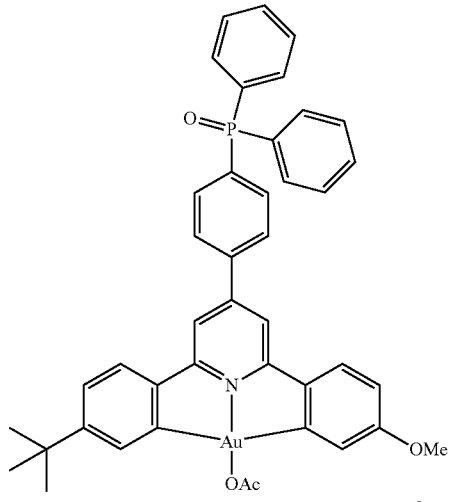
Compound 48
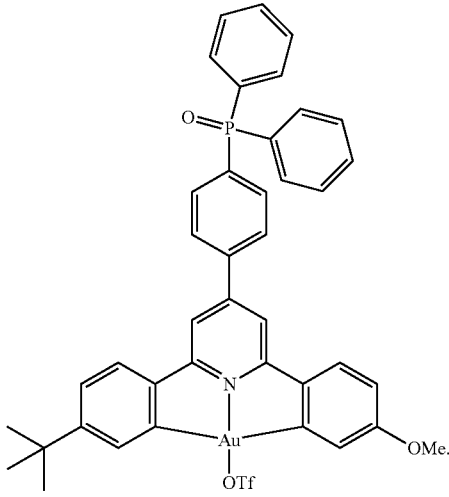
Compound 46
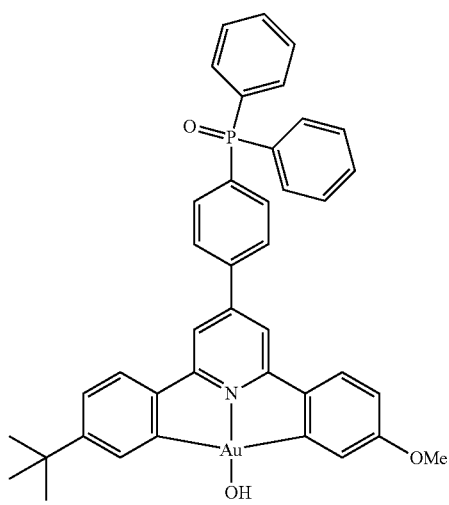
Item 14. A method for preparing a luminescent compound with group 15 element-containing cyclometalating tridentate ligand and at least one aryl or alkynyl group, both coordinated to a gold(III) metal center, comprising the following reaction:
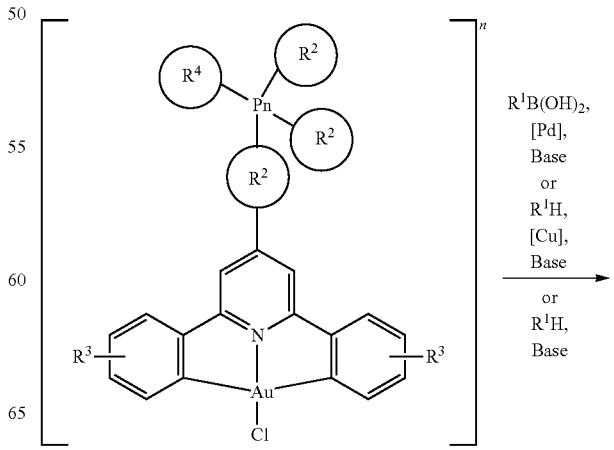

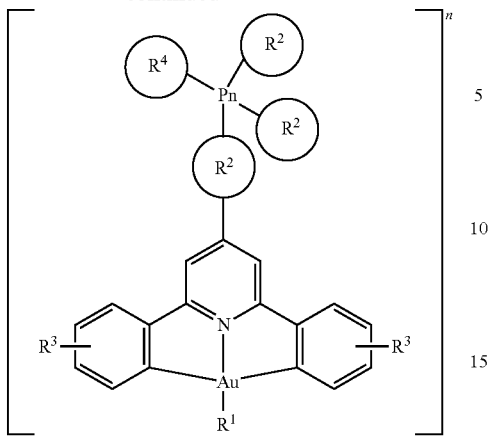

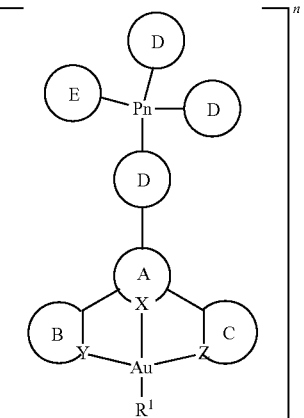

wherein:
(a) $R^1$ is selected from, but is not limited to, alkyl, substituted alkyl, aryl, substituted aryl, heteroaryl, substituted heteroaryl, heterocyclic aryl, substituted heterocyclic aryl, alkynyl or substituted alkynyl. $R^1$ could also be group with heteroatom as the donor atom and is selected from, but not limited to, nitrogen, oxygen, sulphur or phosphorus;
(b) $R^2$ and $R^3$ groups are each independently selected from, but are not limited to, alkyl, alkenyl, alkynyl, alkylaryl, aryl and cycloalkyl with one or more alkyl, alkenyl, alkynyl, alkylaryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or a heterocyclic group, wherein R is independently alkyl, alkynyl, alkylaryl, aryl or cycloalkyl;
(c) $R^4$ can be any chalcogen selected from oxygen, sulphur, selenium, tellurium, being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn;
(d) Pn is pnictogen selected from nitrogen, phosphorus, arsenic and bismuth;
(e) n is zero, a positive integer or a negative integer.

Item 15. The method according to item 14, wherein a luminescent compound is prepared.

Item 16. The method according to any one of items 14-15, wherein the gold(III) metal center comprises a light-emitting layer of a light-emitting device.

Item 17. The method according to any one of items 14-16, wherein the gold(III) metal group comprises a layer of a light-emitting device.

Item 18. The gold(III) compound according to any one of items 14-17, wherein the gold(III) metal compound is a dopant included in the light-emitting layer or emissive layer of the light-emitting device.

Item 19. The method according to any one of items 14-18, wherein the gold(III) metal compound is a dopant included in a light-emitting device.

Item 20. A light-emitting device with an ordered structure comprising an anode, a hole-transporting layer, a light-emitting layer, an electron-transporting layer and a cathode wherein the light-emitting layer comprises a gold(III) compound having a chemical structure represented by the following general formula (I), wherein:
(a) X is nitrogen or carbon;
(b) Y and Z are nitrogen or carbon;
(c) A is benzene, phenyl derivatives, heterocycle or heterocyclic derivatives;
(d) B and C are independently benzene, phenyl derivatives, heterocycle or heterocyclic derivatives;
(e) D is any alkyl, cyclic aliphatic or aromatic structures, in which each D group can be identical or non-identical;
(f) Pn is pnictogen selected from nitrogen, phosphorus, arsenic and bismuth;
(g) E can be any chalcogen selected from oxygen, sulphur, selenium, tellurium, being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn;
(h) $R^1$ is any carbon or heteroatom donor ligand, halide or pseudohalide, which could be either monoanionic or neutral. $R^1$ is selected from, but not limited to, alkyl, substituted alkyl, aryl, substituted aryl, heteroaryl, substituted heteroaryl, heterocyclic aryl, substituted heterocyclic aryl, alkynyl, substituted alkynyl, alkoxy, amide, thiolate, phosphide, chloride, bromide, iodide, cyanate, thiocyanate or cyanide; and
(i) n is zero, a positive integer or a negative integer.

Item 21. The light-emitting device of item 20 wherein the benzene, phenyl derivatives, heterocycle or heterocyclic derivatives comprises one or more alkyl, alkenyl, alkynyl, aryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or heterocyclic group, and wherein D is alkyl, heteroatom-containing alkyl, aryl, substituted aryl, heteroaryl, substituted heteroaryl, arylalkenyl and substituted arylalkenyl, E is chalcogen being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn, and R is independently alkyl, alkynyl, alkylaryl, aryl or cycloalkyl.

Item 22. The light-emitting device of any one of items 20-21, wherein the light-emitting layer or emissive layer is prepared using vacuum deposition or solution processing technique.

Item 23. A light-emitting device with an ordered structure comprising an anode, a hole-transporting layer, a light-emitting layer, an electron-transporting layer and a cathode wherein the light-emitting layer comprises a gold(III) compound having a chemical structure:

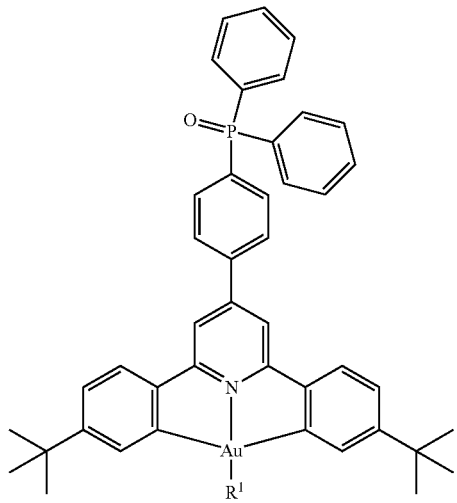

wherein $R^1$ is triphenylamine, 4-(tert-butyl)phenyl, or $R^1$ is any one of the following structures:

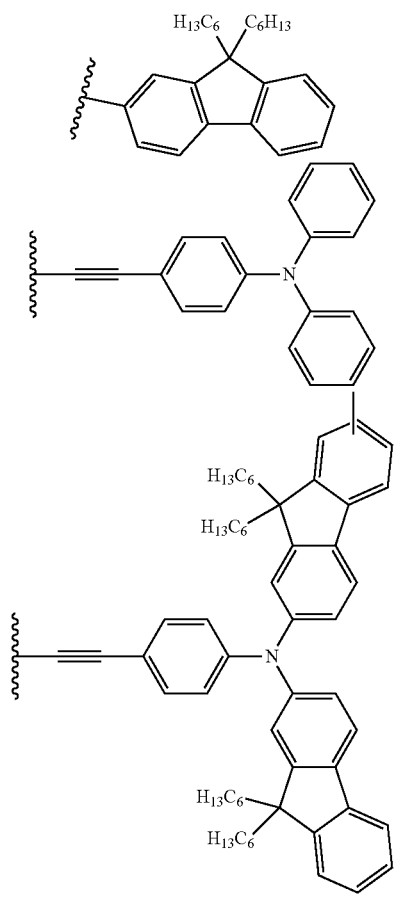

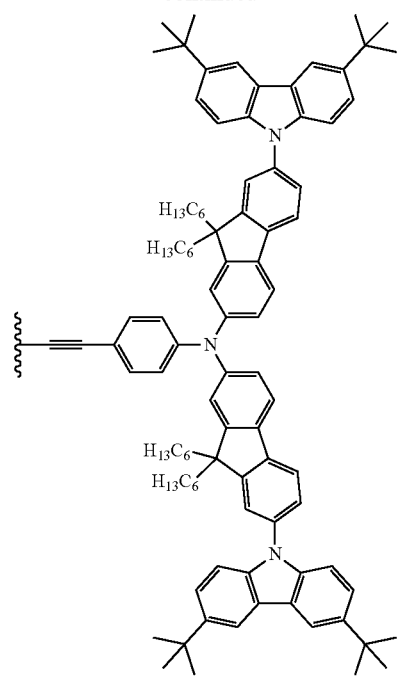

Item 24. A light-emitting device with an ordered structure comprising an anode, a hole-transporting layer, a light-emitting layer, an electron-transporting layer and a cathode wherein the light-emitting layer comprises a gold(III) compound having a chemical structure represented by one of the following formula:

Compound 7

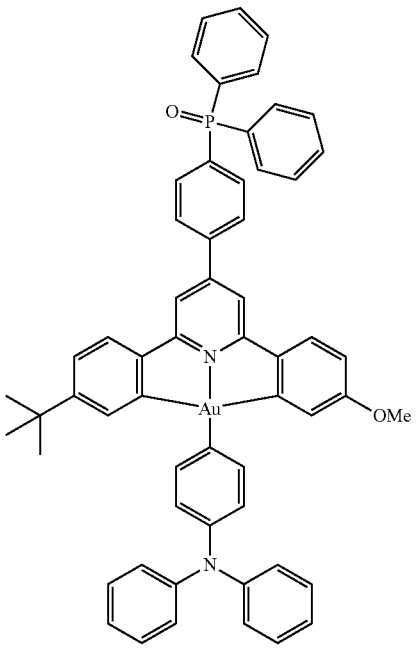

Compound 8
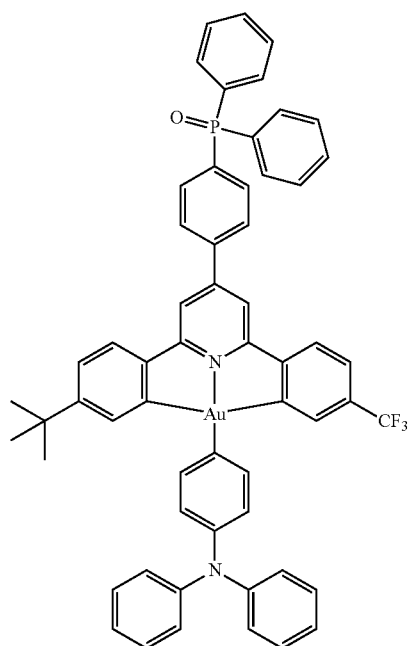
Compound 9
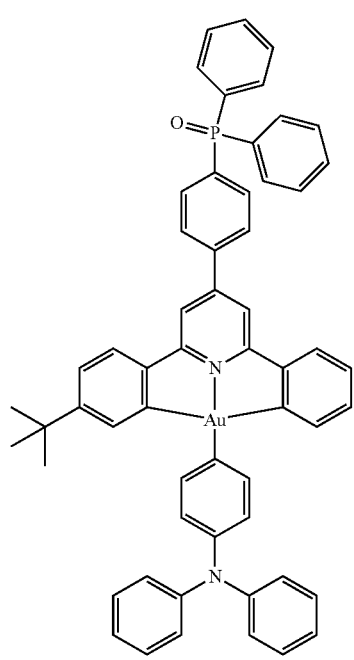
Compound 10
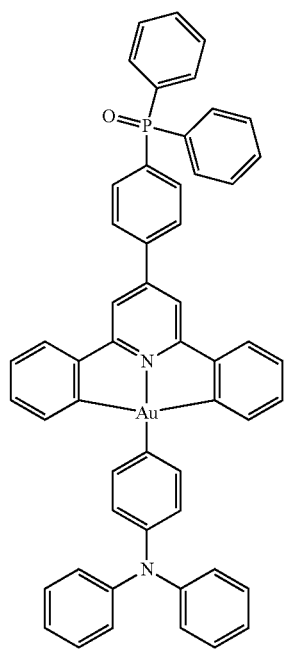
Compound 11
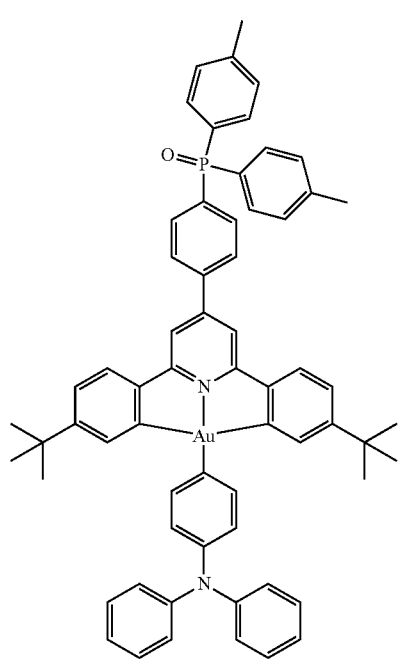

Compound 12
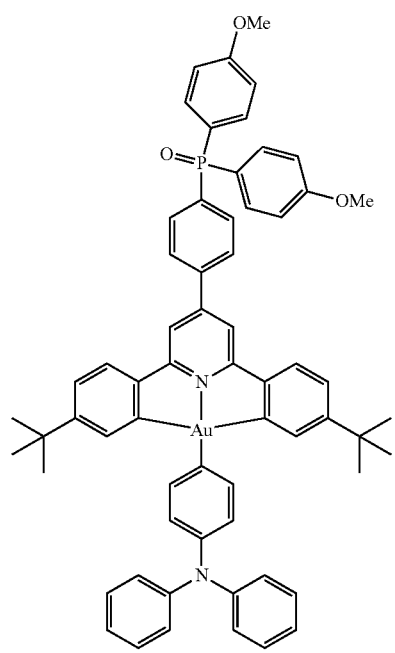
Compound 13
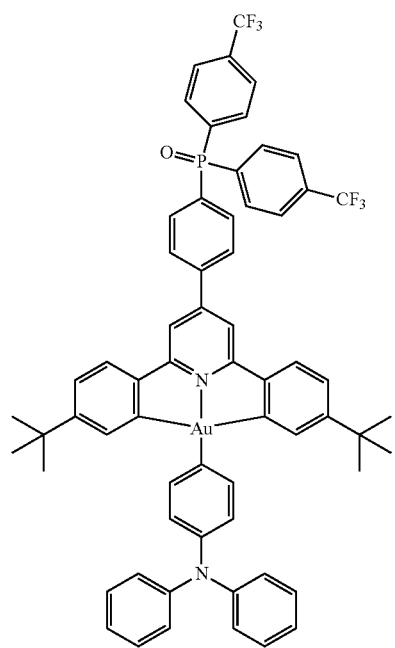
Compound 14
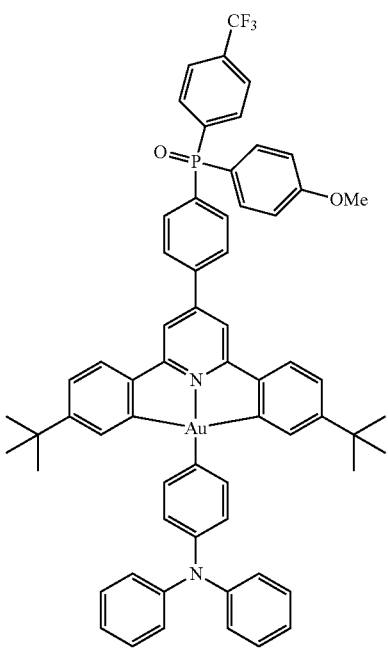
Compound 15
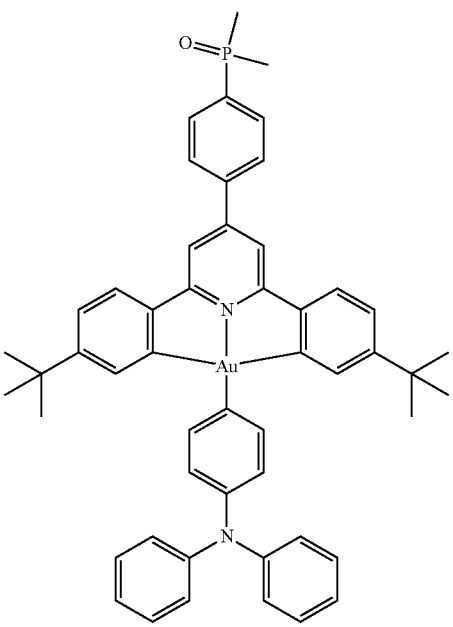

Compound 16
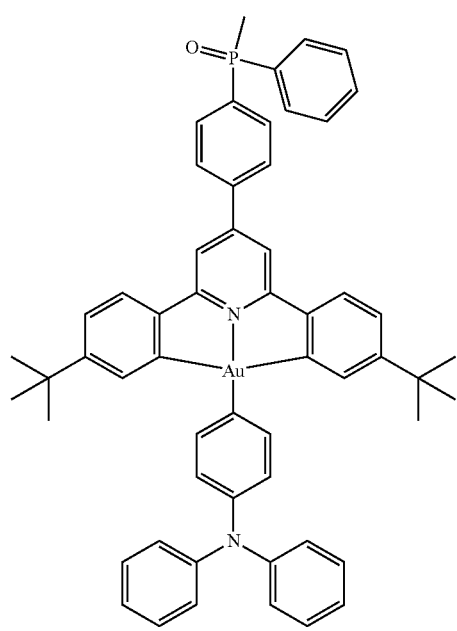
Compound 17
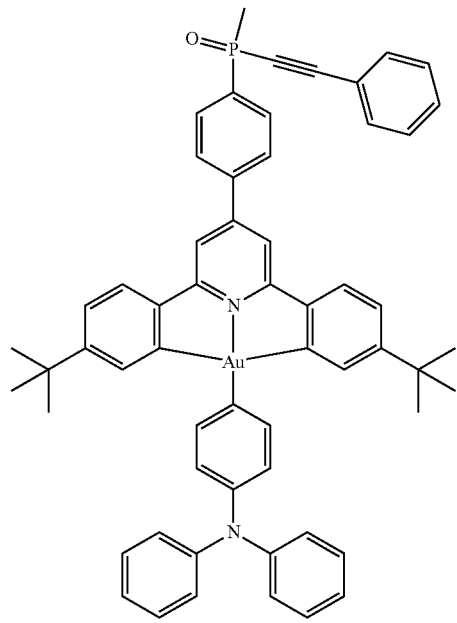
Compound 18
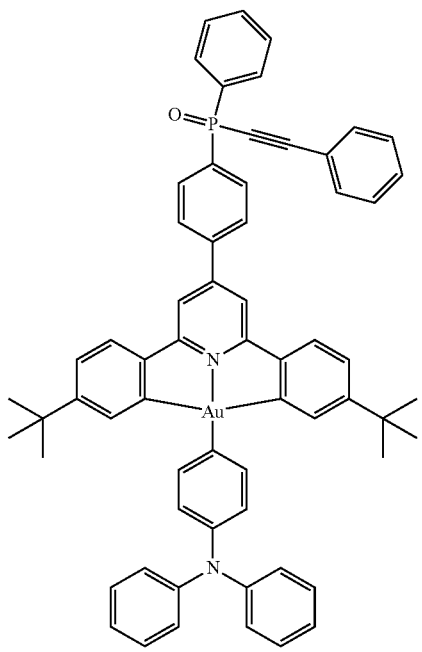
Compound 19
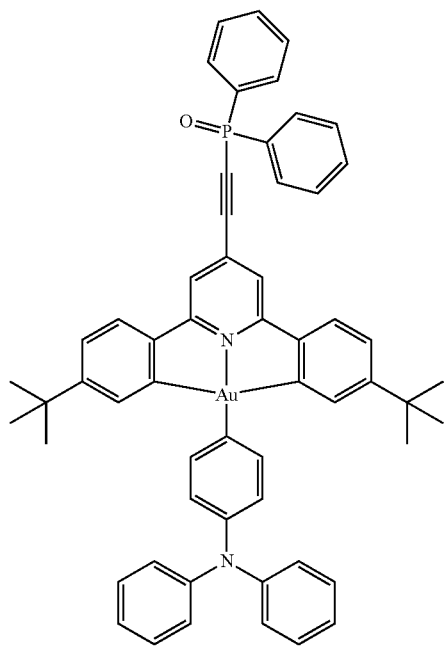

Compound 20
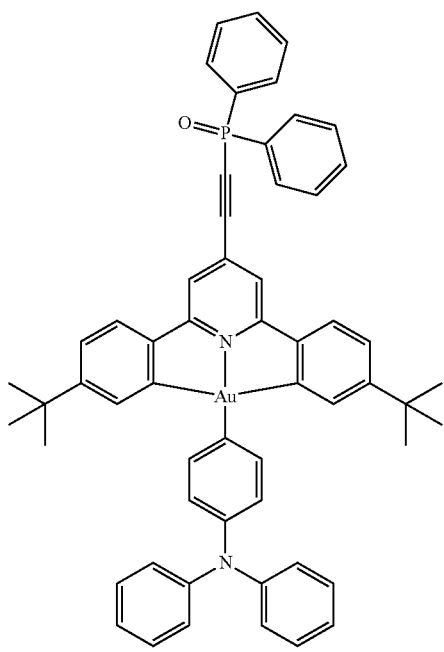
Compound 21
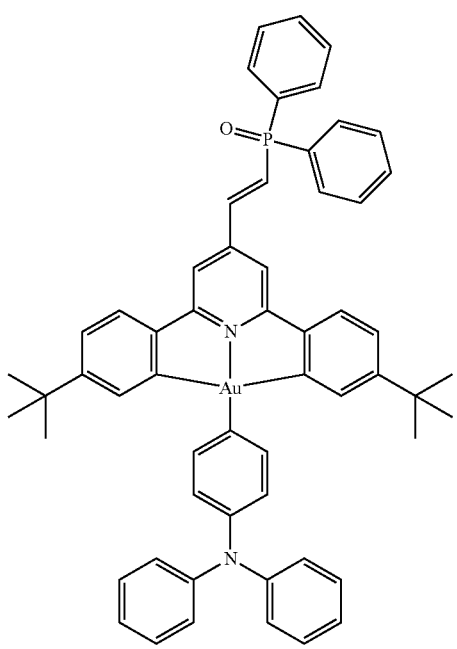
Compound 22
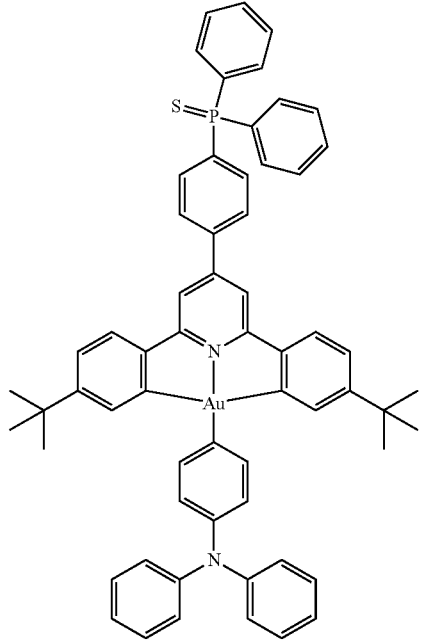
Compound 23
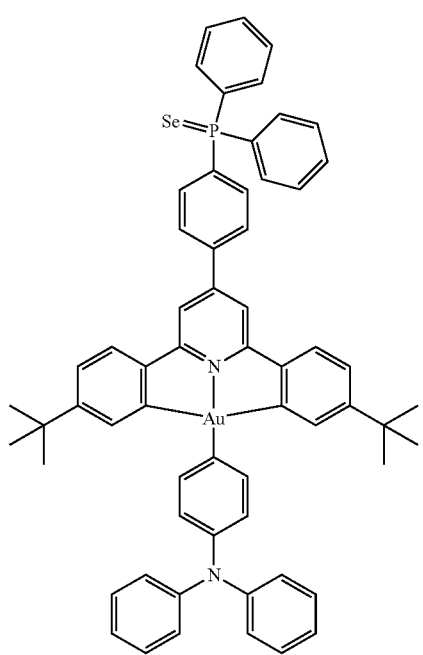

Compound 24
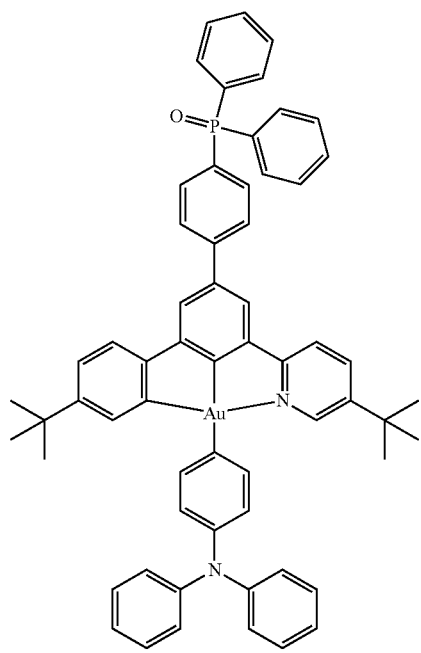
Compound 25
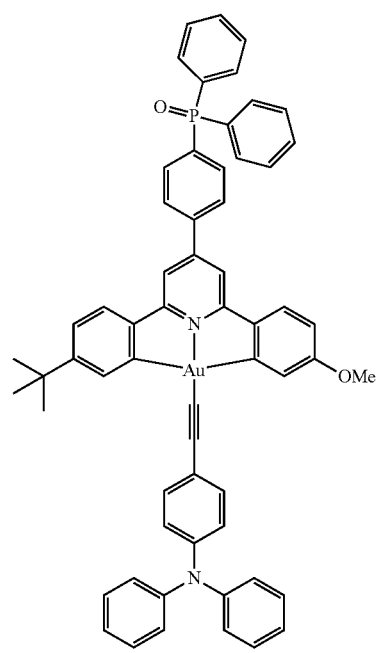
Compound 26
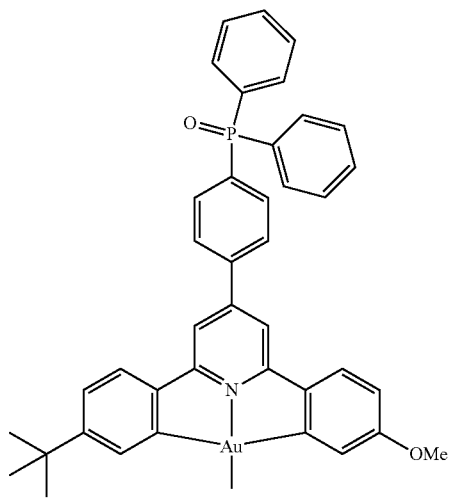
Compound 27
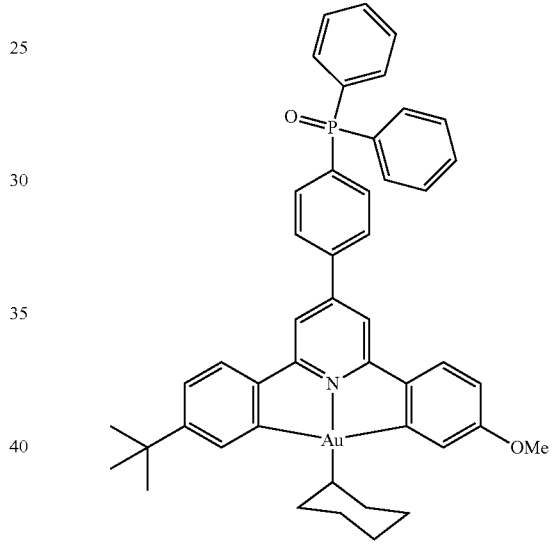
Compound 28
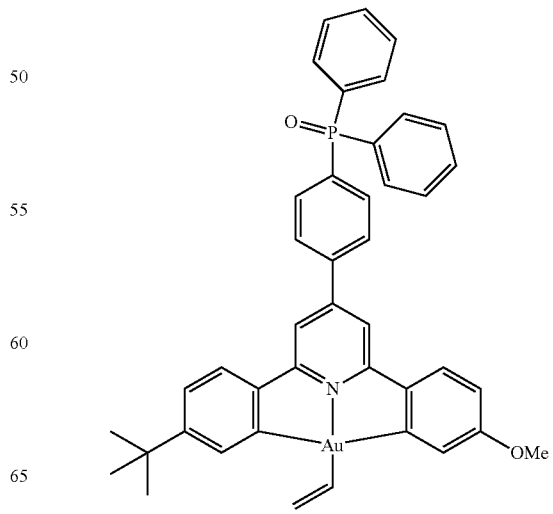

Compound 29
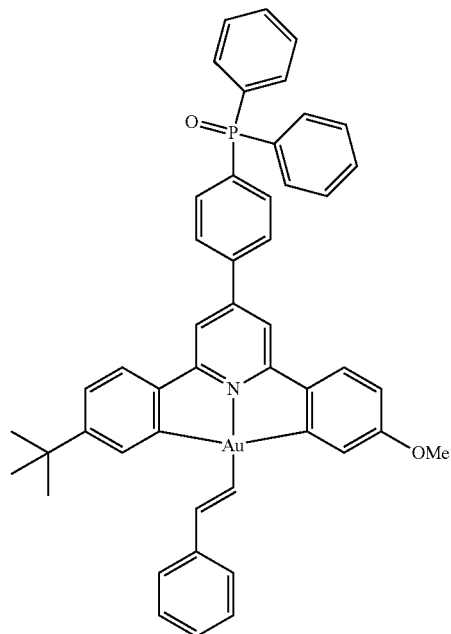
Compound 30
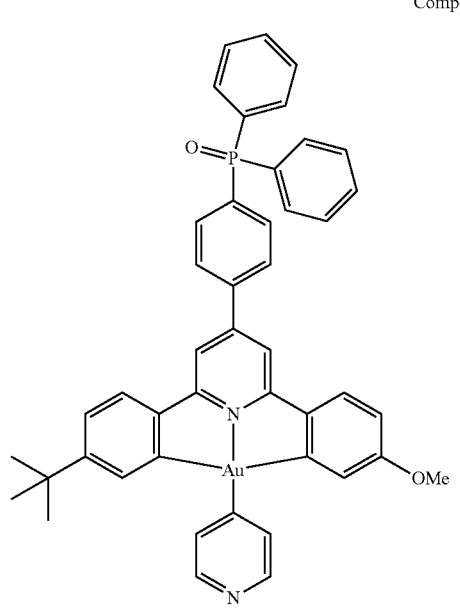
Compound 31
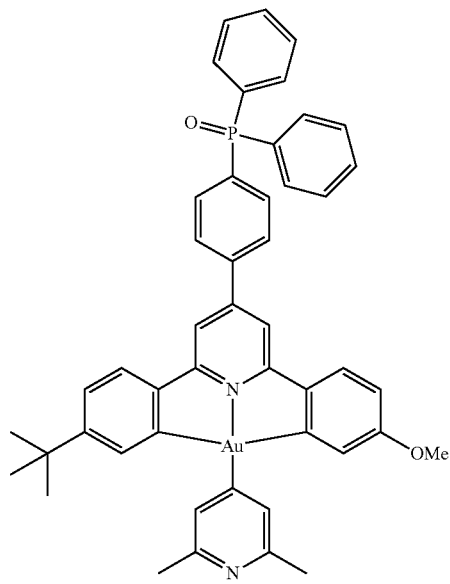
Compound 32
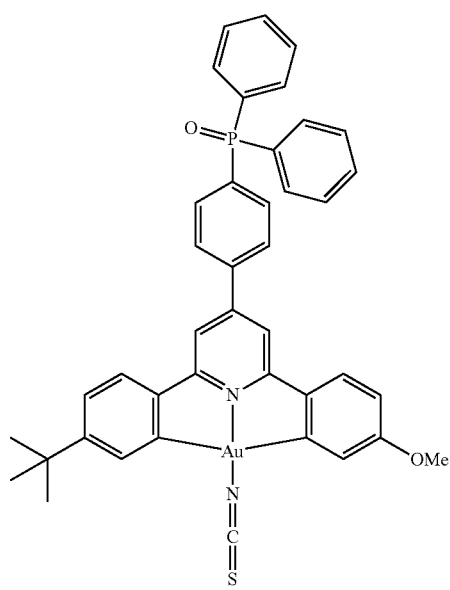

Compound 33
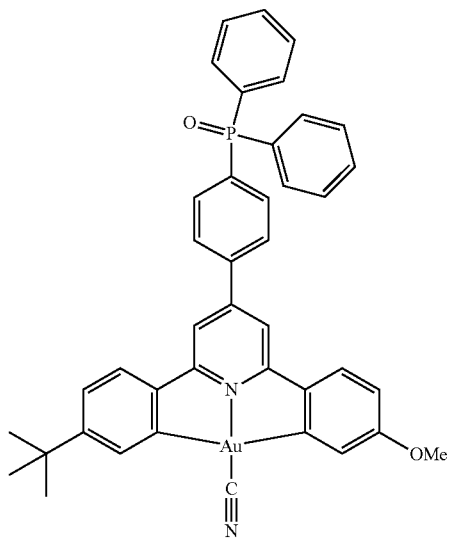
Compound 35
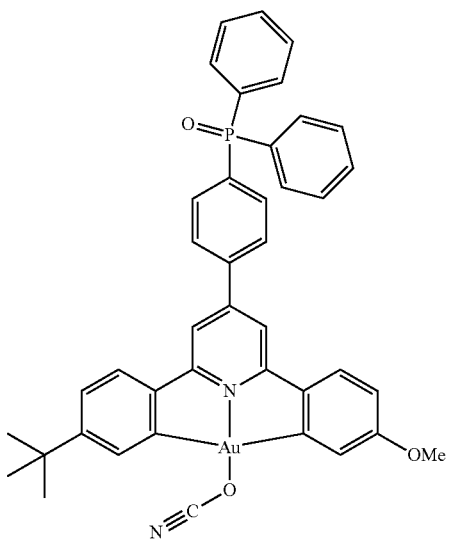
Compound 34
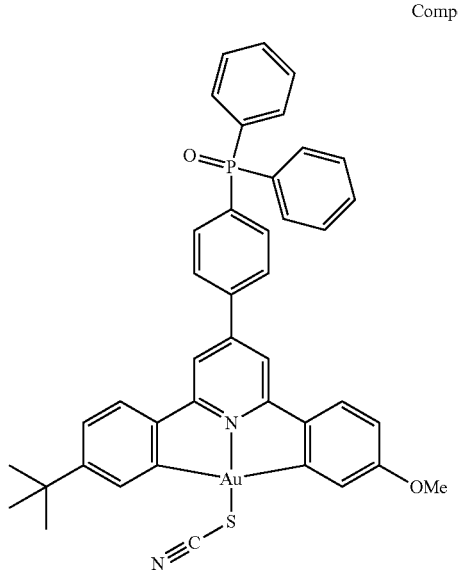
Compound 36
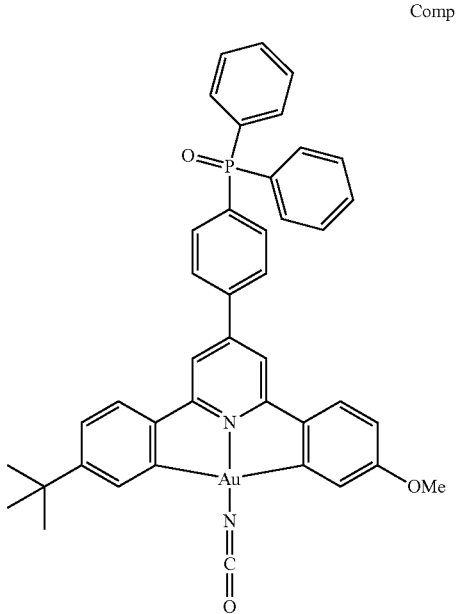

Compound 37
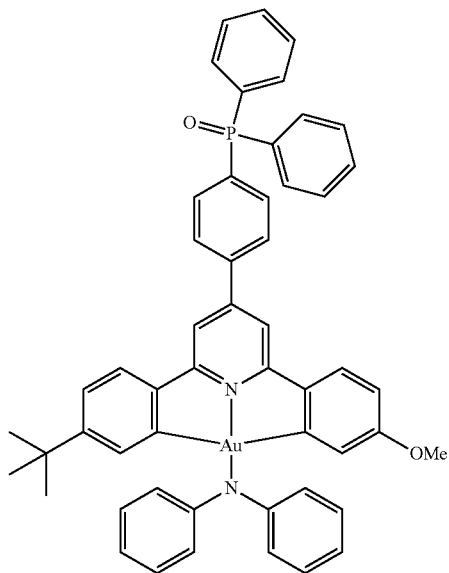
Compound 38
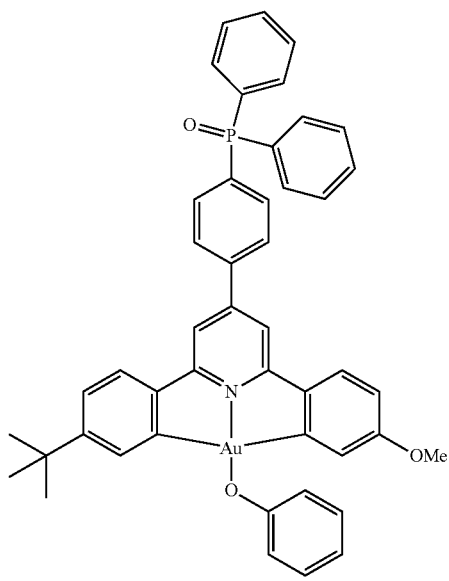
Compound 39
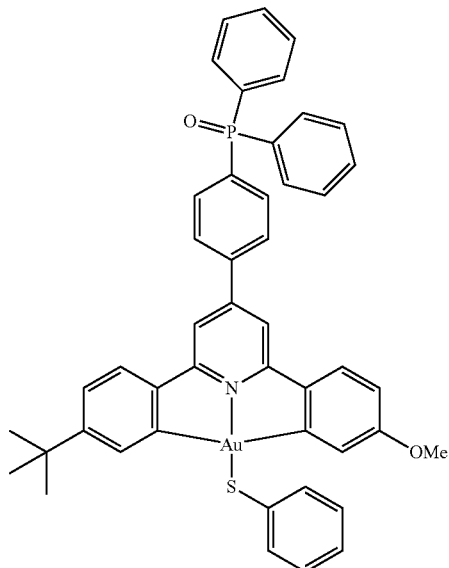
Compound 40
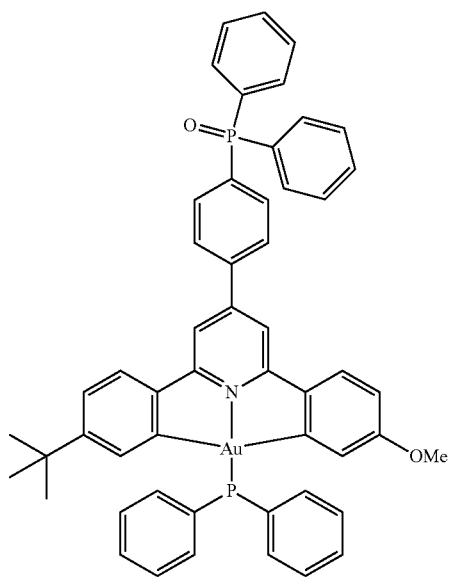

Compound 41
Compound 42
Compound 43
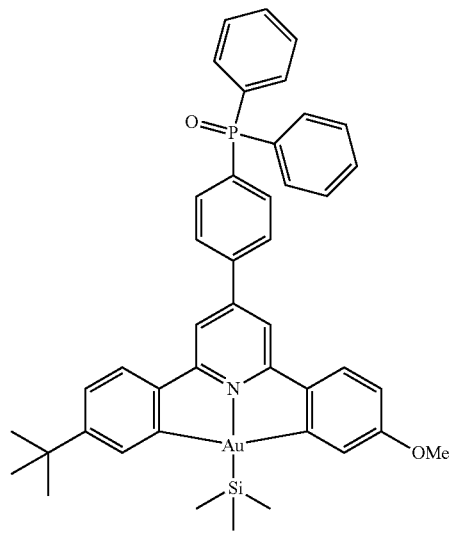
Compound 44
Compound 45
Compound 46
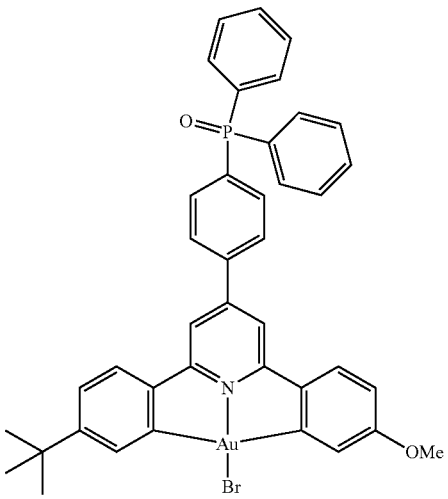
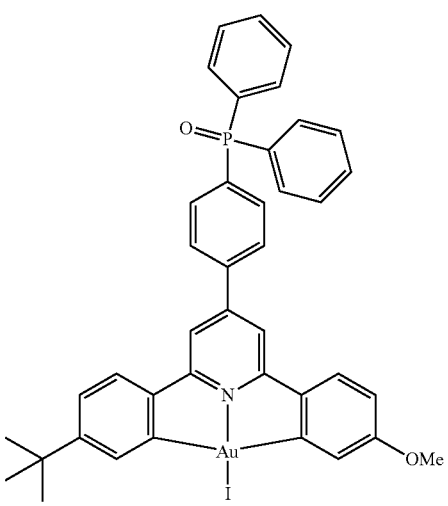
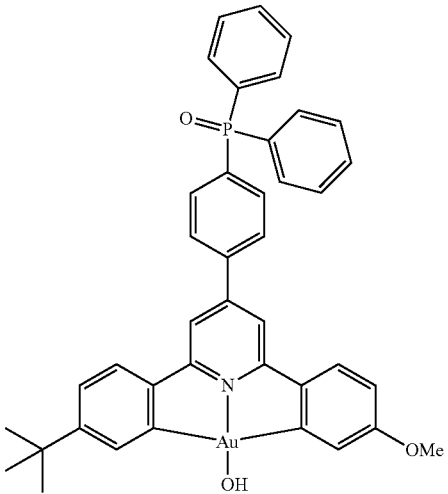

Compound 47

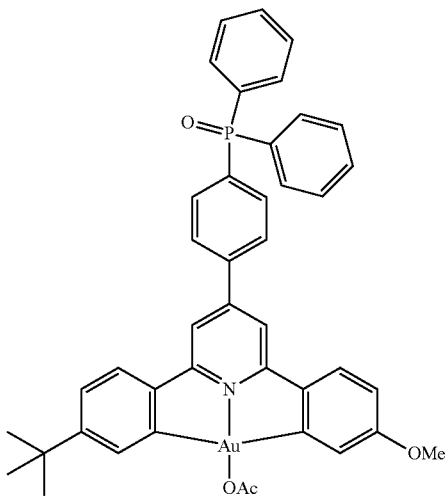

Compound 48

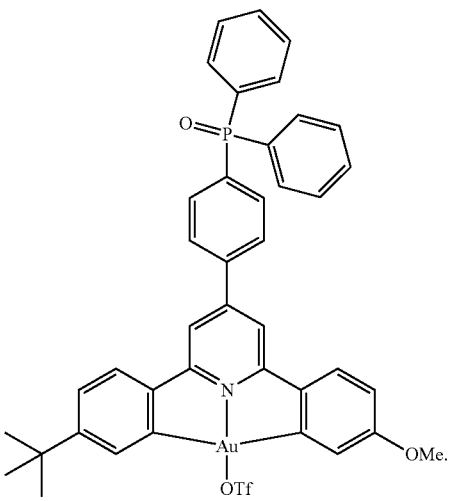

Item 25. An apparatus comprising:
a compound as described in any one of the preceding items, and wherein the apparatus is selected from a television, a copier, a printer, a liquid crystal display, a measuring instrument, a display board, a marker lamp, an electrophotographic photoreceptor, a photoelectric transducer, a solar cell or an image sensor, such that the apparatus incorporates the compound for light emission or light absorption purposes.

Throughout the specification, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. Similarly, the phrase "one or more embodiments" as used herein does not necessarily refer to the same embodiment and the phrase "at least one embodiment" as used herein does not necessarily refer to a different embodiment. The intention is, for example, that claimed subject matter includes combinations of example embodiments in whole or in part.

The foregoing description of the specific embodiments will so fully reveal the general nature of the disclosure that others can, by applying knowledge within the skill of the relevant art(s) (including the contents of the documents cited and incorporated by reference herein), readily modify and/or adapt for various applications such specific embodiments, without undue experimentation, without departing from the general concept of the present disclosure.

Such adaptations and modifications are therefore intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one skilled in the relevant art(s).

While various embodiments of the present disclosure have been described above, it should be understood that they have been presented by way of example, and not limitation. It would be apparent to one skilled in the relevant art(s) that various changes in form and detail could be made therein without departing from the spirit and scope of the disclosure. Thus, the present disclosure should not be limited by any of the above-described exemplary embodiments, but should be defined only in accordance with the following claims and their equivalents.

What is claimed:

1. A luminescent gold(III) compound according to structure (I):

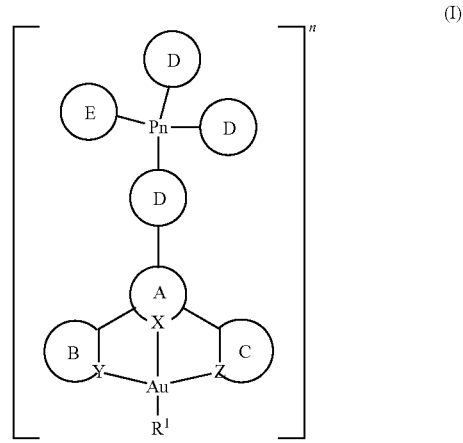

wherein:
(a) X is nitrogen or carbon;
(b) Y and Z are nitrogen or carbon;
(c) A is benzene, phenyl derivatives, heterocycle or heterocyclic derivatives;
(d) B and C are independently benzene, phenyl derivatives, heterocycle or heterocyclic derivatives;
(e) D is any alkyl, cyclic aliphatic or aromatic structures, in which each D group can be identical or non-identical;
(f) Pn is pnictogen selected from nitrogen, phosphorus, arsenic and bismuth;
(g) E can be any chalcogen selected from oxygen, sulphur, selenium, tellurium, being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn;

(h) R¹ is any carbon or heteroatom donor ligand, halide or pseudohalide, which could be either monoanionic or neutral, wherein R¹ is selected from alkyl, substituted alkyl, aryl, substituted aryl, heteroaryl, substituted heteroaryl, heterocyclic aryl, substituted heterocyclic aryl, alkynyl, substituted alkynyl, alkoxy, amide, thiolate, phosphide, chloride, bromide, iodide, cyanate, thiocyanate or cyanide; and (i) n is zero, a positive integer or a negative integer.

2. The gold(III) compound according to claim 1, wherein the compound is deposited as a thin layer of 10-100 nm thick on a substrate layer.

3. The gold(III) compound according to claim 1, wherein the thin layer is deposited by vacuum deposition, spin-coating, or inkjet printing.

4. The gold(III) compound according to claim 1, wherein the compound has photoluminescence properties within a range of 380 to 1050 nm.

5. The gold(III) compound according to claim 1, wherein the compound emits light in response to the passage of an electric current or to a strong electric field through the compound.

6. The gold(III) compound according to claim 1, wherein the compound is used to fabricate an OLED.

7. The gold(III) compound according to claim 1, wherein the gold(III) compound serves as the light-emitting layer of the OLED.

8. The gold(III) compound according to claim 1, wherein the gold(III) compound serves as a dopant in the light-emitting layer or emissive layer of the OLED.

9. The gold(III) compound according to claim 1, wherein the emission energy of the compound is dependent on the concentration of the gold(III) dopant and with donor groups on the auxiliary ligand, in which the donor group is selected from, but is not limited to, N, S, O, P.

10. The gold(III) compound according to claim 1, wherein the emission energy of the compound is independent of the concentration of the gold(III) compound without donor group on the auxiliary ligand, in which the donor group is selected from, but is not limited to, N, S, O, P.

11. The gold(III) compound according to claim 1, wherein when A, B and C are independently benzene, phenyl derivatives, heterocycle or heterocyclic derivatives, the benzene, phenyl derivatives, heterocycle or heterocyclic derivatives comprises one or more alkyl, alkenyl, alkynyl, aryl, cycloalkyl, OR, NR₂, SR, C(O)R, C(O)OR, C(O)NR₂, CN, CF₃, NO₂, SO₂, SOR, SO₃R, halo, aryl, substituted aryl, heteroaryl, substituted heteroaryl or heterocyclic group, and wherein D is alkyl, heteroatom-containing alkyl, aryl, substituted aryl, heteroaryl, substituted heteroaryl, arylalkenyl and substituted arylalkenyl, E is chalcogen being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn, and R is independently alkyl, alkenyl, alkynyl, alkyaryl, aryl, or cycloalkyl.

12. An apparatus comprising:
a compound as described in claim 1, and wherein the apparatus is selected from a television, a copier, a printer, a liquid crystal display, a measuring instrument, a display board, a marker lamp, an electrophotographic photoreceptor, a photoelectric transducer, a solar cell or an image sensor, such that the apparatus incorporates the compound for light emission or light absorption purposes.

13. A gold(III) compound having the structure:

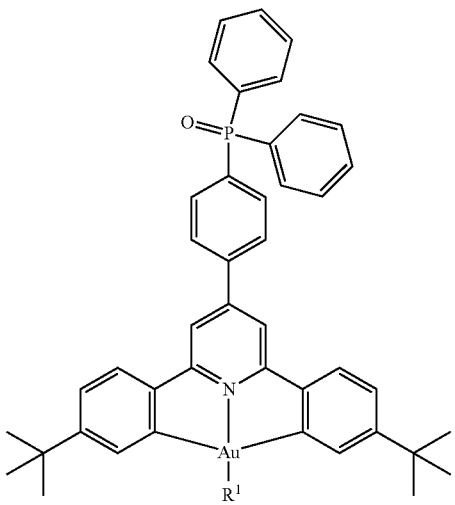

wherein R¹ is triphenylamine, 4-(tert-butyl)phenyl, or R¹ is any one of the following structures:

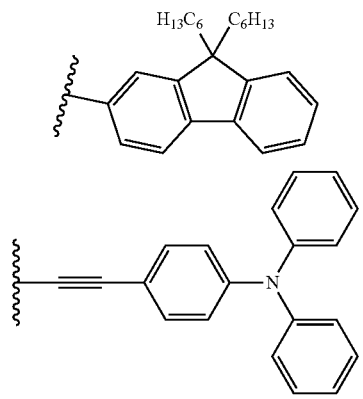

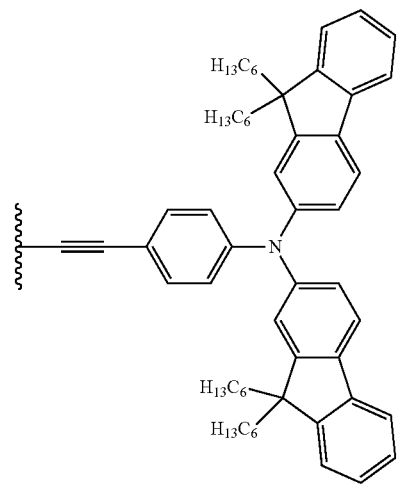

135
-continued
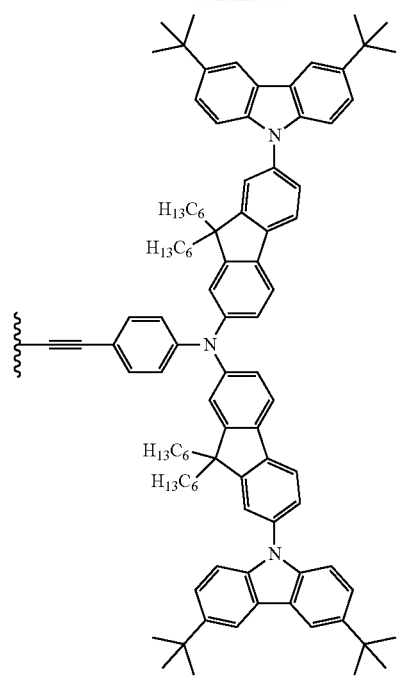
136
-continued
Compound 8
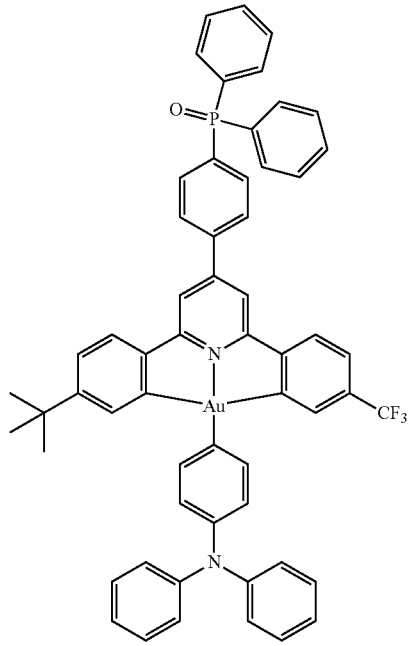
14. A gold(III) compound having one of the following structures:
Compound 7
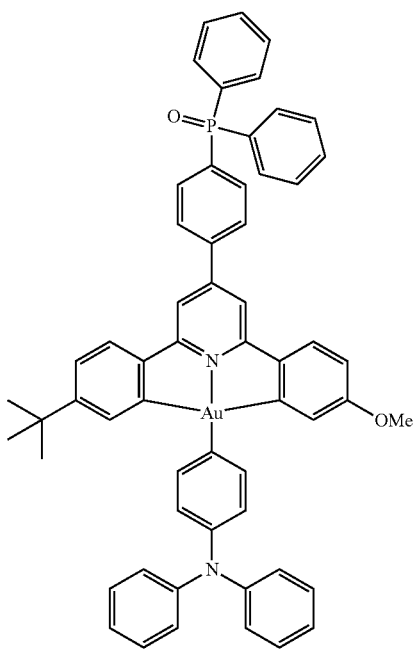
Compound 9
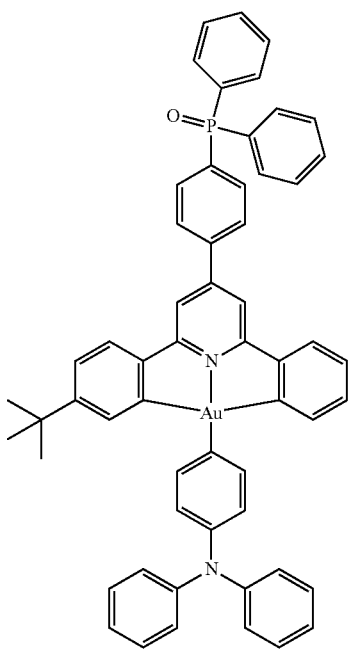

Compound 10
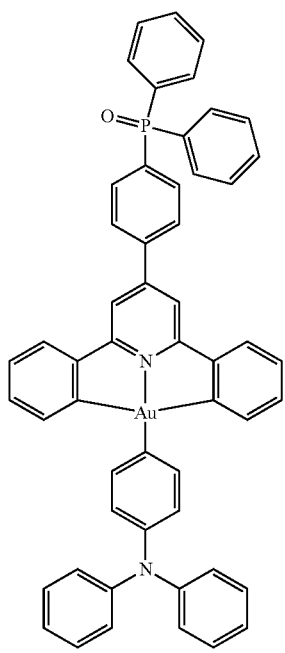
Compound 12
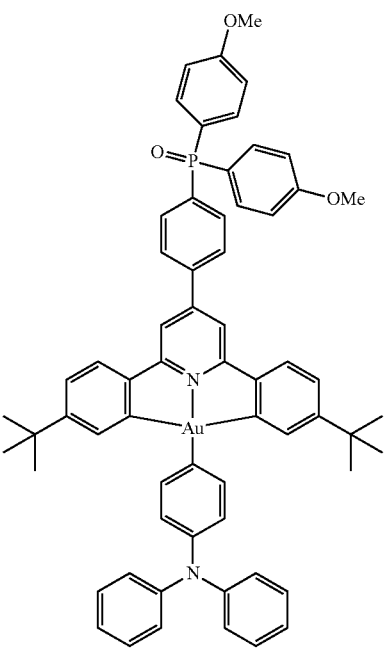
Compound 11
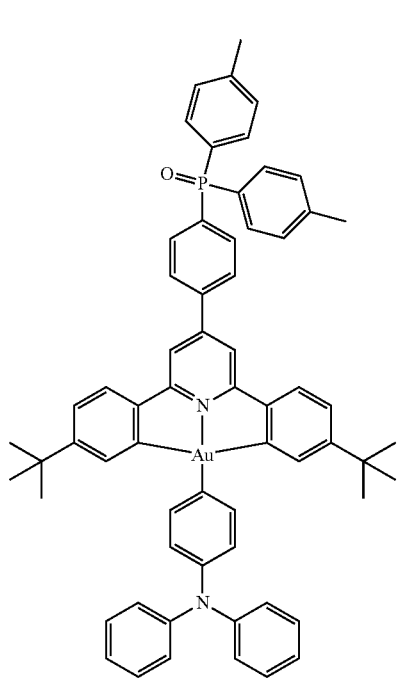
Compound 13
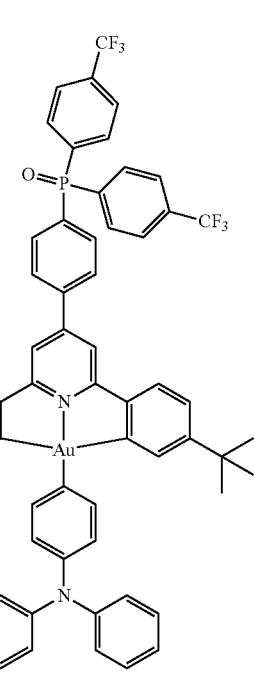

-continued
Compound 14
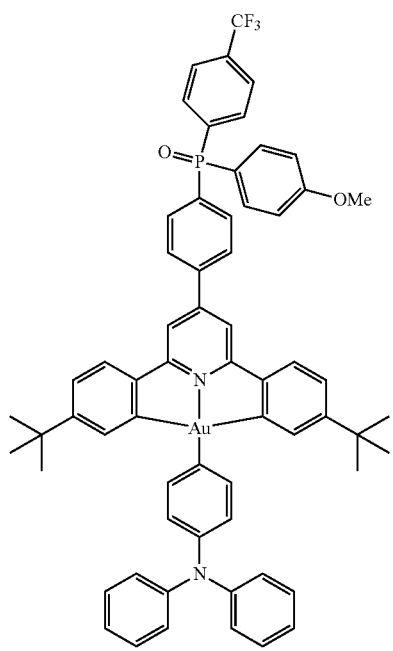
Compound 15
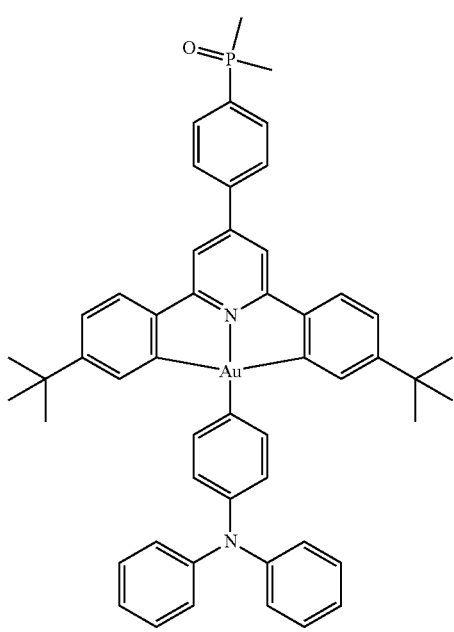
Compound 16
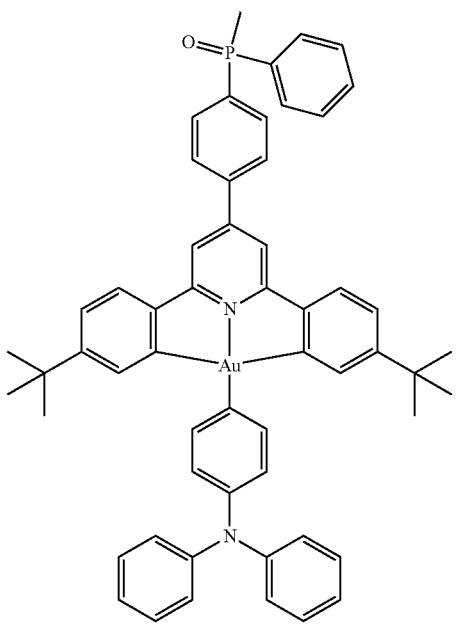
Compound 17
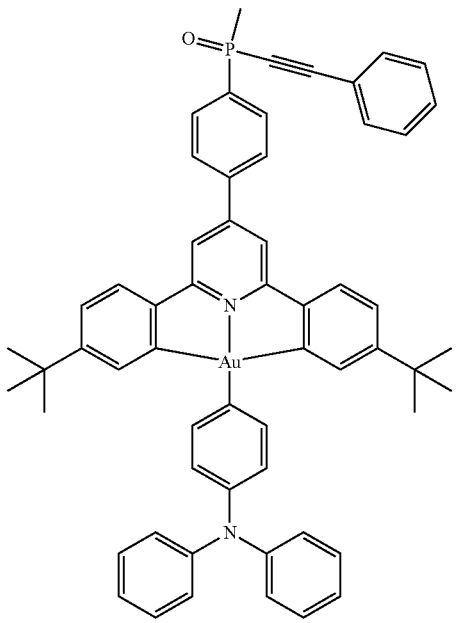

Compound 18
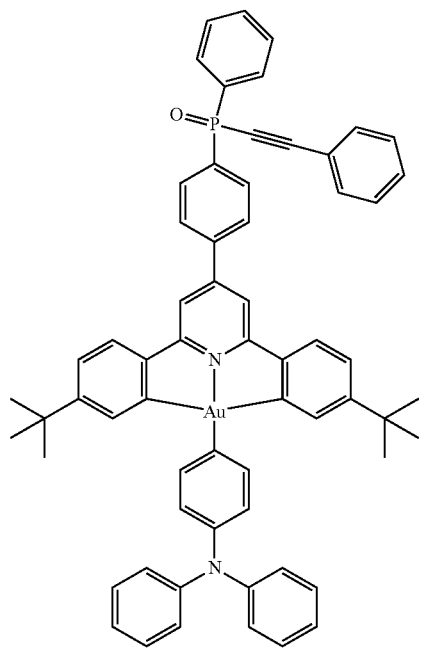
Compound 20
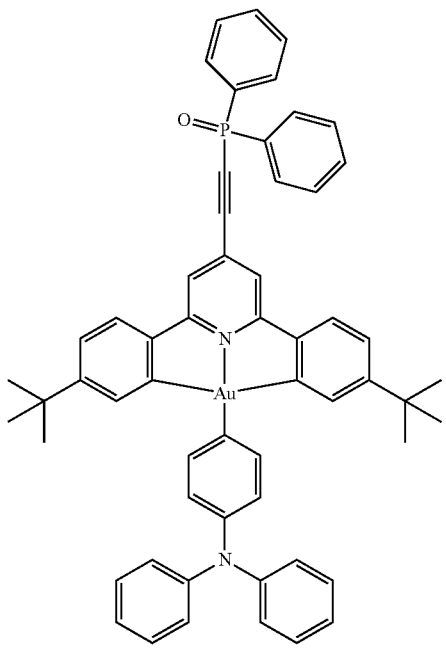
Compound 19
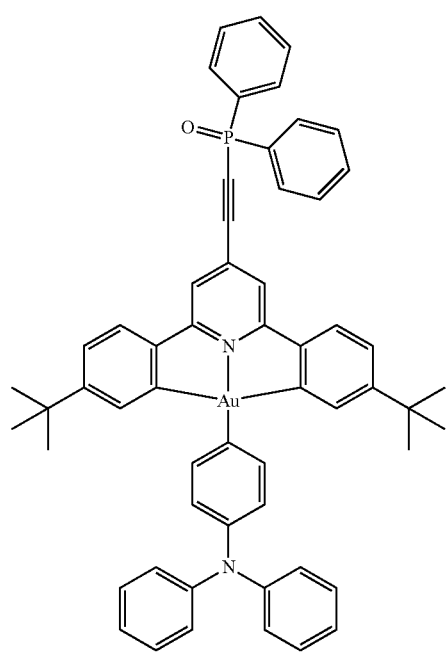
Compound 21
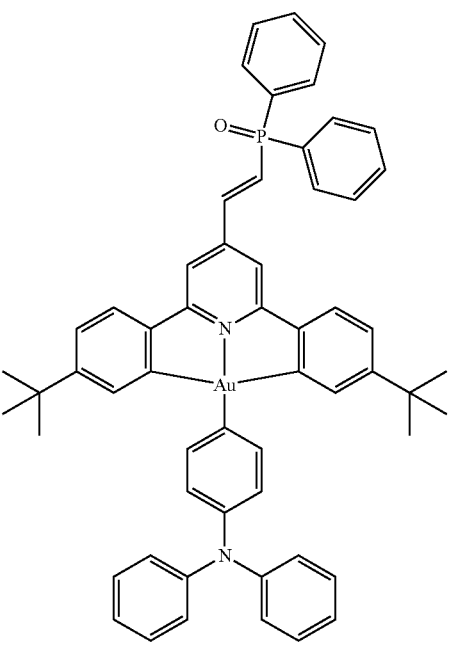

Compound 22
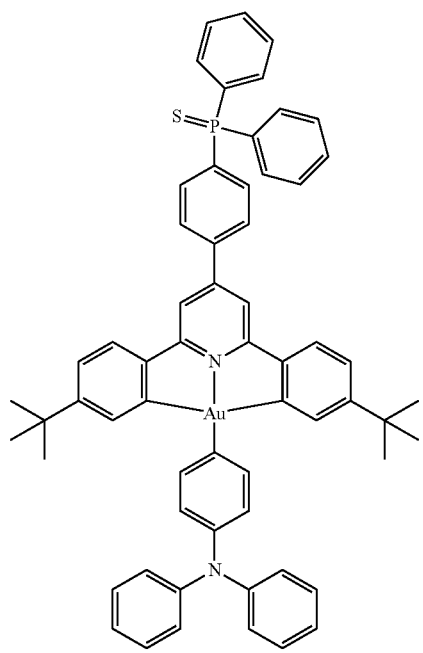
Compound 23
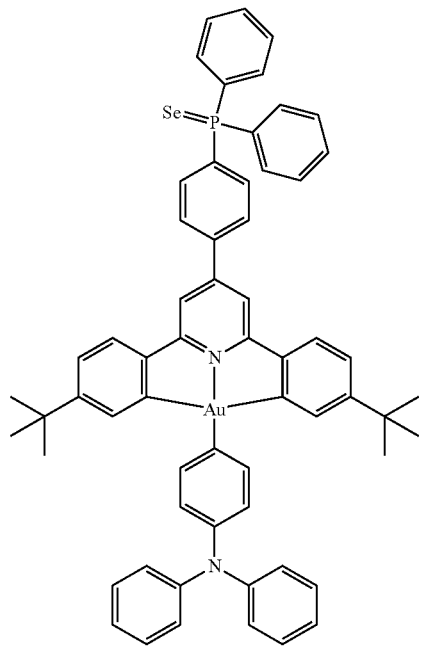
Compound 24
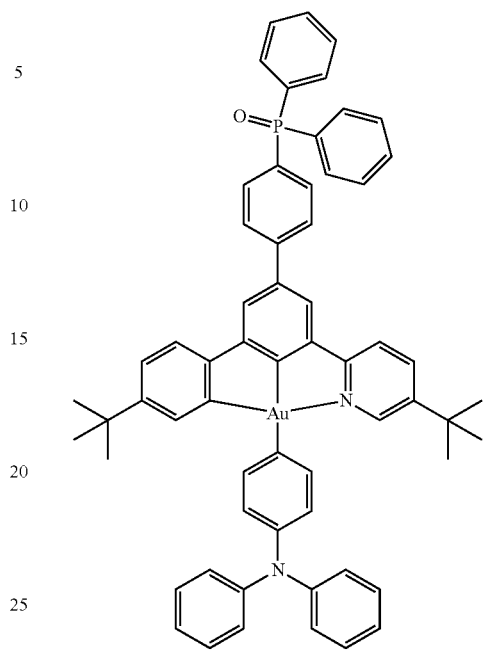
Compound 25
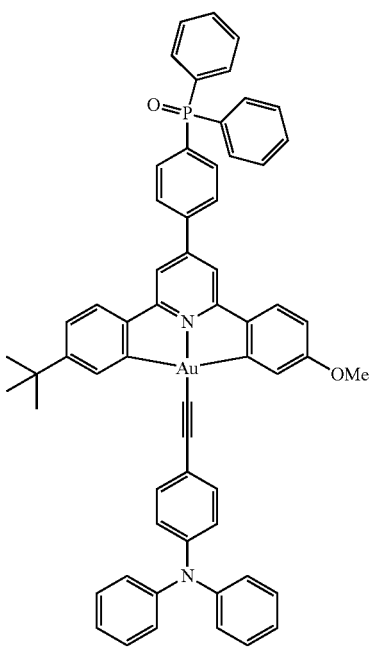

Compound 26
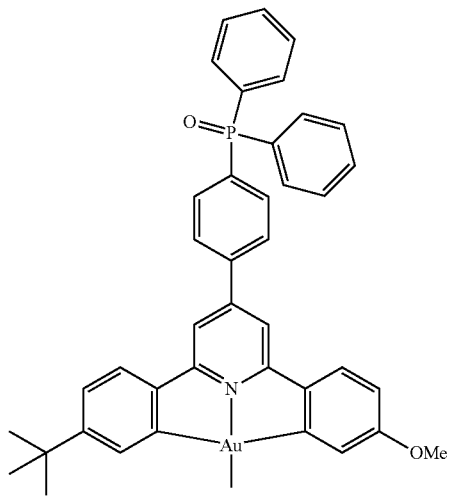
Compound 27
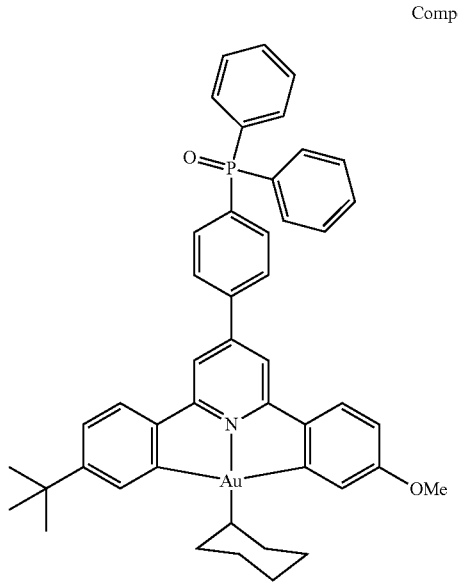
Compound 28
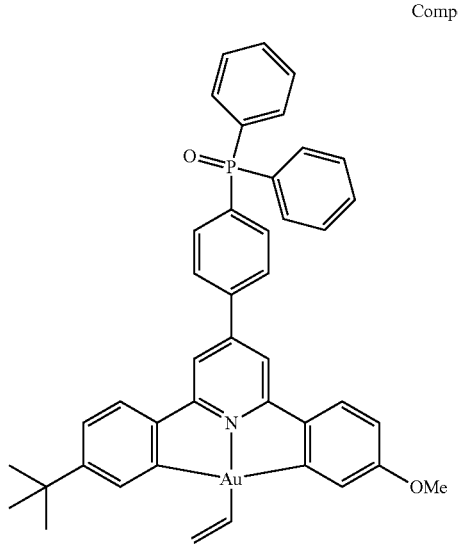
Compound 29
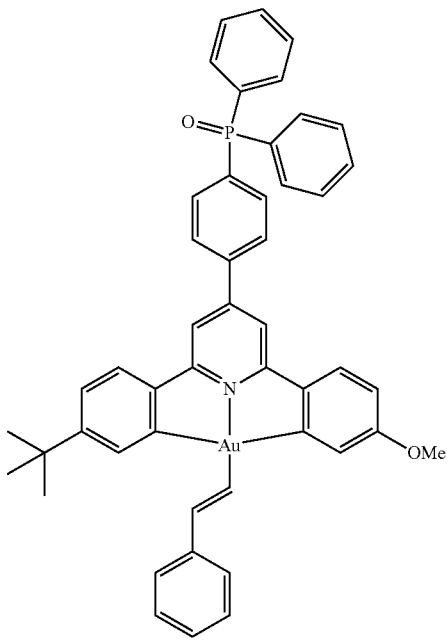
Compound 30
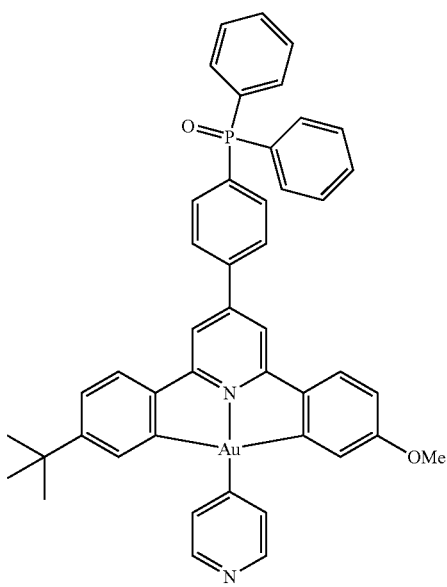

Compound 31
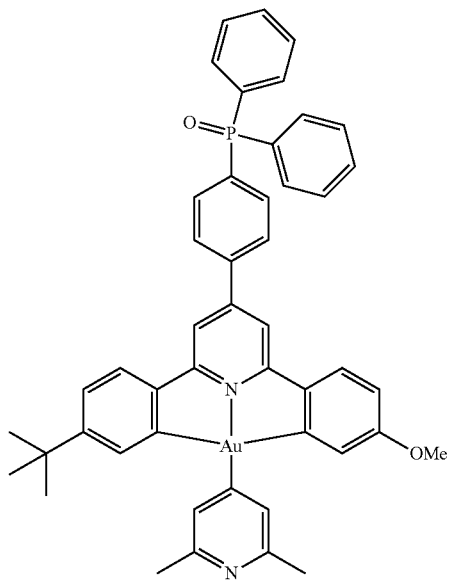
Compound 32
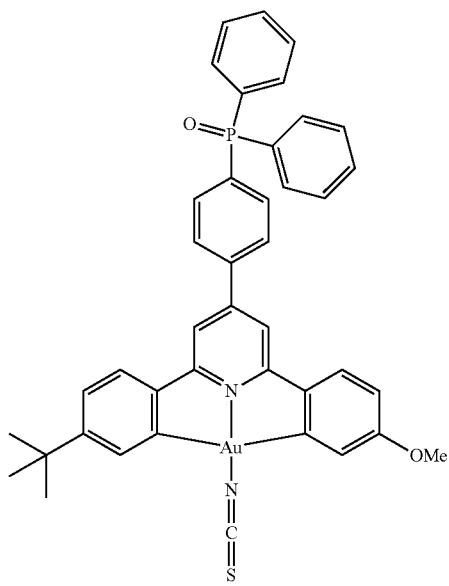
Compound 33
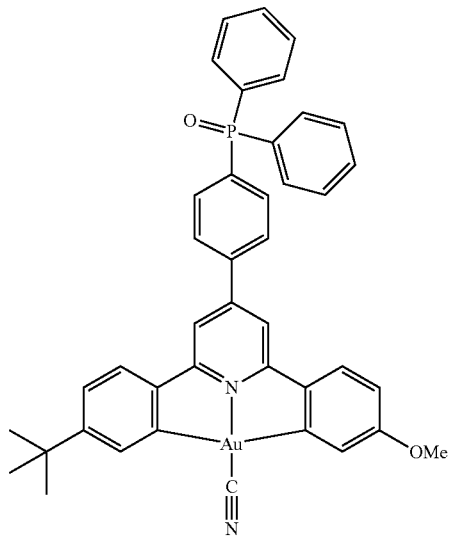
Compound 34
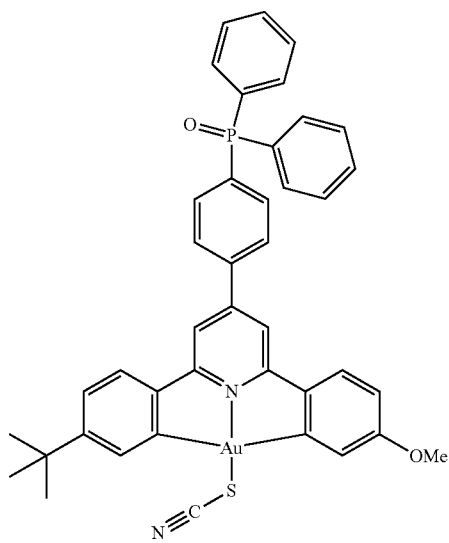

-continued
Compound 35
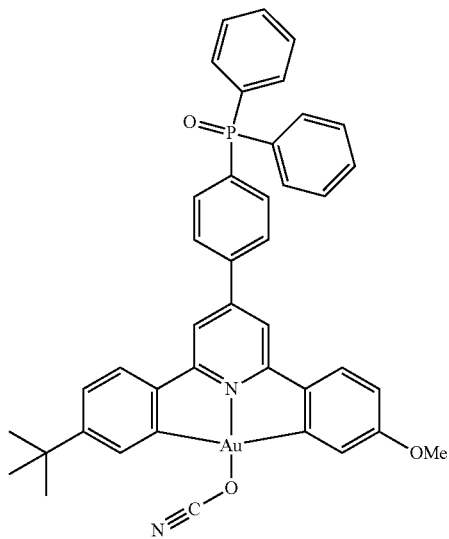
Compound 36
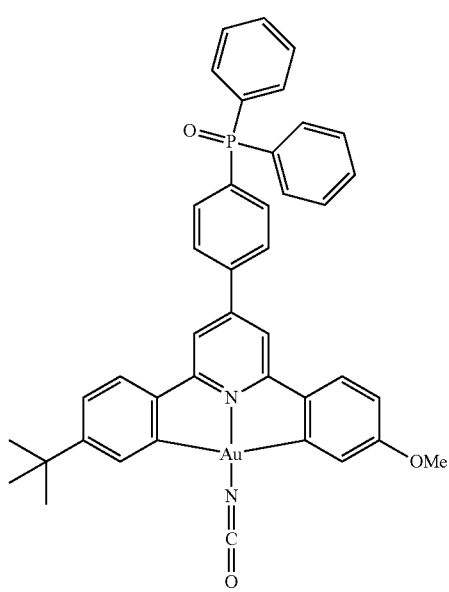
-continued
Compound 37
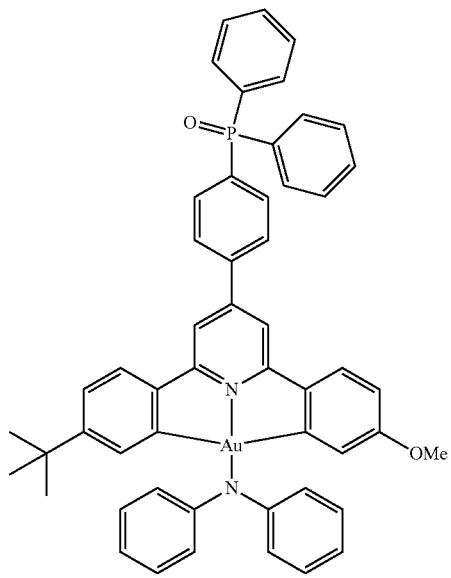
Compound 38
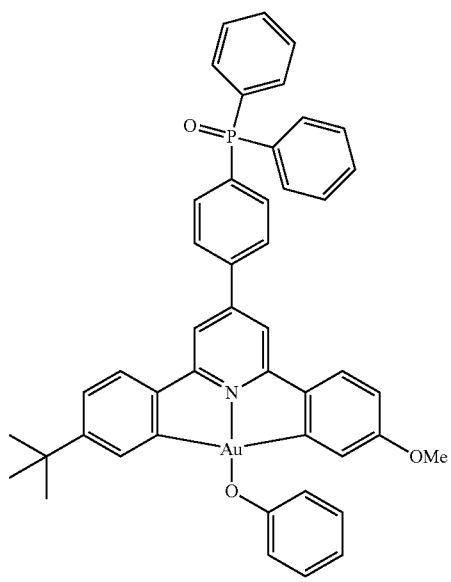

Compound 39
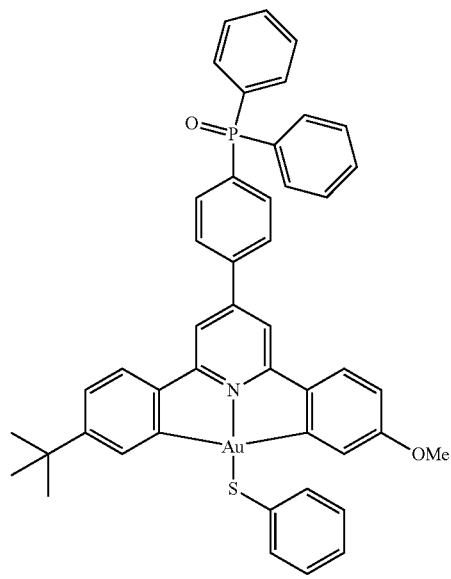
Compound 40
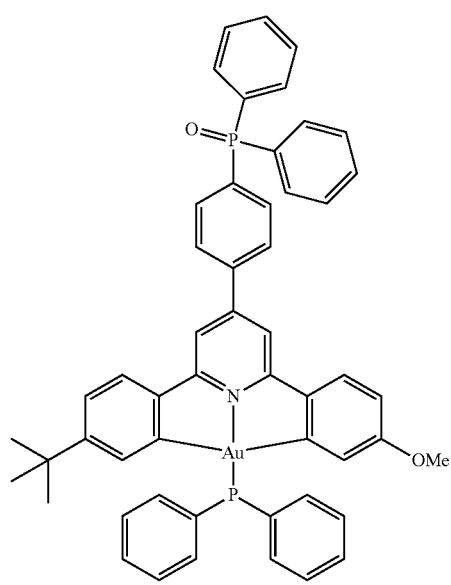
Compound 41
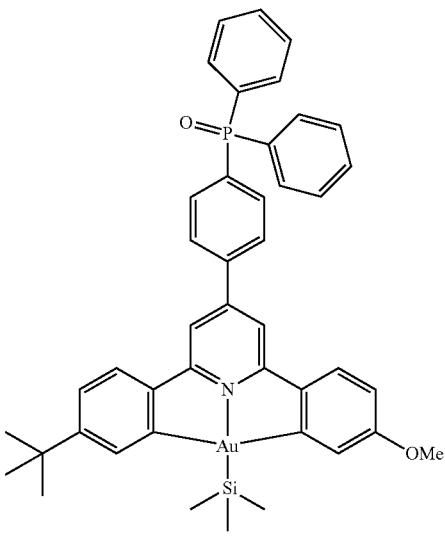
Compound 42
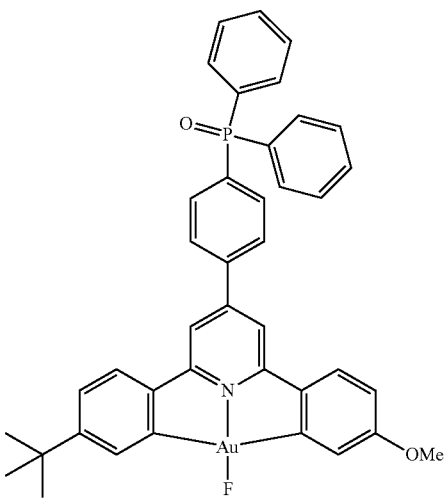
Compound 43
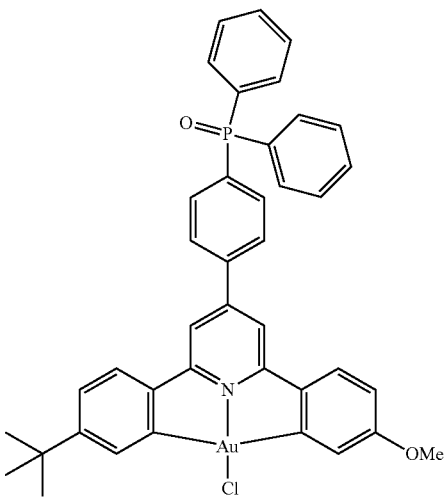

-continued
Compound 44
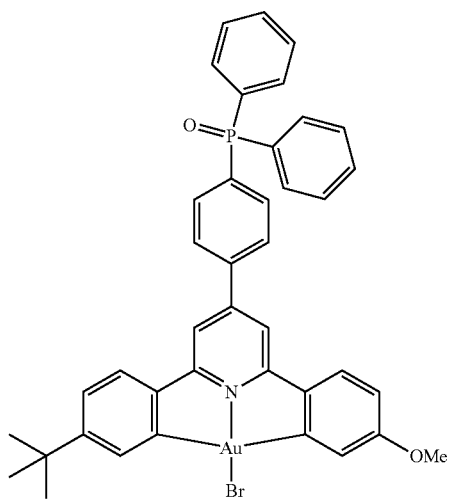
Compound 45
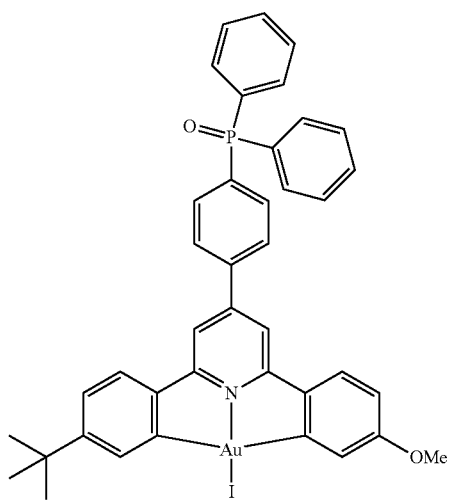
Compound 46
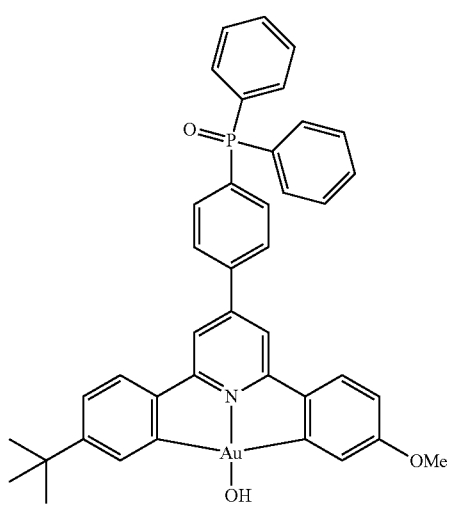
-continued
Compound 47
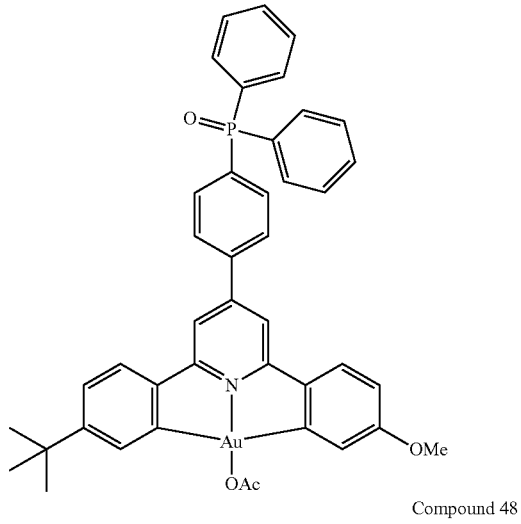
Compound 48
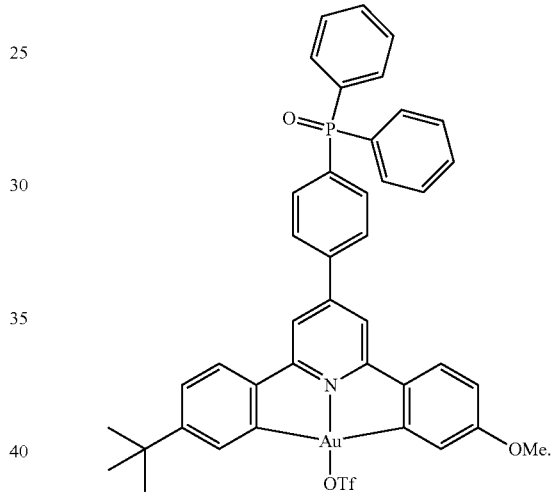
15. A method for preparing a luminescent compound with group 15 element-containing cyclometalating tridentate ligand and at least one aryl or alkynyl group, both coordinated to a gold(III) metal center, comprising the following reaction:
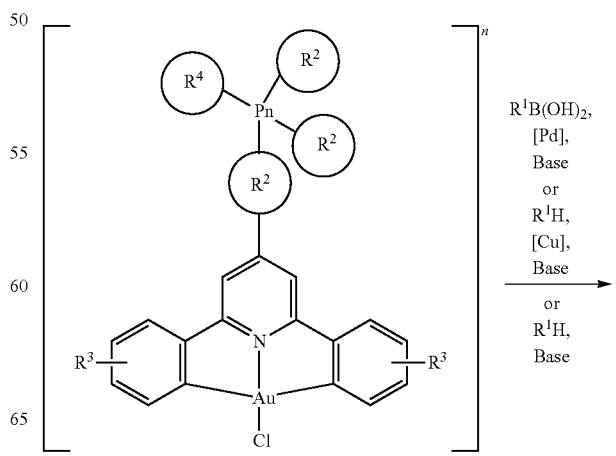

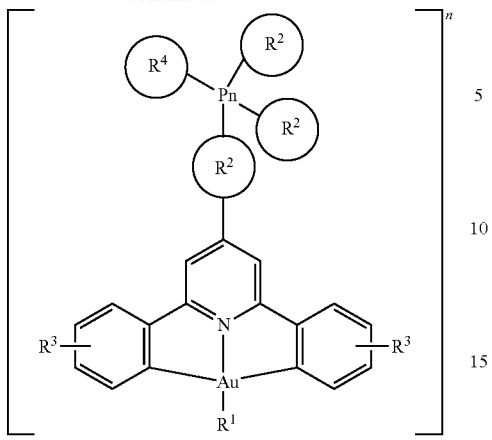

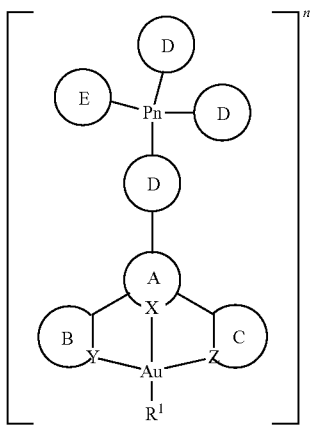

wherein:
(a) $R^1$ is selected from, but is not limited to, alkyl, substituted alkyl, aryl, substituted aryl, heteroaryl, substituted heteroaryl, heterocyclic aryl, substituted heterocyclic aryl, alkynyl or substituted alkynyl, $R^1$ could also be group with heteroatom as the donor atom and is selected from, but not limited to, nitrogen, oxygen, sulphur or phosphorus;
(b) $R^2$ and $R^3$ groups are each independently selected from, but are not limited to, alkyl, alkenyl, alkynyl, alkylaryl, aryl and cycloalkyl with one or more alkyl, alkenyl, alkynyl, alkylaryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or a heterocyclic group, wherein R is independently alkyl, alkynyl, alkylaryl, aryl or cycloalkyl;
(c) $R^4$ can be any chalcogen selected from oxygen, sulphur, selenium, tellurium, being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn;
(d) Pn is pnictogen selected from nitrogen, phosphorus, arsenic and bismuth; and
(e) n is zero, a positive integer or a negative integer.

16. The method according to claim 15, wherein a luminescent compound is prepared.

17. The method according to claim 15, wherein the gold(III) metal center comprises a light-emitting layer of a light-emitting device.

18. The method according to claim 15, wherein the gold(III) metal group comprises a layer of a light-emitting device.

19. The gold(III) compound according to claim 15, wherein the gold(III) metal compound is a dopant included in the light-emitting layer or emissive layer of the light-emitting device.

20. The method according to claim 15, wherein the gold(III) metal compound is a dopant included in a light-emitting device.

21. A light-emitting device with an ordered structure comprising an anode, a hole-transporting layer, a light-emitting layer, an electron-transporting layer and a cathode wherein the light-emitting layer comprises a gold(III) compound having a chemical structure represented by the following general formula (I), wherein:
(a) X is nitrogen or carbon;
(b) Y and Z are nitrogen or carbon;
(c) A is benzene, phenyl derivatives, heterocycle or heterocyclic derivatives;
(d) B and C are independently benzene, phenyl derivatives, heterocycle or heterocyclic derivatives;
(e) D is any alkyl, cyclic aliphatic or aromatic structures, in which each D group can be identical or non-identical;
(f) Pn is pnictogen selected from nitrogen, phosphorus, arsenic and bismuth;
(g) E can be any chalcogen selected from oxygen, sulphur, selenium, tellurium, being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn;
(h) $R^1$ is any carbon or heteroatom donor ligand, halide or pseudohalide, which could be either monoanionic or neutral, $R^1$ is selected from, but not limited to, alkyl, substituted alkyl, aryl, substituted aryl, heteroaryl, substituted heteroaryl, heterocyclic aryl, substituted heterocyclic aryl, alkynyl, substituted alkynyl, alkoxy, amide, thiolate, phosphide, chloride, bromide, iodide, cyanate, thiocyanate or cyanide; and
(i) n is zero, a positive integer or a negative integer.

22. The light-emitting device of claim 21 wherein when A, B and C are independently benzene, phenyl derivatives, heterocycle or heterocyclic derivatives, the benzene, phenyl derivatives, heterocycle or heterocyclic derivatives comprises one or more alkyl, alkenyl, alkynyl, aryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or heterocyclic group, and wherein D is alkyl, heteroatom-containing alkyl, aryl, substituted aryl, heteroaryl, substituted heteroaryl, arylalkenyl and substituted arylalkenyl, E is chalcogen being doubly bonded to Pn, or any alkyl, substituted alkyl, cycloalkyl, alkenyl, arylalkenyl, aryl, substituted aryl, alkynyl and arylalkynyl, heteroaryl, substituted heteroaryl, heterocyclic or substituted heterocyclic, being singly bonded to Pn, and R is independently alkyl, alkynyl, alkylaryl, aryl or cycloalkyl.

23. The light-emitting device of claim 21, wherein the light-emitting layer or emissive layer is prepared using vacuum deposition or solution processing technique.

24. A light-emitting device with an ordered structure comprising an anode, a hole-transporting layer, a light-emitting layer, an electron-transporting layer and a cathode wherein the light-emitting layer comprises a gold(III) compound having a chemical structure:

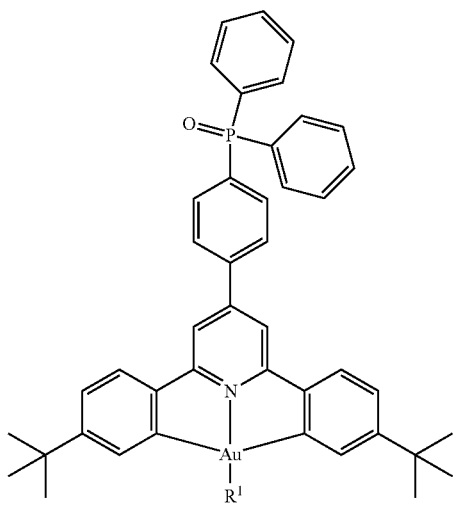

wherein $R^1$ is triphenylamine, 4-(tert-butyl)phenyl, or $R^1$ is any one of the following structures:

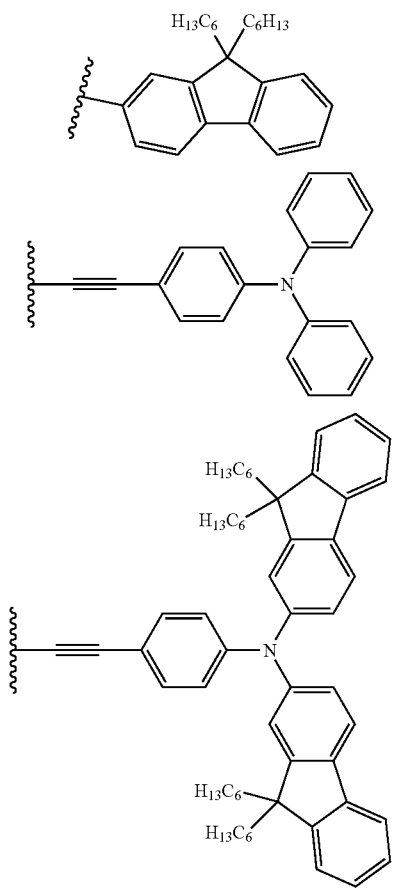

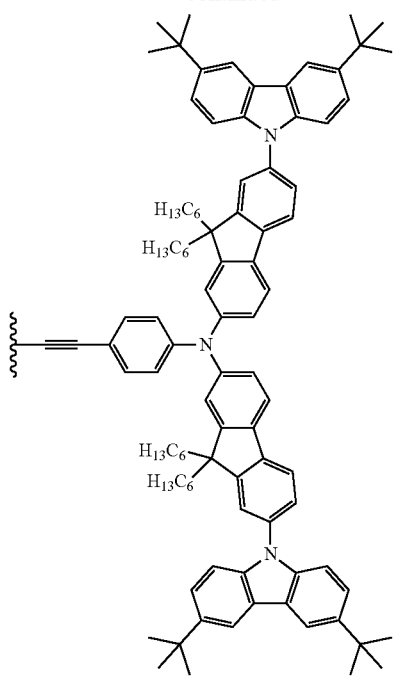

25. A light-emitting device with an ordered structure comprising an anode, a hole-transporting layer, a light-emitting layer, an electron-transporting layer and a cathode wherein the light-emitting layer comprises a gold(III) compound having a chemical structure represented by one of the following formula:

Compound 7

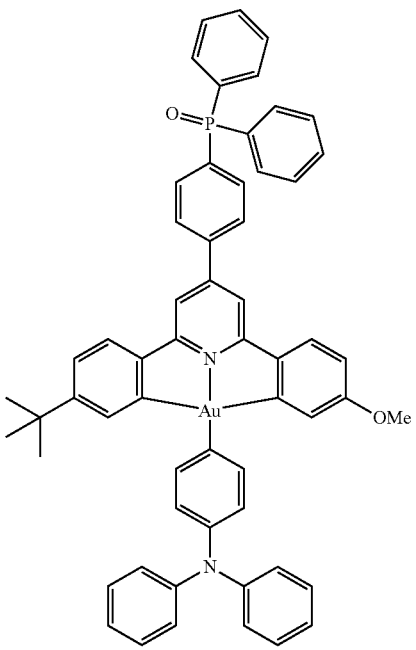

Compound 8
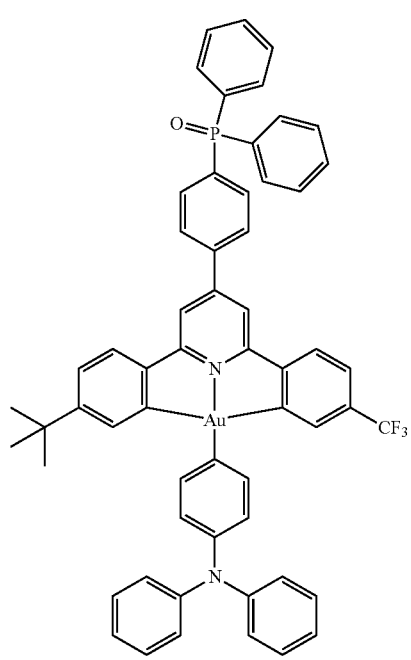
Compound 9
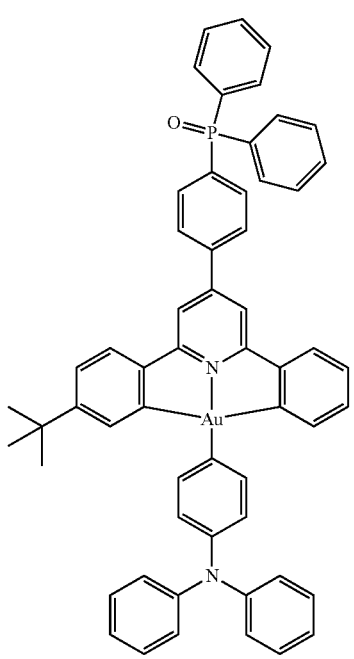
Compound 10
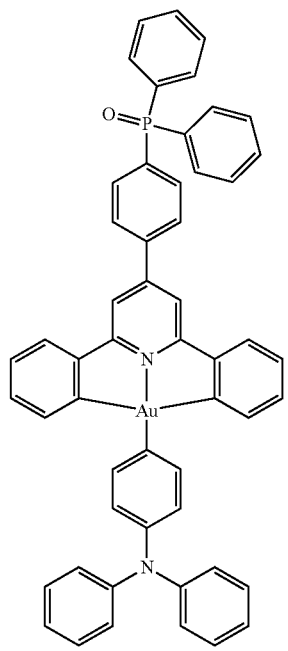
Compound 11
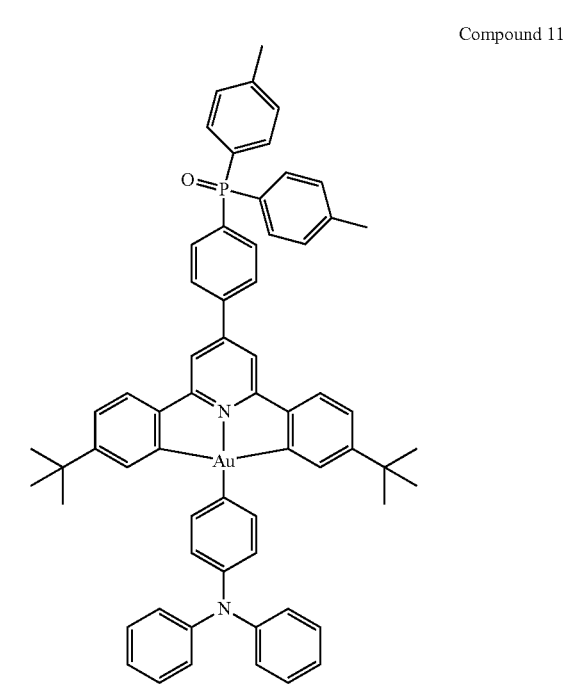

-continued
Compound 12
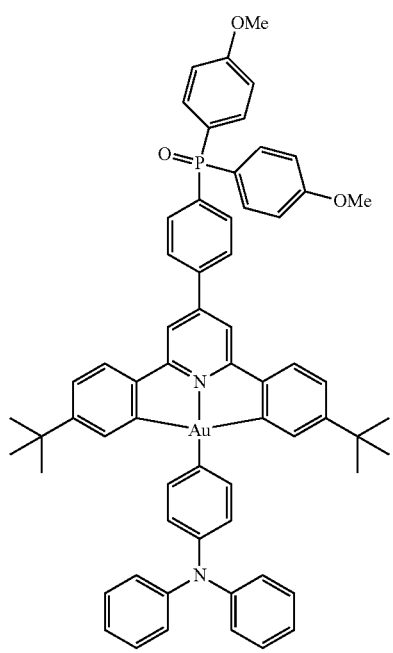
Compound 13
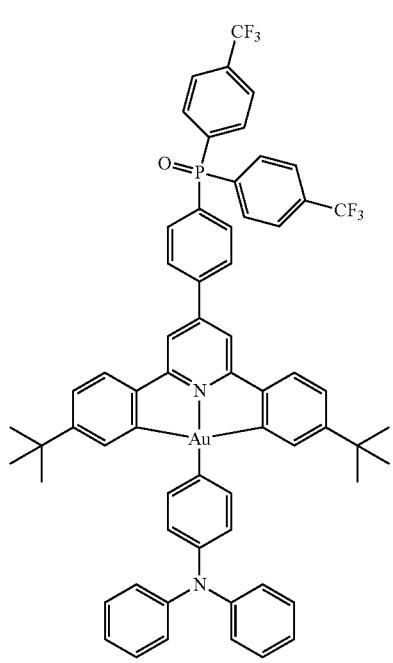
-continued
Compound 14
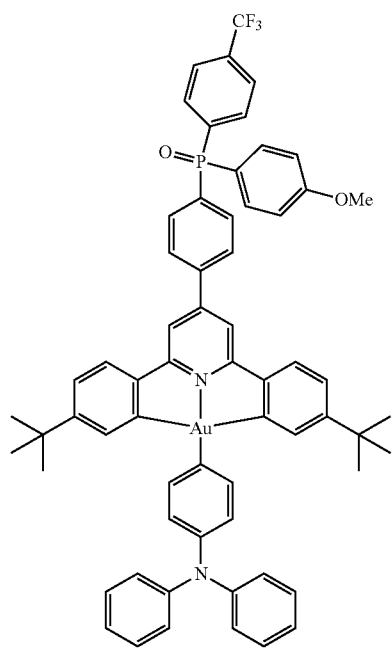
Compound 15
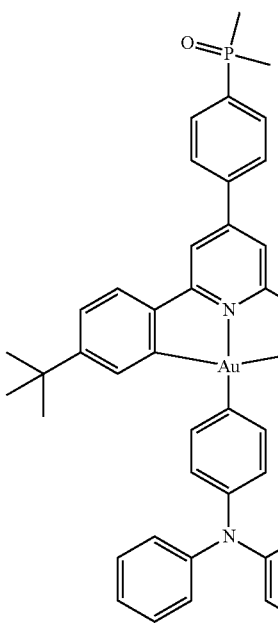

Compound 16
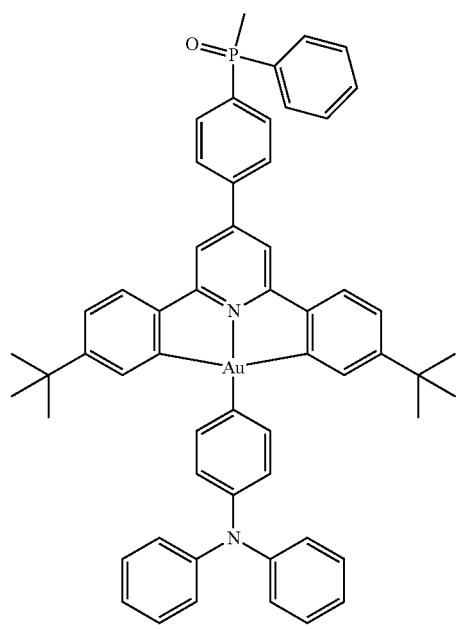
Compound 17
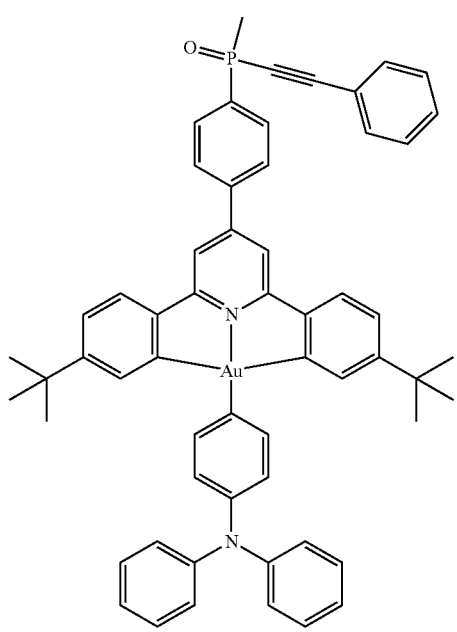
Compound 18
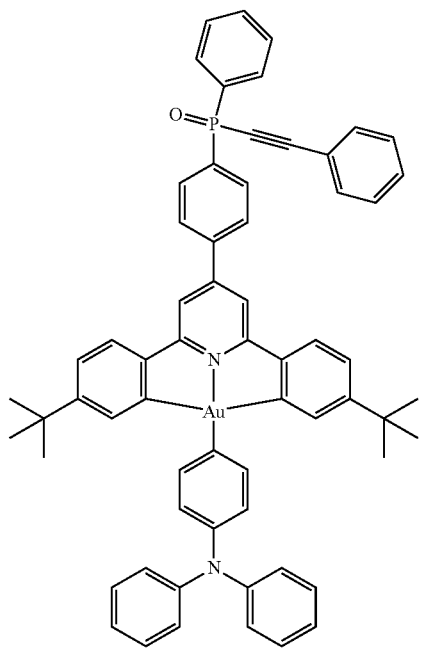
Compound 19
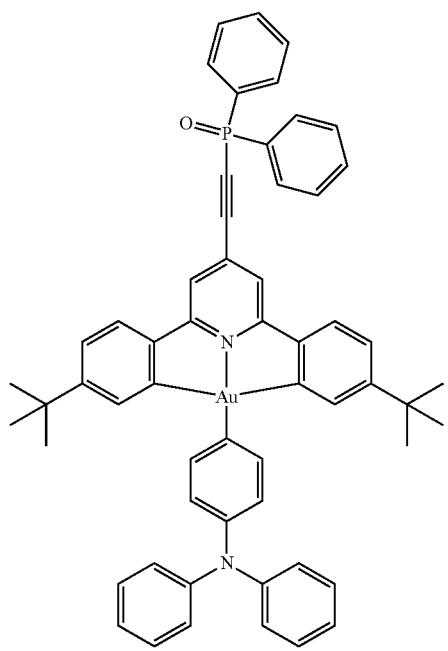

Compound 20
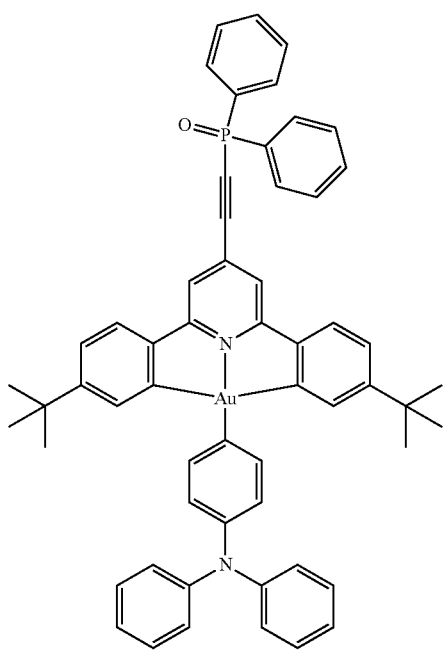
Compound 22
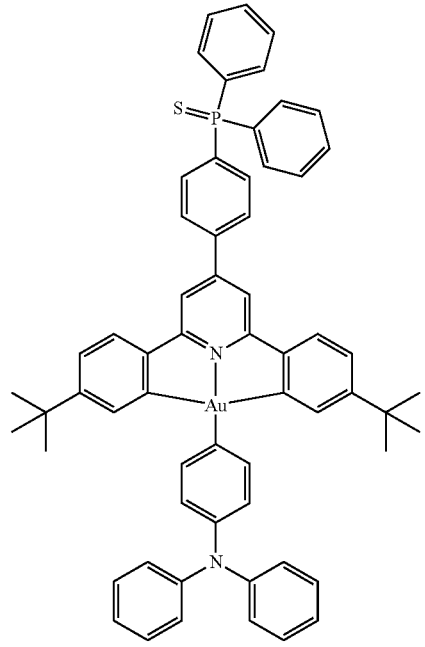
Compound 21
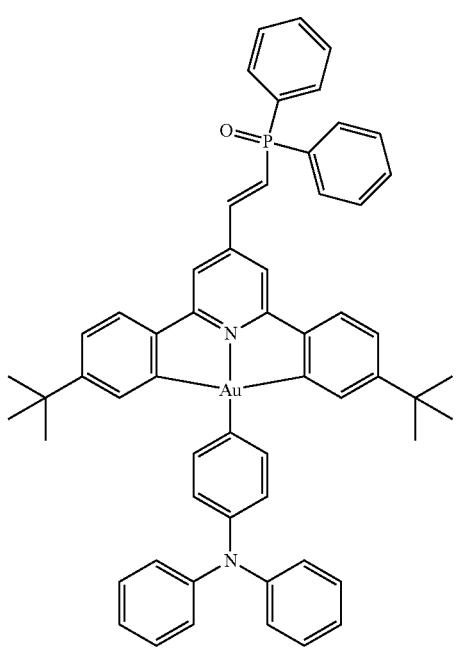
Compound 23
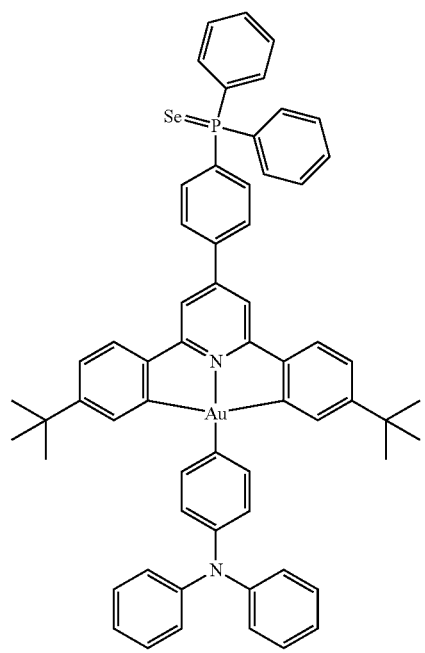

Compound 24
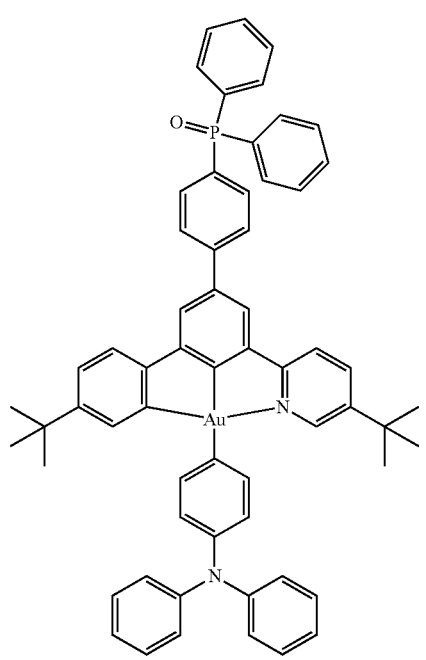
Compound 25
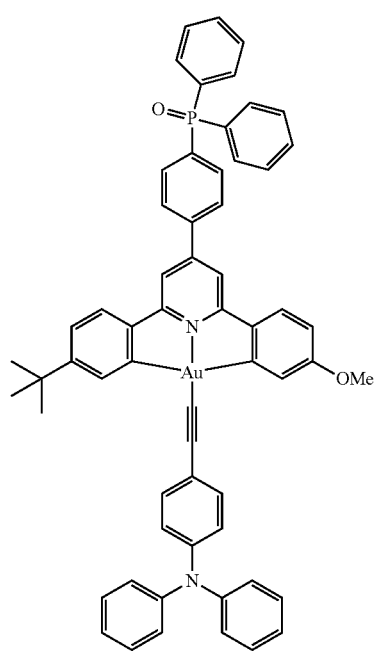
Compound 26
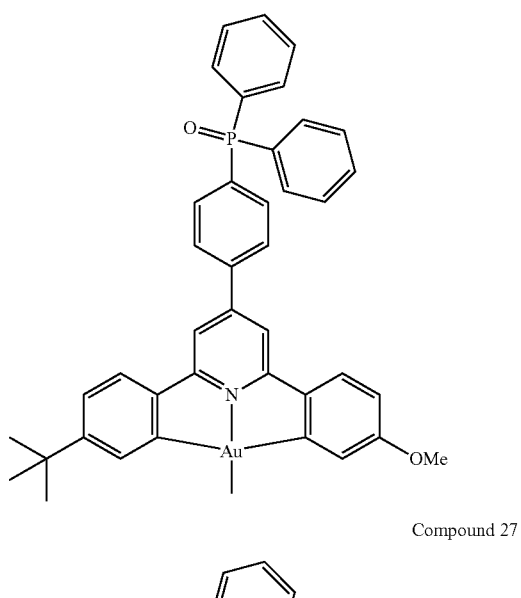
Compound 27
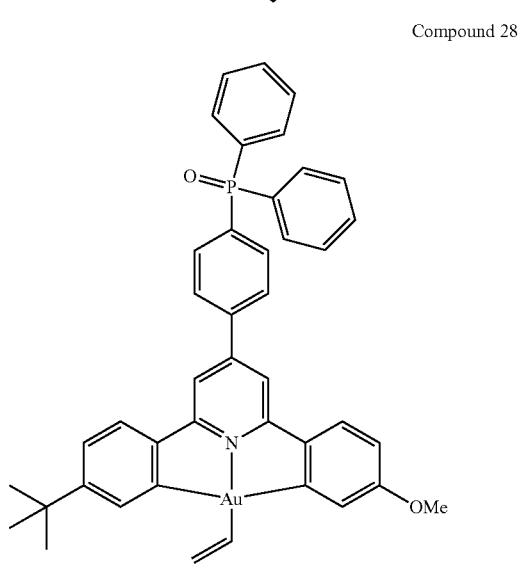
Compound 28

Compound 29
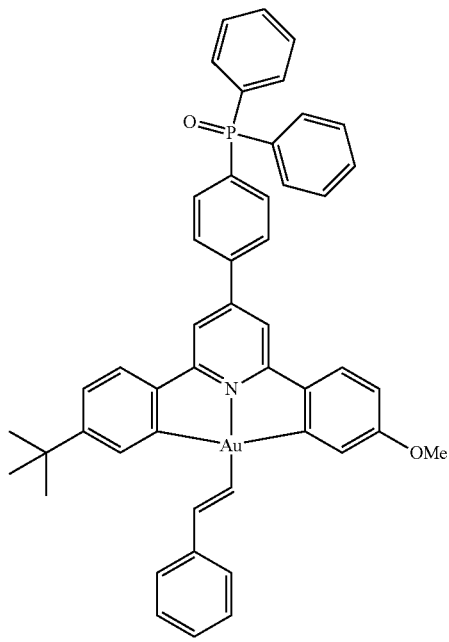
Compound 30
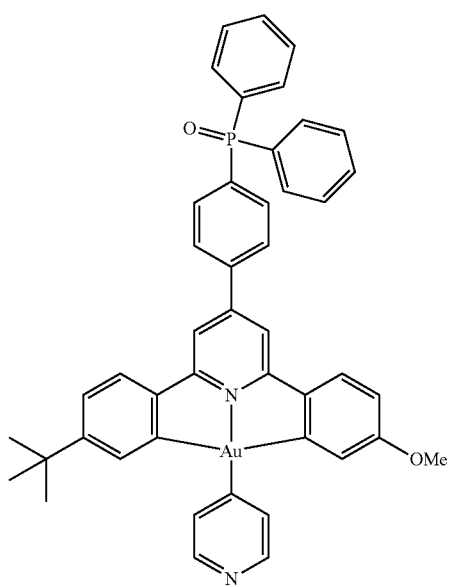
Compound 31
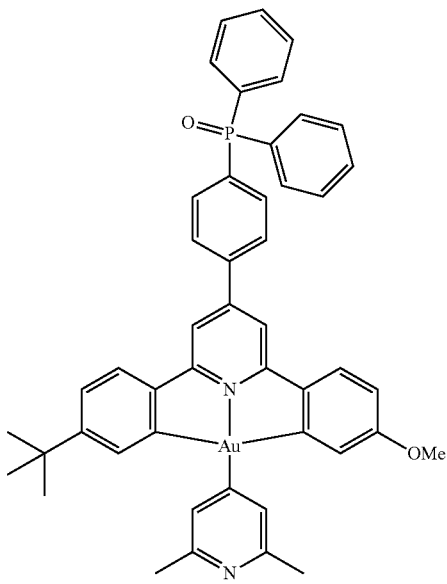
Compound 32
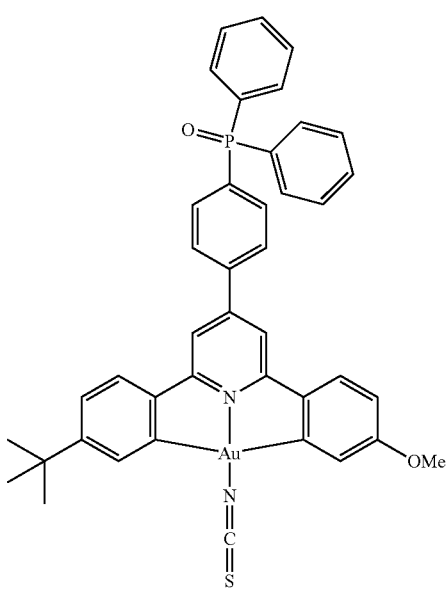

Compound 33
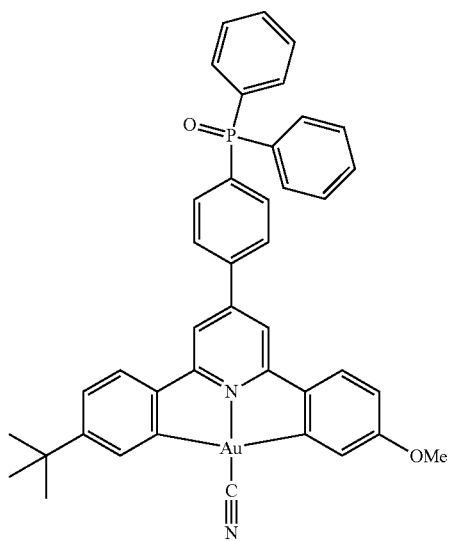
Compound 35
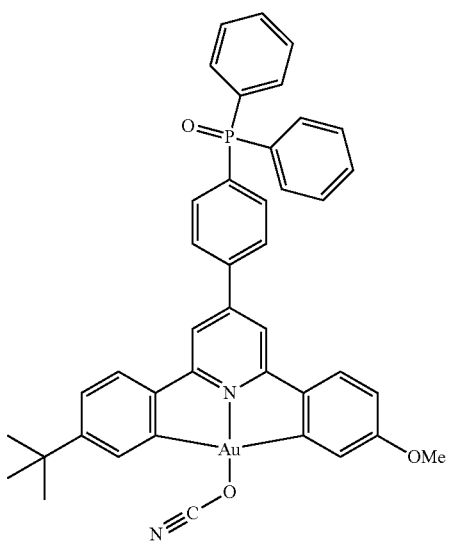
Compound 34
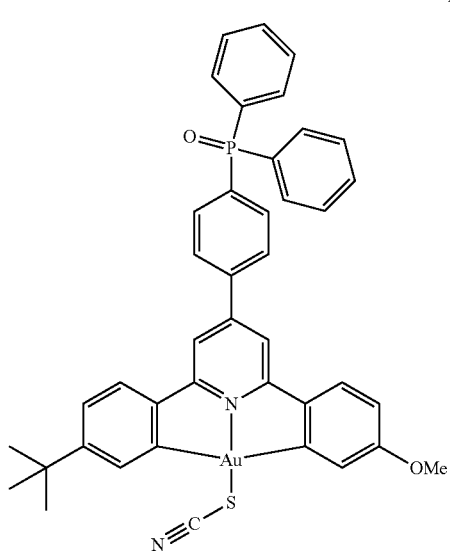
Compound 36
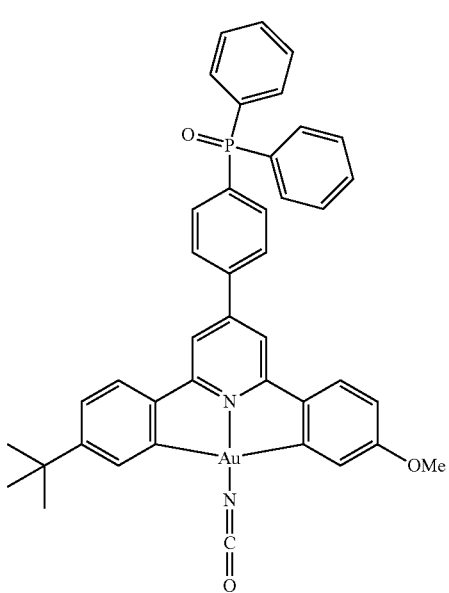

Compound 37
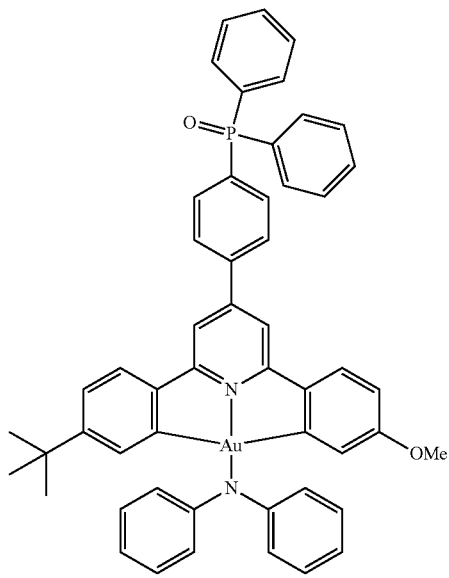
Compound 38
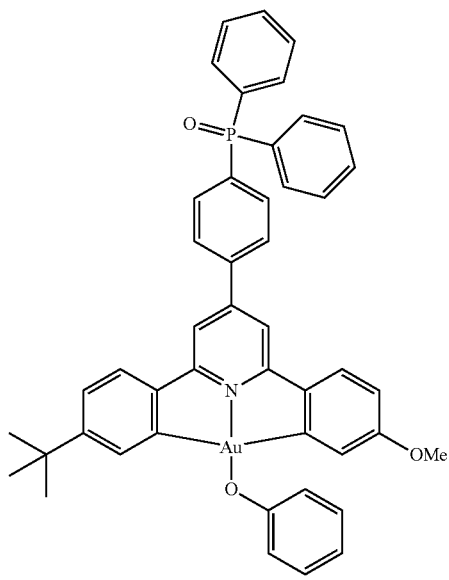
Compound 39
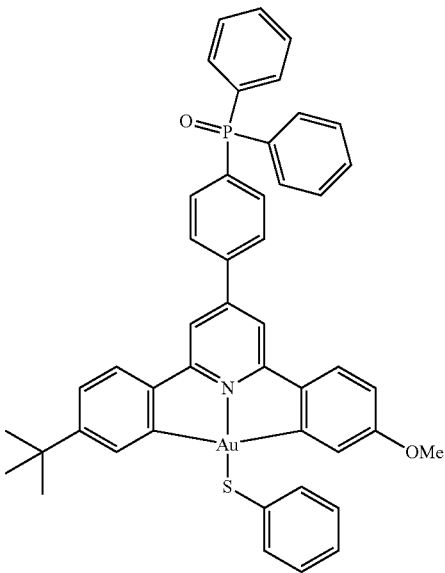
Compound 40
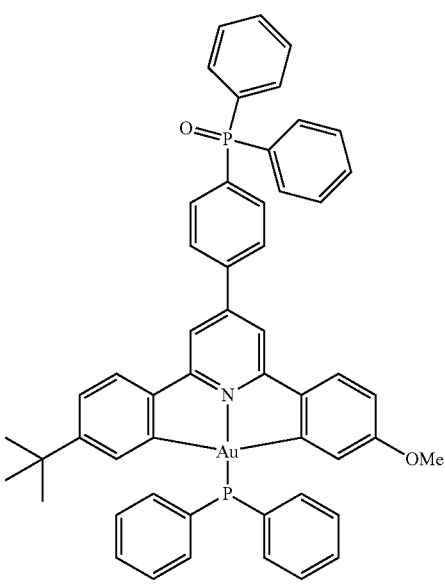

Compound 41
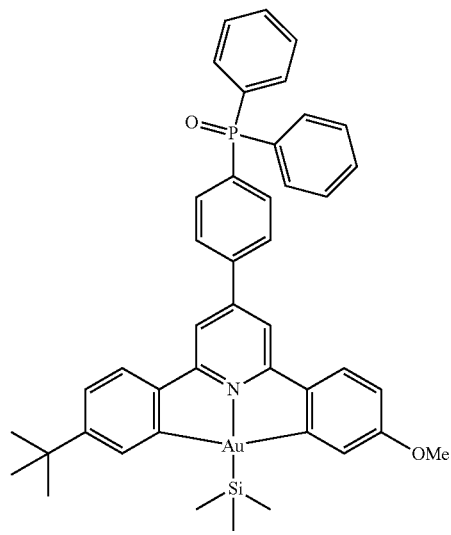
Compound 42
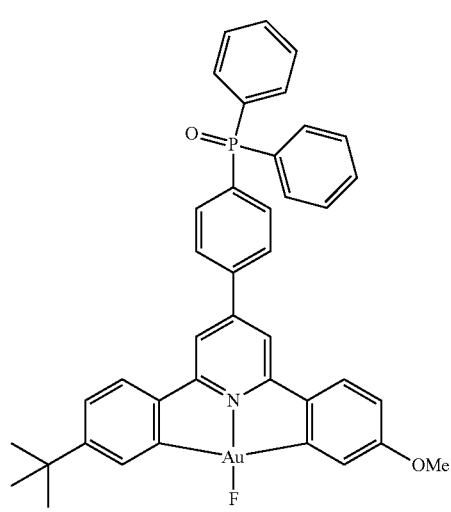
Compound 43
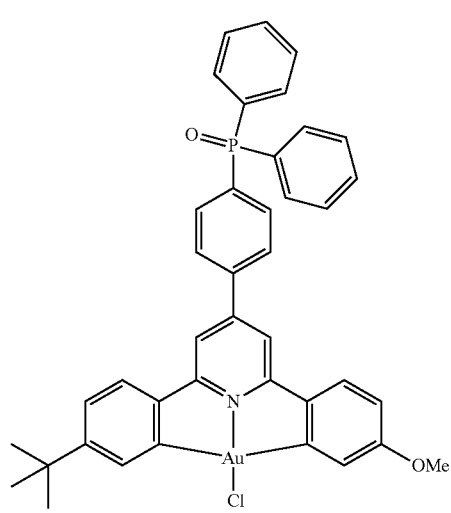
Compound 44
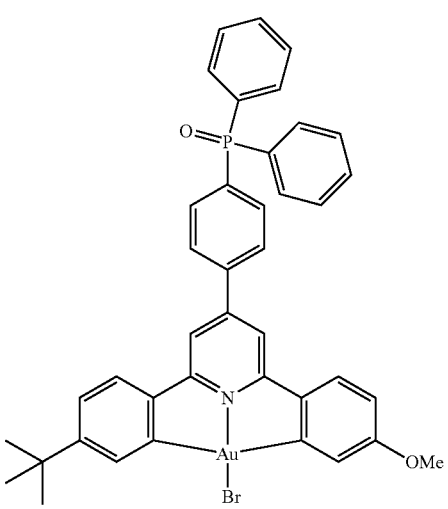
Compound 45
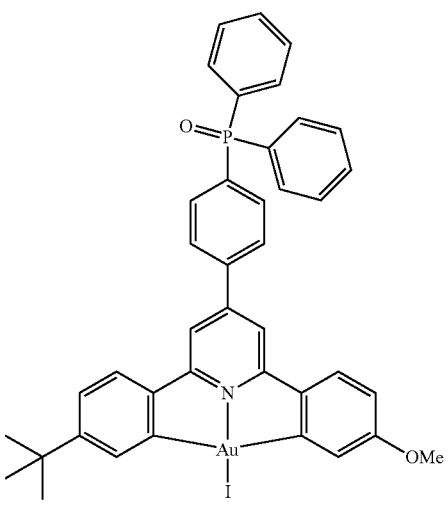
Compound 46

177
-continued
Compound 47
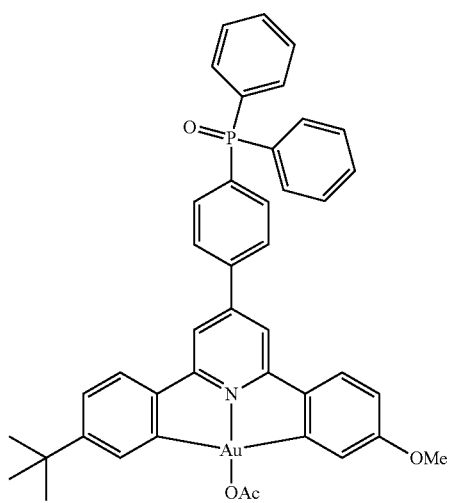
178
-continued
Compound 48
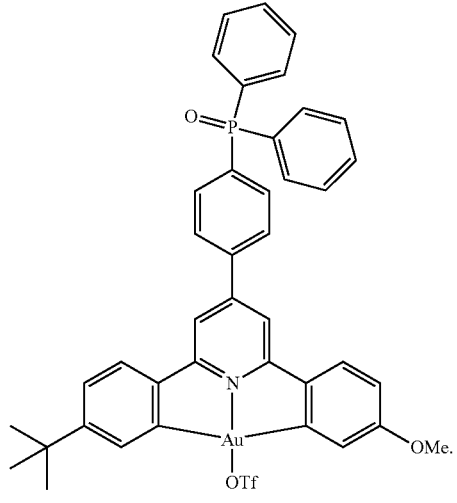
* * * * *